United States Patent
Krippendorf et al.

(10) Patent No.: US 10,847,338 B2
(45) Date of Patent: Nov. 24, 2020

(54) ENERGY FILTER ELEMENT FOR ION IMPLANTATION SYSTEMS FOR THE USE IN THE PRODUCTION OF WAFERS

(71) Applicant: mi2-factory GmbH, Jena (DE)

(72) Inventors: Florian Krippendorf, Jena (DE); Constantin Csato, Stammbach (DE)

(73) Assignee: MI2-FACTORY GMBH, Jena (DE)

( * ) Notice: Subject to any disclaimer, the term of this patent is extended or adjusted under 35 U.S.C. 154(b) by 0 days.

(21) Appl. No.: 16/090,521

(22) PCT Filed: Apr. 4, 2017

(86) PCT No.: PCT/EP2017/058018
§ 371 (c)(1),
(2) Date: Oct. 1, 2018

(87) PCT Pub. No.: WO2017/174597
PCT Pub. Date: Oct. 12, 2017

(65) Prior Publication Data
US 2019/0122850 A1    Apr. 25, 2019

(30) Foreign Application Priority Data

Apr. 4, 2016    (DE) .......... 10 2016 106 119

(51) Int. Cl.
*H01J 37/05* (2006.01)
*H01J 37/317* (2006.01)
*H01J 37/147* (2006.01)

(52) U.S. Cl.
CPC .......... *H01J 37/05* (2013.01); *H01J 37/1472* (2013.01); *H01J 37/3171* (2013.01); *H01J 2237/002* (2013.01); *H01J 2237/047* (2013.01); *H01J 2237/057* (2013.01); *H01J 2237/3171* (2013.01); *H01J 2237/31705* (2013.01)

(58) Field of Classification Search
USPC ..................................................... 250/492.21
See application file for complete search history.

(56) References Cited

U.S. PATENT DOCUMENTS

| 5,972,728 A | 10/1999 | Chen | |
| 2013/0001149 A1* | 1/2013 | Yamamoto | B01D 39/06 210/323.1 |
| 2017/0352519 A1* | 12/2017 | Rupp | H01J 37/3171 |

FOREIGN PATENT DOCUMENTS

| DE | 102005061663 A1 | 7/2007 | |
| DE | 102011075350 A1 | 11/2012 | |
| DE | 102016106119 A1 * | 10/2017 | H01J 37/05 |
| EP | 0014516 A1 | 10/1980 | |
| WO | 2005078758 A1 | 8/2005 | |

OTHER PUBLICATIONS

M. Nastasi et al., Ion-Solid Interactions. Fundamentals and Applications, Cambridge University Press, 1996, pp. 88-114.
(Continued)

*Primary Examiner* — Kiet T Nguyen
(74) *Attorney, Agent, or Firm* — Lucas & Mercanti, LLP

(57) ABSTRACT

An implantation device, an implantation system and a method. The implantation device comprises a filter frame and a filter held by the filter frame, wherein said filter is designed to be irradiated by an ion beam.

16 Claims, 36 Drawing Sheets

(56) References Cited

OTHER PUBLICATIONS

S. Halas, 100 years of work, in Materials Science—Poland, vol. 24, No. 4, 2006, pp. 951-968.

Krippendorf F. et al.: "Dotierung von SiC mittels Energiefilter für Ioninmplantation/Doping of SiC by means of Energy Filter for Ion Implantation" In: VDI-Gesellschaft Mikroelektronik, Mikrosystemtechnik und Feinwerktechnik (Hrsg.): "Mikrosystemtechnik Kongress 2015 11 MEMS, Mikroelektronik, Systeme" Oct. 26-28, 2015 Karlsruhe, Oct. 26, 2015 (Oct. 26, 2015)Berlin—Offenbach, XP009194563, ISBN: 978-3-8007-4100-7 pp. 334-337.

Krippendorf Fetal: "Energiefilter fuer Ionenimplantation / Energy filter for ion implantation", Von Bauelementen Zu Systemen : Mikrosystemtechnik Kongress 2013, Oct. 14-16, 2013 In Aachen : Proceedings, VDE-VERL, Berlin [U.A.], Oct. 14, 2013 (Oct. 14, 2013), pp. 662-665.

Csato Constantin et al: "Energy filter for tailoring depth profiles in semiconductor doping application", Nuclear Instruments & Methods in Physics Research. Section B: Beam Interactions With Materials and Atoms, vol. 365, Jul. 31, 2015 (Jul. 31, 2015), pp. 182-186.

Rub M et al: "550 V superjunction 3.9/spl Omega/mm<2> transistor formed by 25 MeV masked boron implantation:" Power Semiconductor Devices and ICS, 2004. Proceedings. ISPSD '04. The 16th International Symposium on Kitakyushu Int. Conf. CTR, Japan May 24-27, 2004, Piscataway, NJ, USA,IEEE, May 24, 2004 (May 24, 2004), pp. 455-458.

Krippendorf, Csato, Rüb: Investigation of dopant profiles, losses and heating using an energy filter for ion implantation, DPG Frühjahrstagung Dresden, Mar. 2014.

Csato, T. Bischof, S. Gupta, W. Han, F. Krippendorf, W.Morgenroth, M. Nobst, C. Ronning, R. Rupp, A. Schewior, W. Wesch, M. Rüb, Jun. 12, 2013, Workshop „Ionenstrahlen—Forschung und Anwendung 2013, Leibniz—Institut für Oberflächenmodifizierung Leipzig and M.Rüb, B.Sc. T. Bischof, M.Sc. C. Csato, B.Sc. S. Gupta, B.Sc. W. Han, M.Sc. F. Krippendorf, B.Sc. A. Schewior, B.Sc. C. Möse, Energiefilter für Ionenimplantationsanlagen, Forschungsbericht der Ernst-Abbe-Fachhochschule Jun. 2011/2012.

J.Meijer, B. Burchard, High-energy ion protection for deep ion implantation as a low cost high throughput alternative for subsequent epitaxy processes, J.Vac. Sci. Technol. B22(1), Jan./Feb. 2004.

U.Weber, G. Kraft, Design and construction fo a ripple filter for smoothed depth does distribution in conformal particle therapy, Phys. Med. Biol. 44(1999) 2765-2775.

Y.Takada et al., A miniature ripple filter for filtering a ripple found in disatal part of a proton SOBP, Nuclear Instruments and Methods in Physics Research A 524(2004) 366-373.

O. Osman, Irradiation effects of swift heavy ions in matter, Dissertation, Essen, 2011.

Machine-generated English translation of DE 102005061663; May 7, 2007.

Machine-generated English translation of DE 102011075350; Aug. 11, 2012.

Machine-generated English translation of DE 102016106119; May 10, 2017.

\* cited by examiner

FIG 1
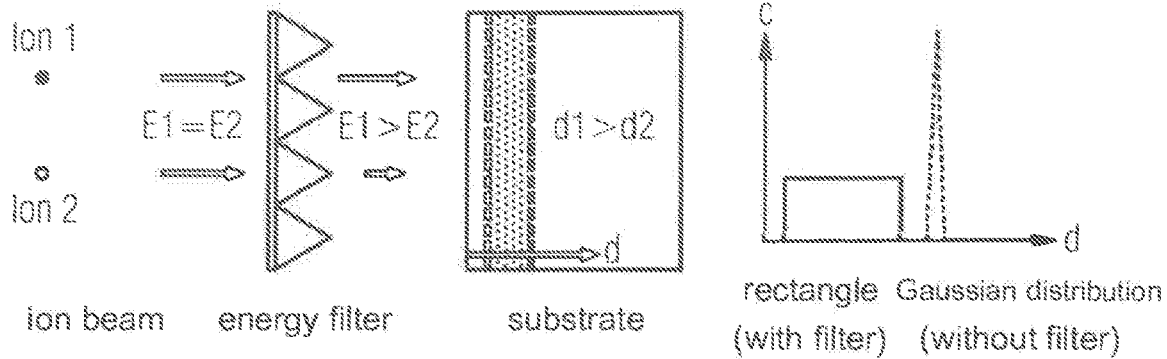
FIG 2
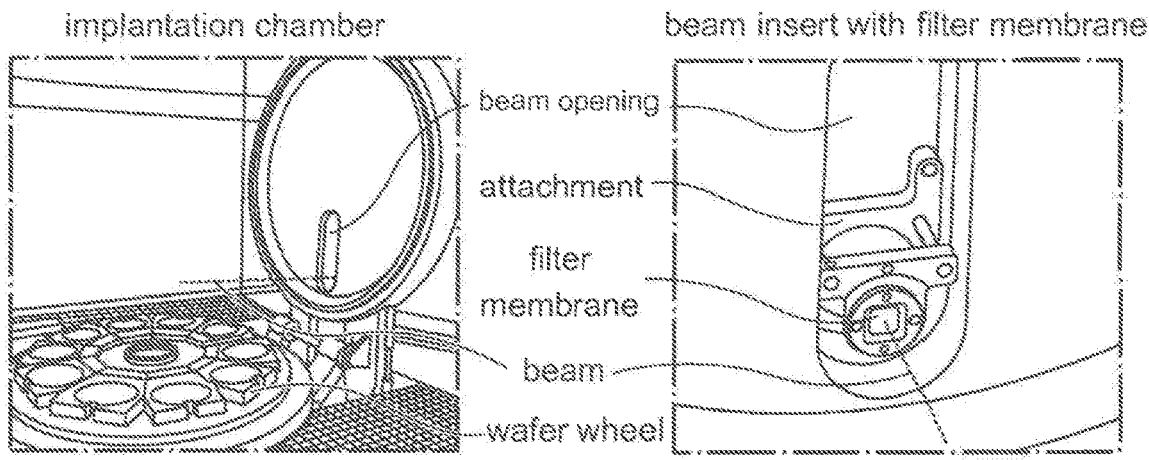
FIG 3
(a) 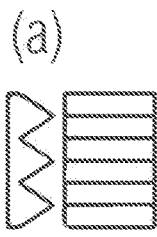 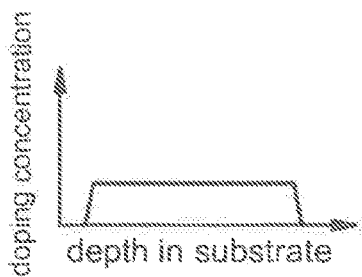   (c) 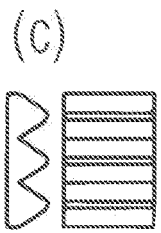 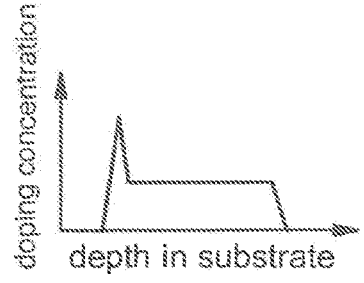
(b) 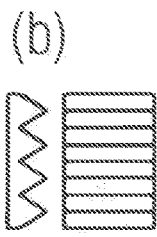 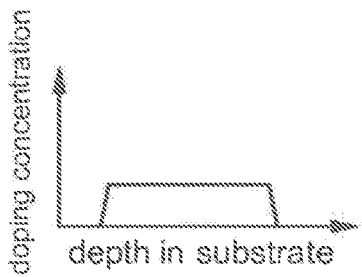   (d) 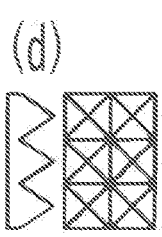 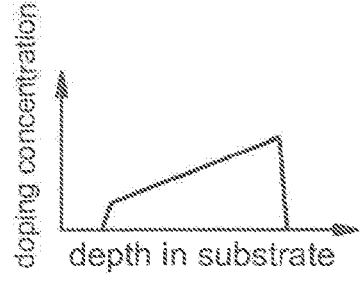

attachment of the filter by means of a bar attachment of the filter by suspension elements attachment of the filter by magnets multifilter concept Multifilter concept – profile examples Multifilter concept – beveled filter elements FIG 16
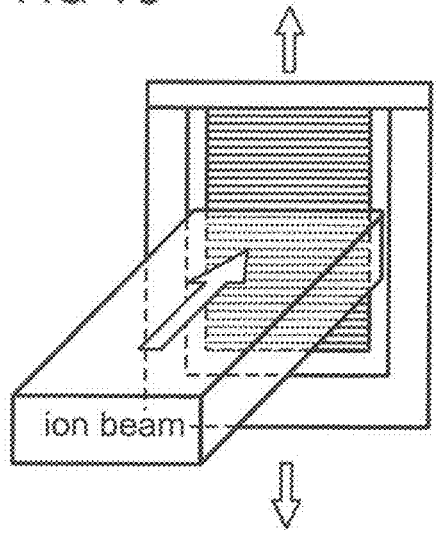
oscillation of the filter
Only a partial area is irradiated to avoid overheating.
FIG 17
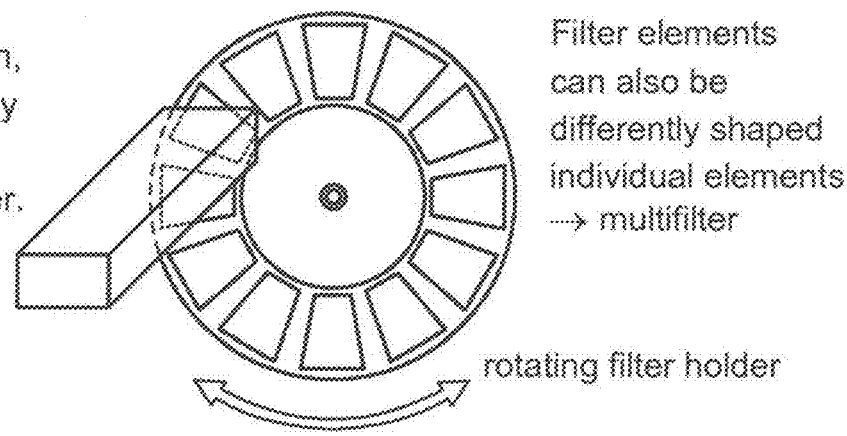
Stationary ion beam, which irradiates only a part of the complete (multi)filter.
Filter elements can also be differently shaped individual elements → multifilter
rotating filter holder
FIG 18
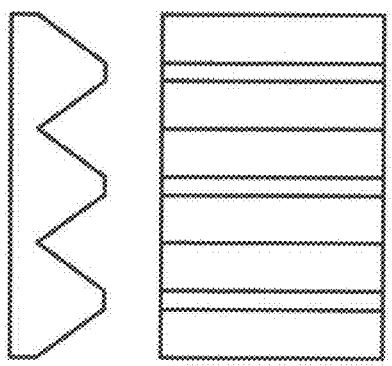
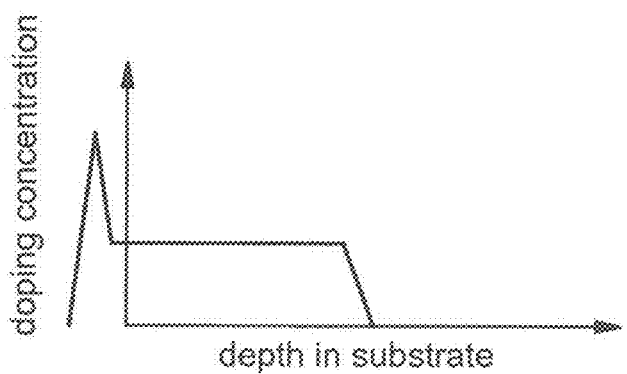

Collimator for energy filters

Cross sections of "on-filter" collimator structures

If designed advantageously, a collimator formed directly on the filter element provides mechanical stabilization and also amplifies the effect of radiative cooling by increasing the surface area.

FIG 23

Cross section through an "on-filter" collimator structure

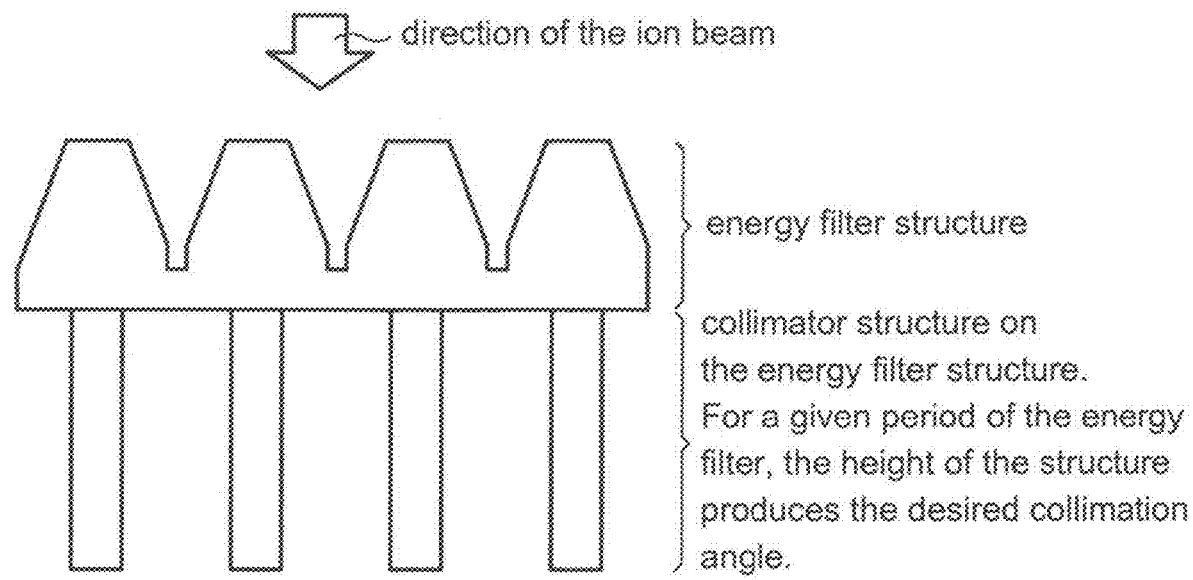

direction of the ion beam

} energy filter structure

} collimator structure on the energy filter structure. For a given period of the energy filter, the height of the structure produces the desired collimation angle.

FIG 24

1. Arrangement of the collimator structure transversely to the filter lamellae

2. Arrangement of the collimator structure parallel to the filter lamellae

3. Arrangement of the collimator structure parallel and transversely to the filter lamellae

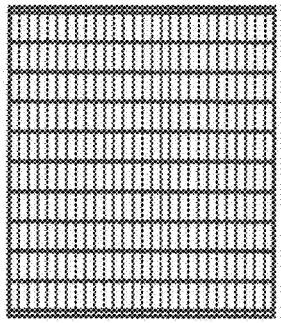 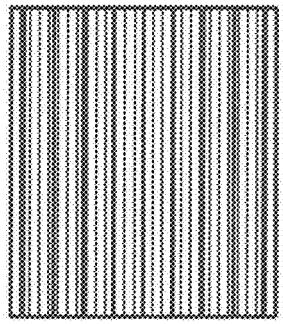 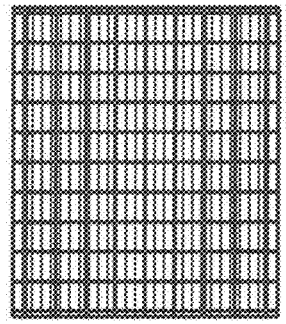

If designed advantageously (as in 3.), a collimator formed directly on the filter element provides mechanical stabilization and also amplifies the effect of radiative cooling by increasing the surface area Measured WF values compared with values calculated by the metallic plasma model

FIG 40

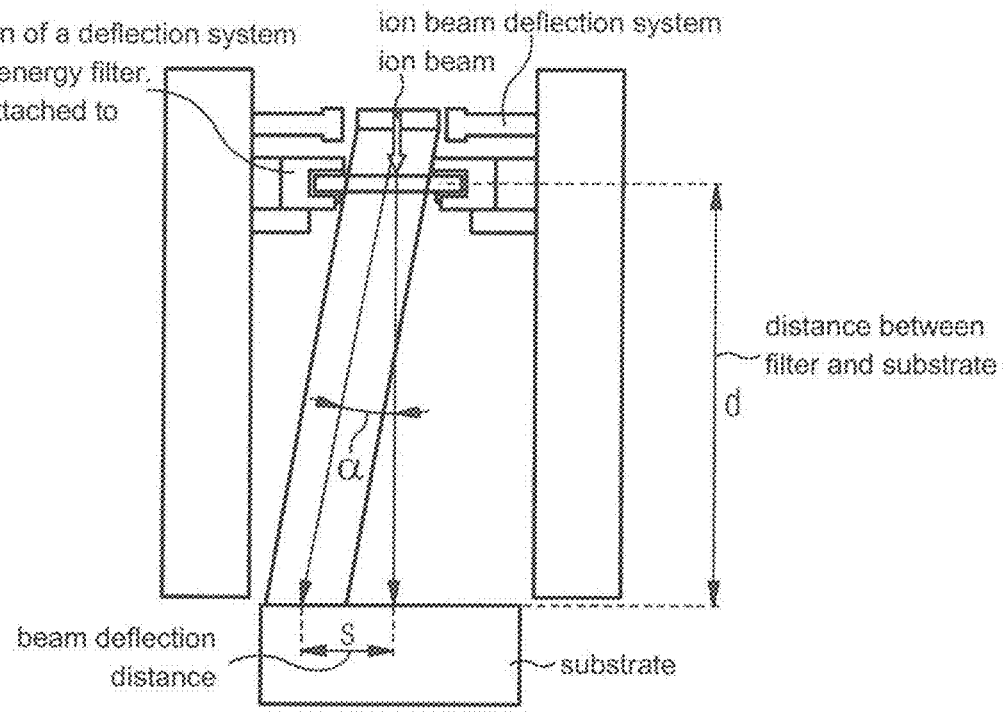

implementation of a deflection system in front of the energy filter, filter holder, attached to chamber wall ion beam deflection system
ion beam distance between filter and substrate d beam deflection distance
s
substrate

FIG 41

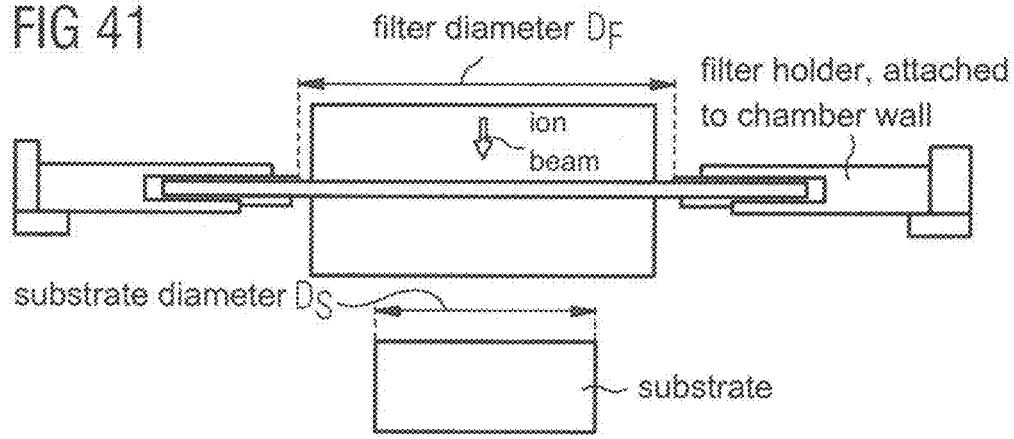

filter diameter $D_F$
filter holder, attached to chamber wall
ion beam
substrate diameter $D_S$
substrate

FIG 42

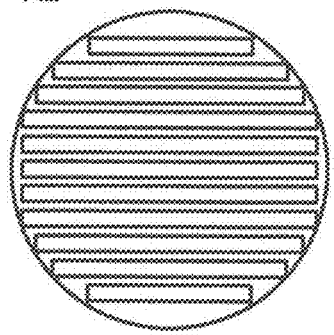 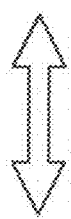

mechanical scan direction of the filter over the substrate or of the substrate relative to the filter FIG 45
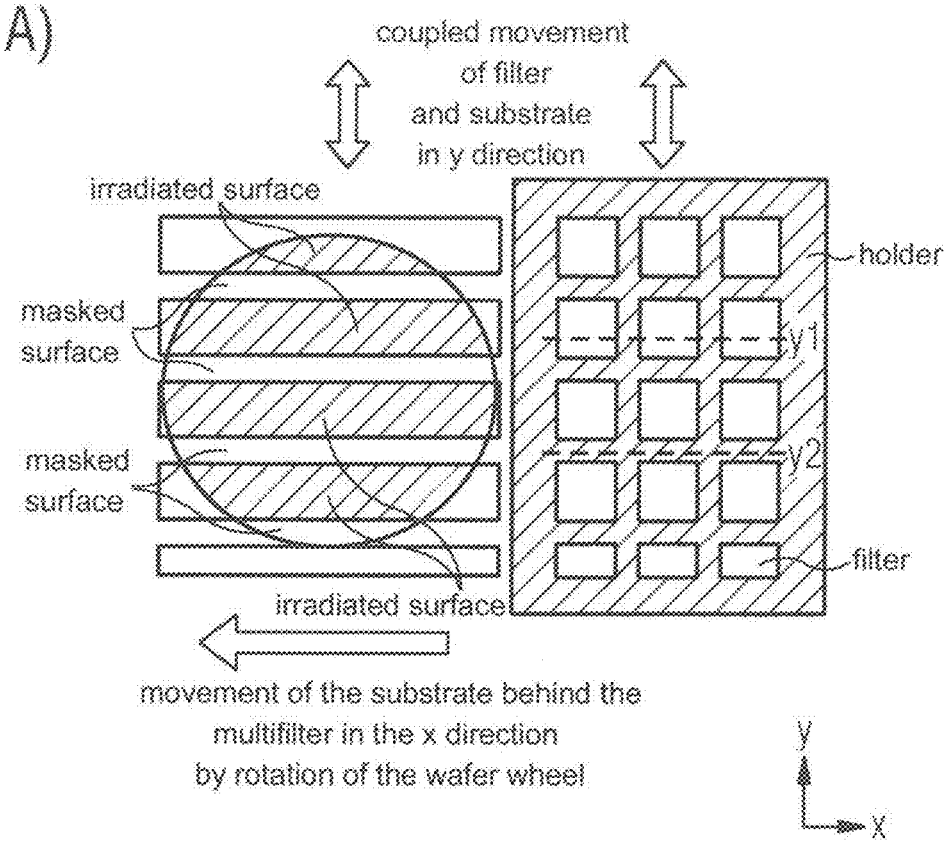
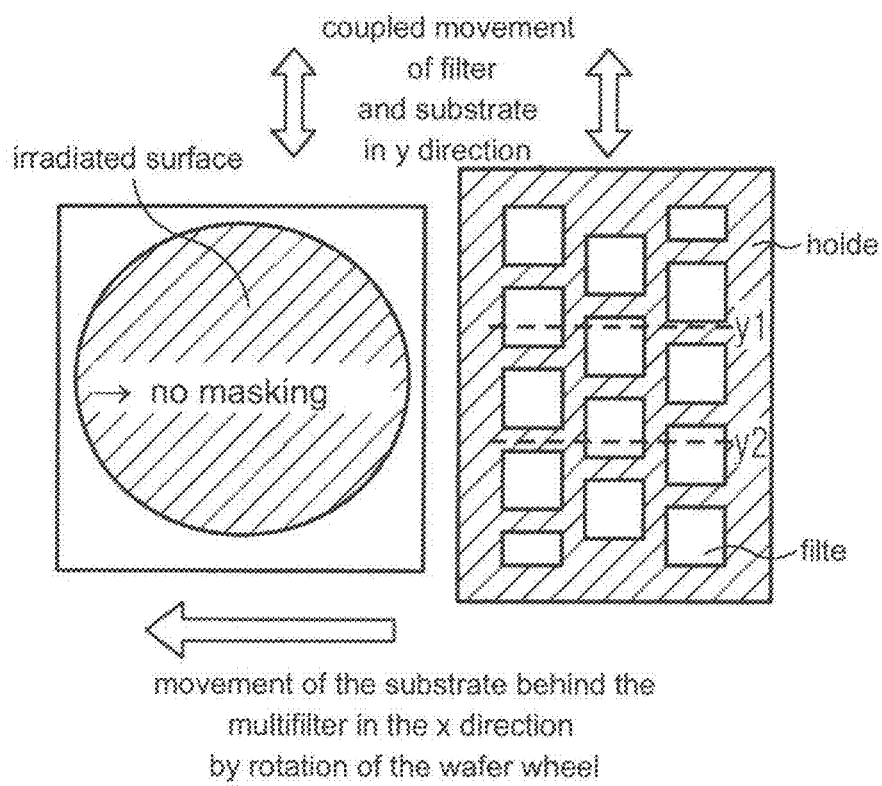

FIG 46

Monitoring of the implantation process
by monitoring structures

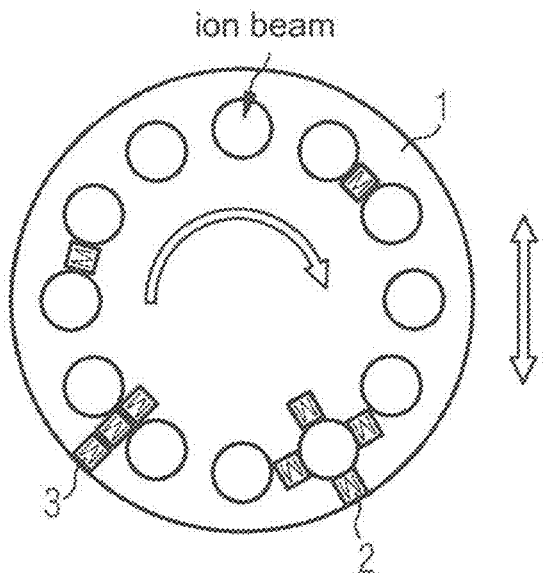

Figure M1. Wafer wheel with an arrangement of
wafers to be irradiated, and monitoring structures
between the wafers As an alternative to separate monitoring structures and materials,
the change caused by the radiation in the optical properties of the wafers
themselves – if their base material is suitable for the purpose – can
be evaluated for the purpose of dose monitoring.

The arrangement of the monitoring structures on the wafer wheel
depends on the desired monitoring parameter.

1. Arrangement between the wafers to be irradiated:
   monitoring the radial dose.
2. Arrangement above and/or below and/or to the left/to the right of the wafer:
   monitoring the radial and vertical doses.
3. Arranged in a row next to one or more wafers to monitor
   vertical homogeneity.
4. Combination of 1-3 or additional arrangements capable of monitoring
   the lateral or vertical distribution of the implanted ion dose Figure M2. Monitoring mask showing an example of how various mask structures Ma1-Ma10 which are transparent or partially transparent to ion beams can be arranged Figure M3. Cross section through the arrangement of a monitoring mask and a suitable monitoring material

FIG 49

Monitoring of the implantation process by monitoring structures

Measurement: depth-dependent dose distribution

The measurement task is to monitor the depth profile produced by a special energy filter shown below by way of example

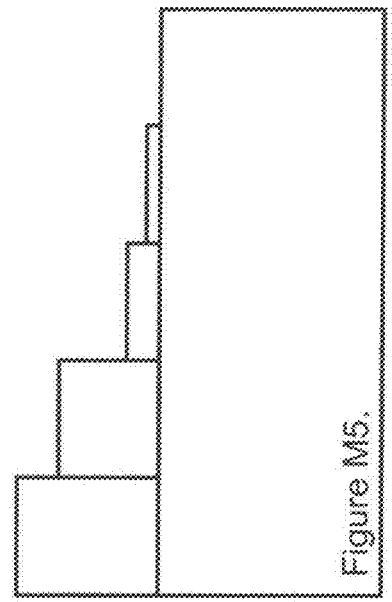

Figure M4.

M4. Example of a concentration depth profile produced by an energy filter

FIG 50

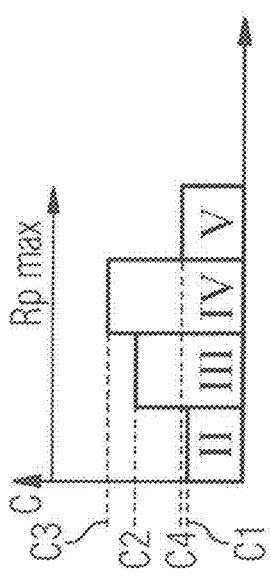

Figure M5.

M5. Example: Mask structure for the monitoring of the depth-dependent dose distribution

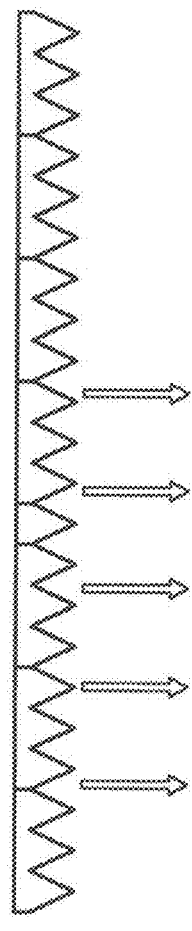

Figure M7.

FIG 54
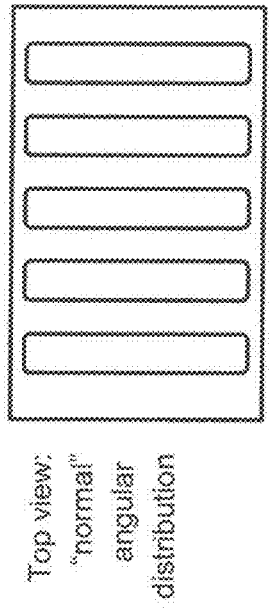
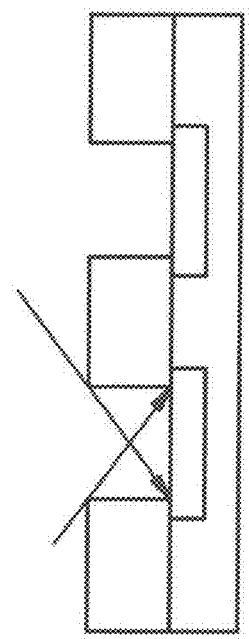
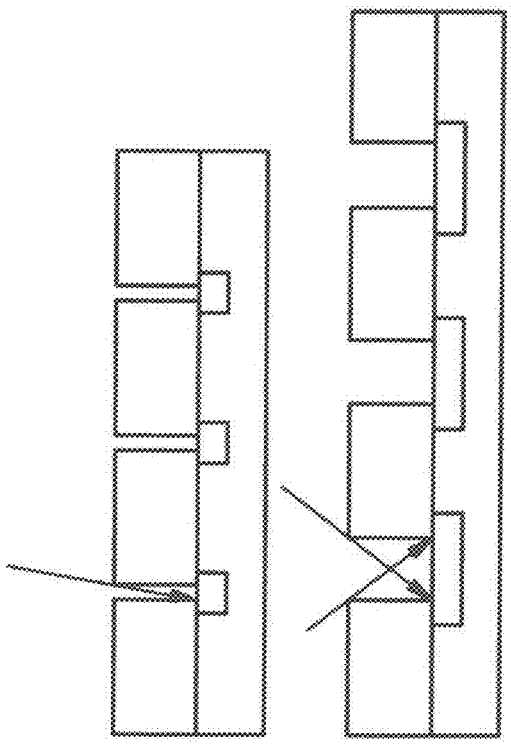
Figure M9. Mask structure
Figure M10. Structure array after implantation

FIG 57

Monitoring of the implantation process by means of monitoring structures

Angular distribution of the implanted ions

1. Fixed mask thickness, mask openings of various geometries → variation of the aspect ratio
2. Variable mask thickness, fixed geometry of the mask opening → variation of the aspect ratio.
3. Mixtures of 1 and 2, e.g. for measuring asymmetric angular regions

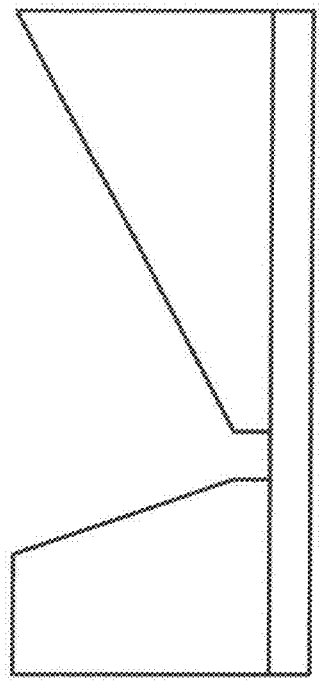

Minimum mask thickness > Rp, max

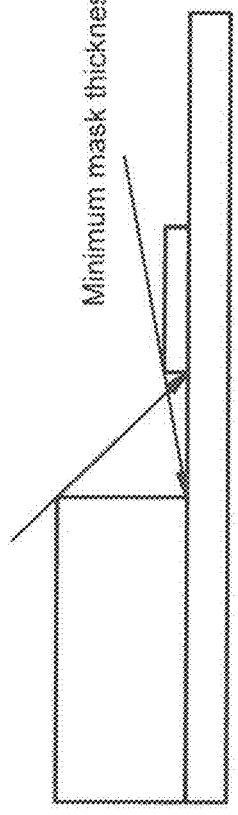

Figure M11. Mask structure, for monitoring asymmetric angular distributions

Figure M12. Various arrangements of mask structure arrays for detecting ion angular distributions in various directions

ENERGY FILTER ELEMENT FOR ION IMPLANTATION SYSTEMS FOR THE USE IN THE PRODUCTION OF WAFERS

CROSS-REFERENCE TO RELATED APPLICATIONS

The present application is a 371 of International application PCT/EP2017/058018, filed Apr. 4, 2017, which claims priority of DE 10 2016 106 119.0, filed Apr. 4, 2016, the priority of these applications is hereby claimed and these applications are incorporated herein by reference.

FIELD OF THE INVENTION

The invention relates to an implantation arrangement comprising an energy filter (implantation filter) for ion implantation and its use and to an implantation method.

BACKGROUND OF THE INVENTION

By means of ion implantation, it is possible to achieve the doping or production of defect profiles, in any desired material such as semiconductor material (silicon, silicon carbide, gallium nitride) or optical material ($LiNbO_3$) with predefined depth profiles in the depth range of a few nanometers to several 100 micrometers. It is desirable in particular to produce depth profiles which are characterized by a wider depth distribution than that of a doping concentration peak or defect concentration peak obtainable by monoenergetic ion irradiation, or to produce doping or defect depth profiles which cannot be produced by one or a few simple monoenergetic implantations.

SUMMARY OF THE INVENTION

An implantation device according to an embodiment of the present invention includes a filter frame and a filter held by the filter frame, the filter being configured to be irradiated by an ion beam passing through the filter. The filter has a layered structure with at least two different material layers, which are arranged on top of each other in an irradiation direction.

An implantation system according to another embodiment of the present invention includes a wall with an opening, a filter holder, which is arranged on the wall in an area of the opening and has a receiving portion configured to receive a filter frame, wherein a filter is held by the filter frame, the filter being configured to be irradiated by an ion beam passing through the filter, and wherein the filter comprises a layered structure with at least two different material layers, which are arranged on top of each other in an irradiation direction.

A method according to yet another embodiment of the present invention includes implanting ions into a wafer by irradiating the wafer with an ion beam using an implantation device, the implantation device including a filter frame and a filter held by the filter frame, wherein the filter is irradiated by the ion beam passing through the filter, and the filter including a layered structure with at least two different material layers, which are arranged on top of each other in an irradiation direction.

BRIEF DESCRIPTION OF THE DRAWINGS

FIG. 1 illustrates the basic principle of an energy filter: The energy of a monoenergetic ion beam is modified upon passage through a microstructured energy filter component as a function of the point of entry. The resulting energy distribution of the ions leads to a modification of the depth profile of the implanted substance in a substrate matrix.

FIG. 2 shows, on the left, a wafer wheel, on which substrates to be implanted are fixed in position. During processing/implantation, the wheel is tilted by 90° and set in rotation. The ion beam, indicated in green, therefore "writes" concentric circles on the wheel. To irradiate the surface of the entire wafer, the wheel is moved vertically during processing. On the right, FIG. 2 shows a mounted energy filter in the area of the beam opening.

FIG. 3 shows a schematic diagram of various doping profiles (dopant concentration as a function of depth in the substrate) for energy filter microstructures of different configurations (a side view and a top view shown in each case):

(a) triangular prism-shaped structures produce a rectangular doping profile;

(b) smaller triangular prism-shaped structures produce a doping profile with a shallower depth distribution;

(c) trapezoidal prism-shaped structures produce a rectangular doping profile with a peak at the start of the profile;

(d) pyramid-shaped structures produce a triangular doping profile, increasing in height with increasing depth in the substrate.

Figure 4:
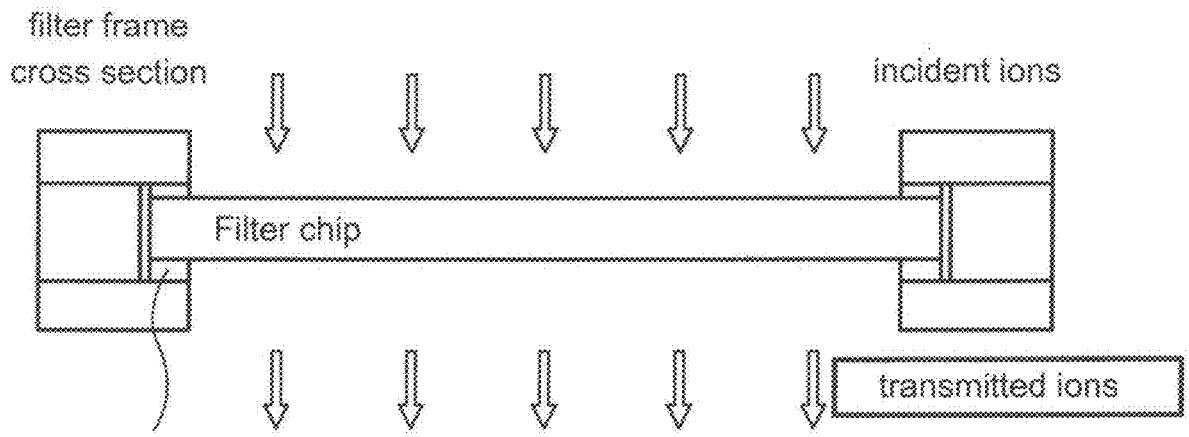

FIG. 4 shows a cross section through a filter frame for holding an energy filter chip.

Figure 5:
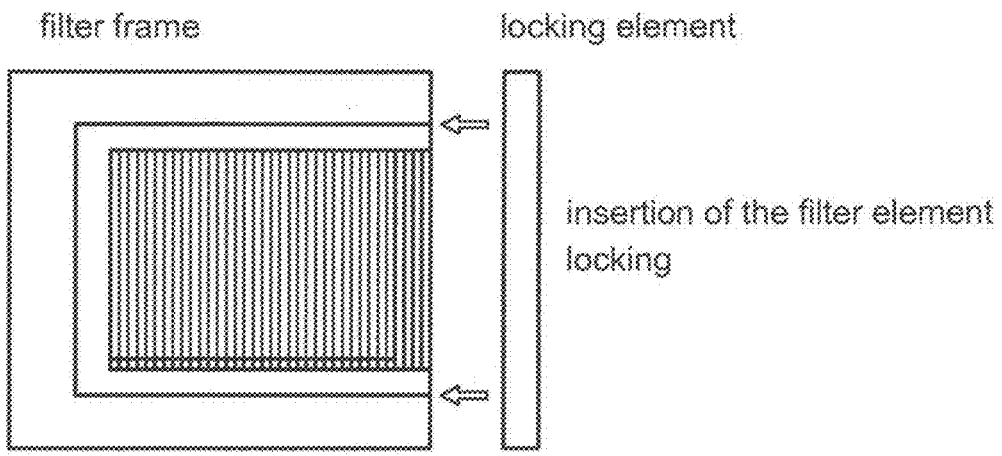

FIG. 5 shows a top view of a filter frame for holding an energy filter element with a locking element and a mounted energy filter.

Figure 6:
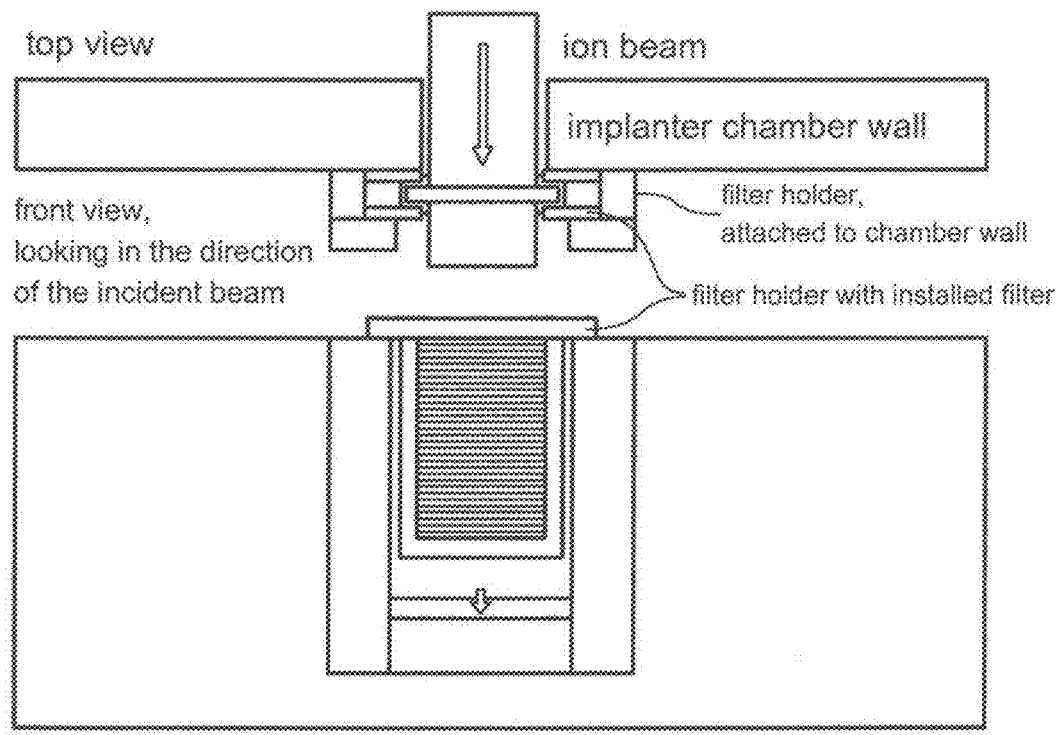

FIG. 6 illustrates a typical installation of a frame for holding an energy filter element in the beam path of an ion implanter. In the example, the filter holder is arranged on one side of the chamber wall. In the example, this side is the interior side of the chamber wall, i.e., the side which faces the wafer (not shown) during implantation. The frame, into which the filter chip has been inserted, is pushed into the filter holder and then covers the opening in the chamber wall, through which the ion beam passes during the implantation.

Figure 7:
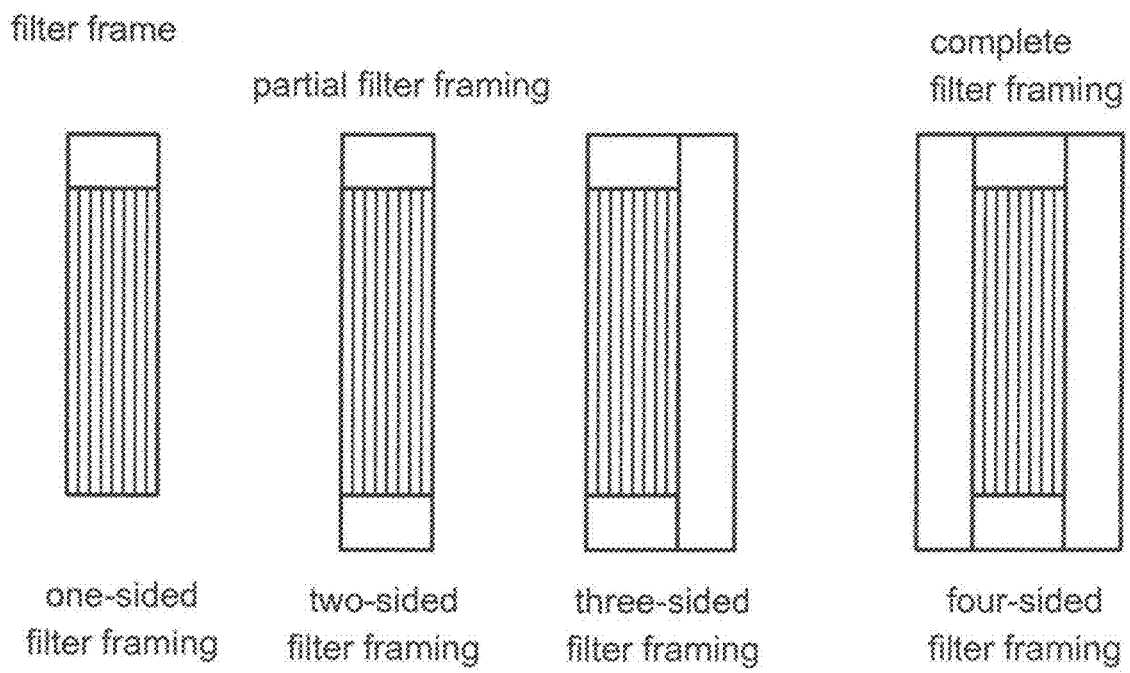

FIG. 7 shows partial frames (on the left in the figure) and a complete frame (at the far right in the figure), each of which can consist of the same material as that of the energy filter (e.g., monolithic) and/or of a different material.

Figure 8:
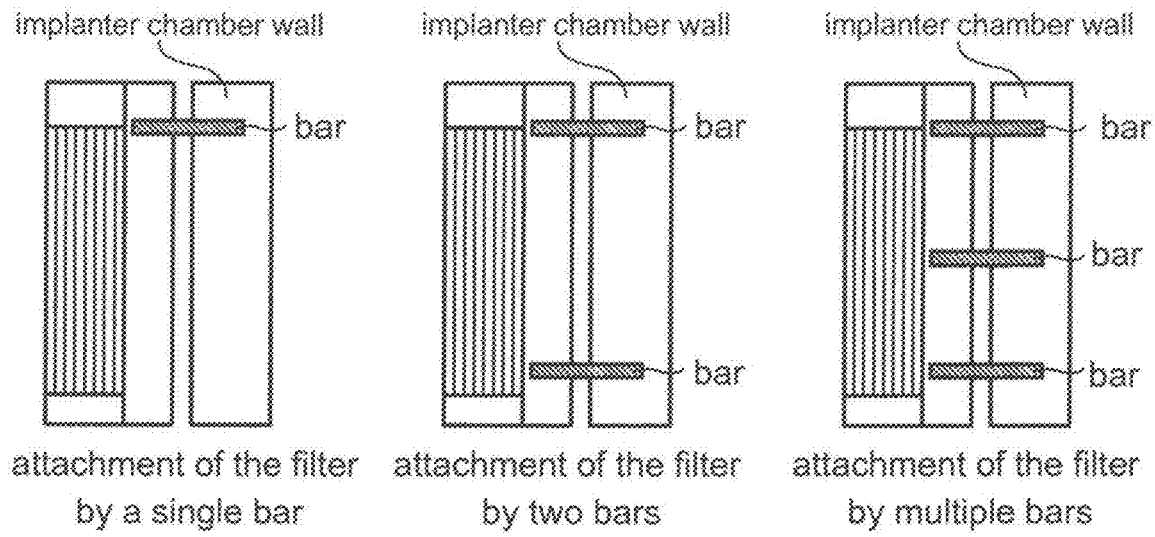

FIG. 8 illustrates the use of one or more bars for the attachment of the filter frame surrounding the filter or of any other passive scattering element.

Figure 9:
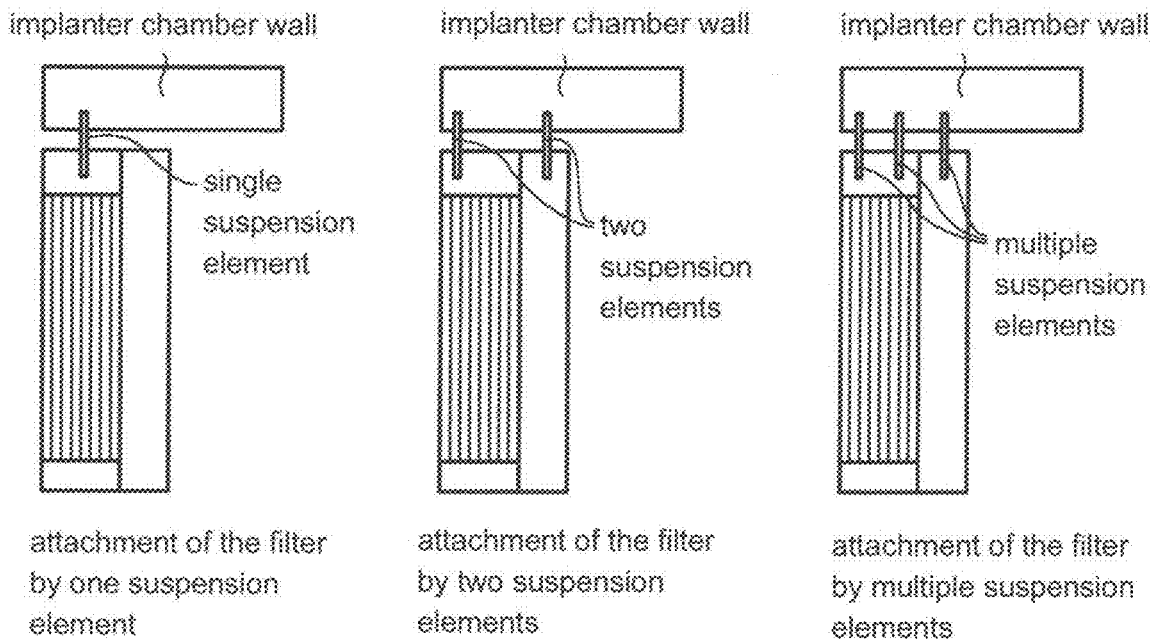

FIG. 9 illustrates the use of a single or multiple suspension elements for the attachment of the filter frame surrounding the filter or of any other scattering element.

Figure 10:
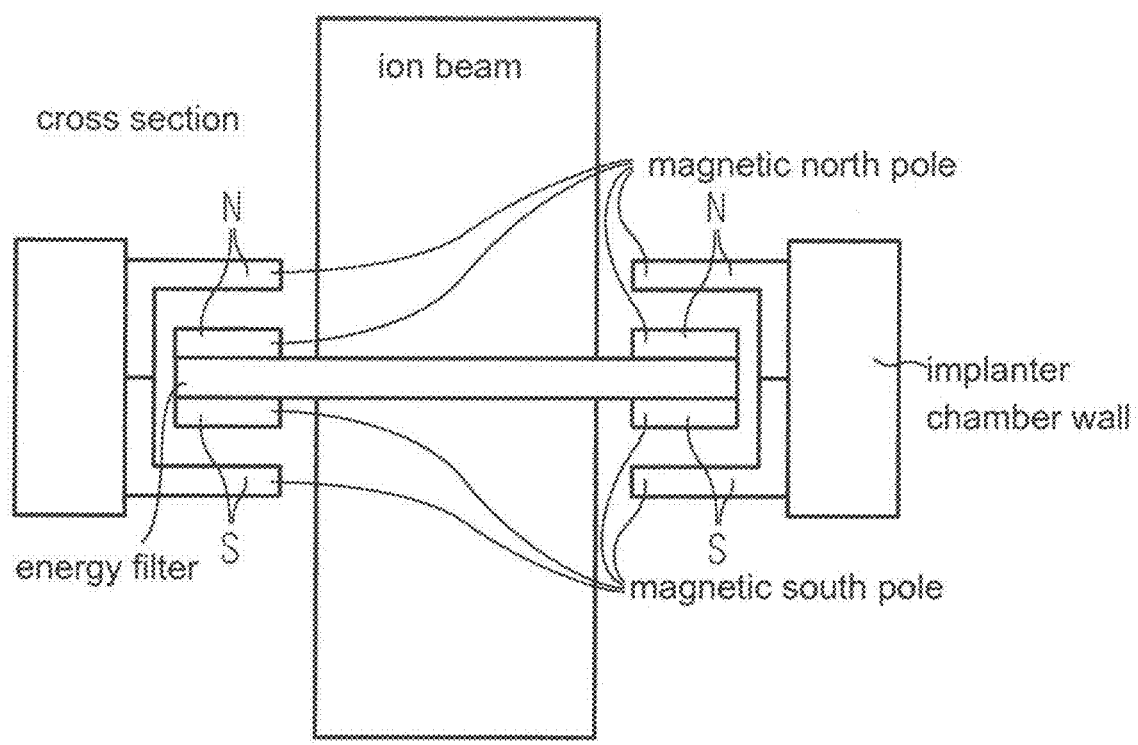

FIG. 10 illustrates the use of magnetic fields for the attachment of the filter frame surrounding the filter or of any other scattering element.

Figure 11:
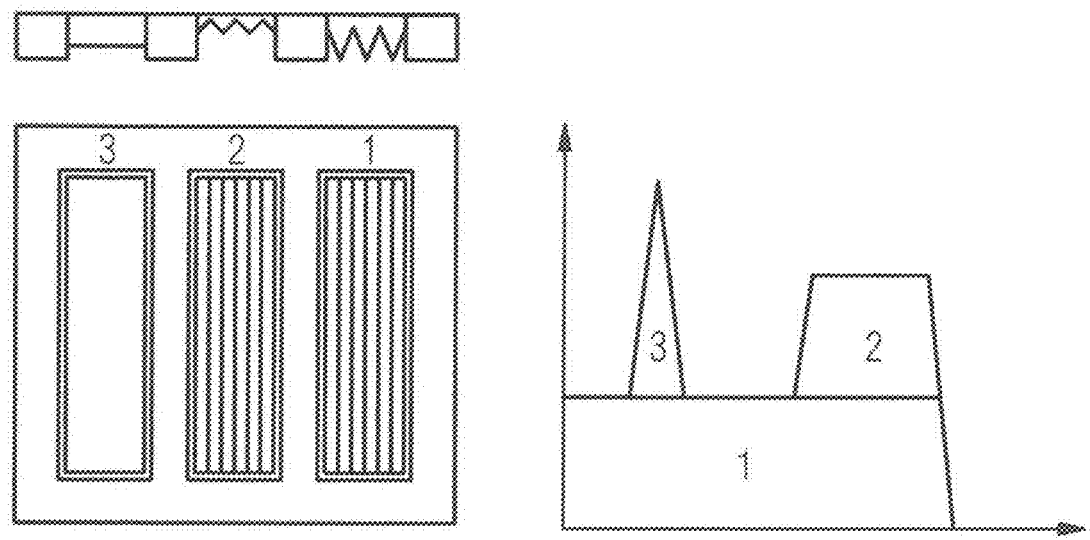

FIG. 11 illustrates a simple realization of a multifilter. Three differently formed filter elements are combined in a filter-holding frame to form a complete energy filter. The ion beam passes uniformly over all of the individual filter elements.

In the present example (left), the dopant depth profile shown on the right is thus produced. This profile contains three depth profiles, numbered 1, 2, and 3. Each of these subprofiles results from one of the three subfilters shown on the left, namely, from the subfilter provided with the corresponding number.

Figure 12:
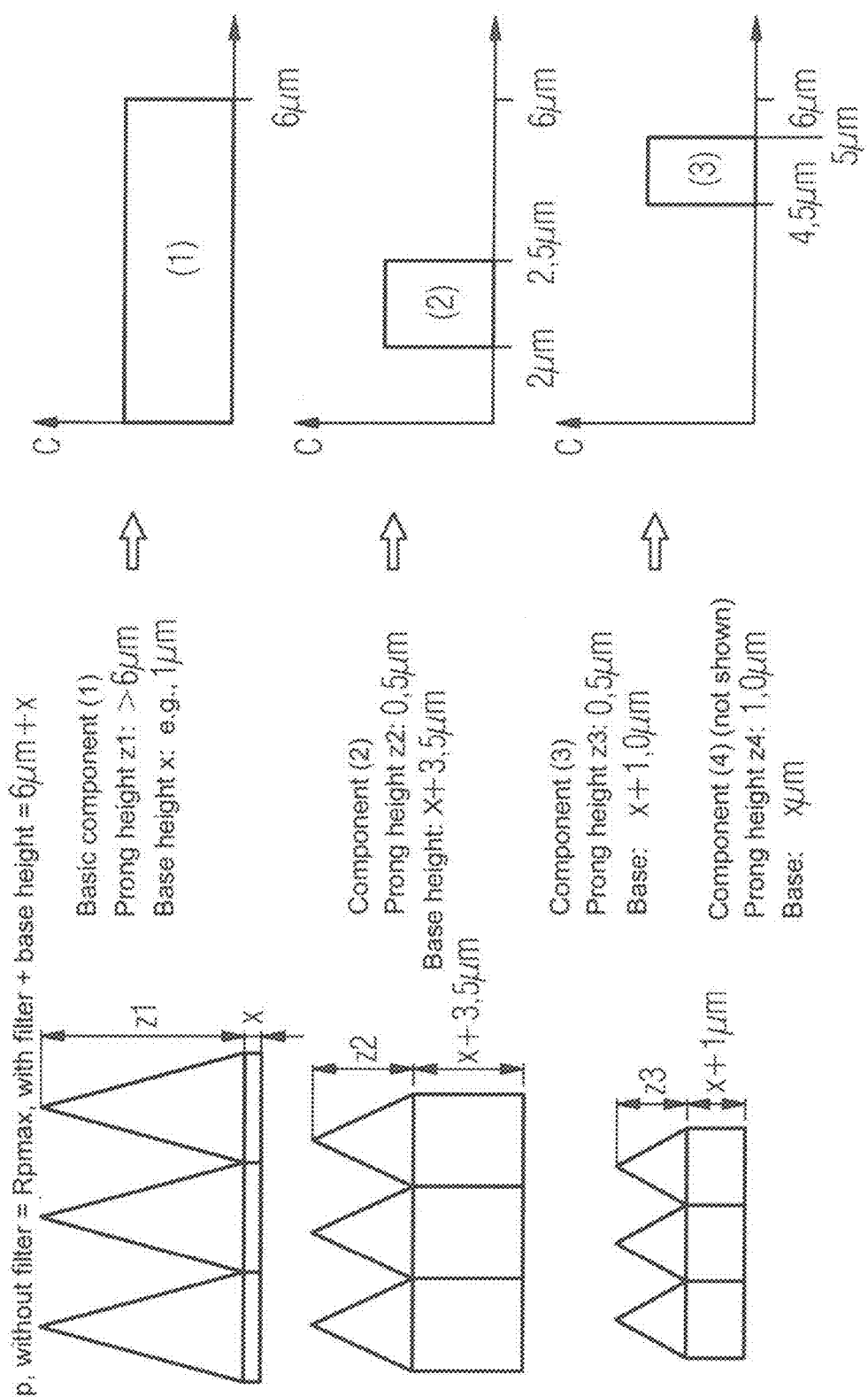

FIG. 12 illustrates a detailed diagram of the multifilter concept. On the left are three filter elements shown by way of example. Four elements are described as numbered. For a given ion species and primary energy, a dopant depth profile results from each filter element. The weighting, i.e., the resulting concentration, is adjustable by varying the dimensions of the surfaces of the individual filter elements. For this example, it is assumed that the filter and the substrate have the same energy-dependent stopping power. Usually, however, this is not the case.

Figure 13:
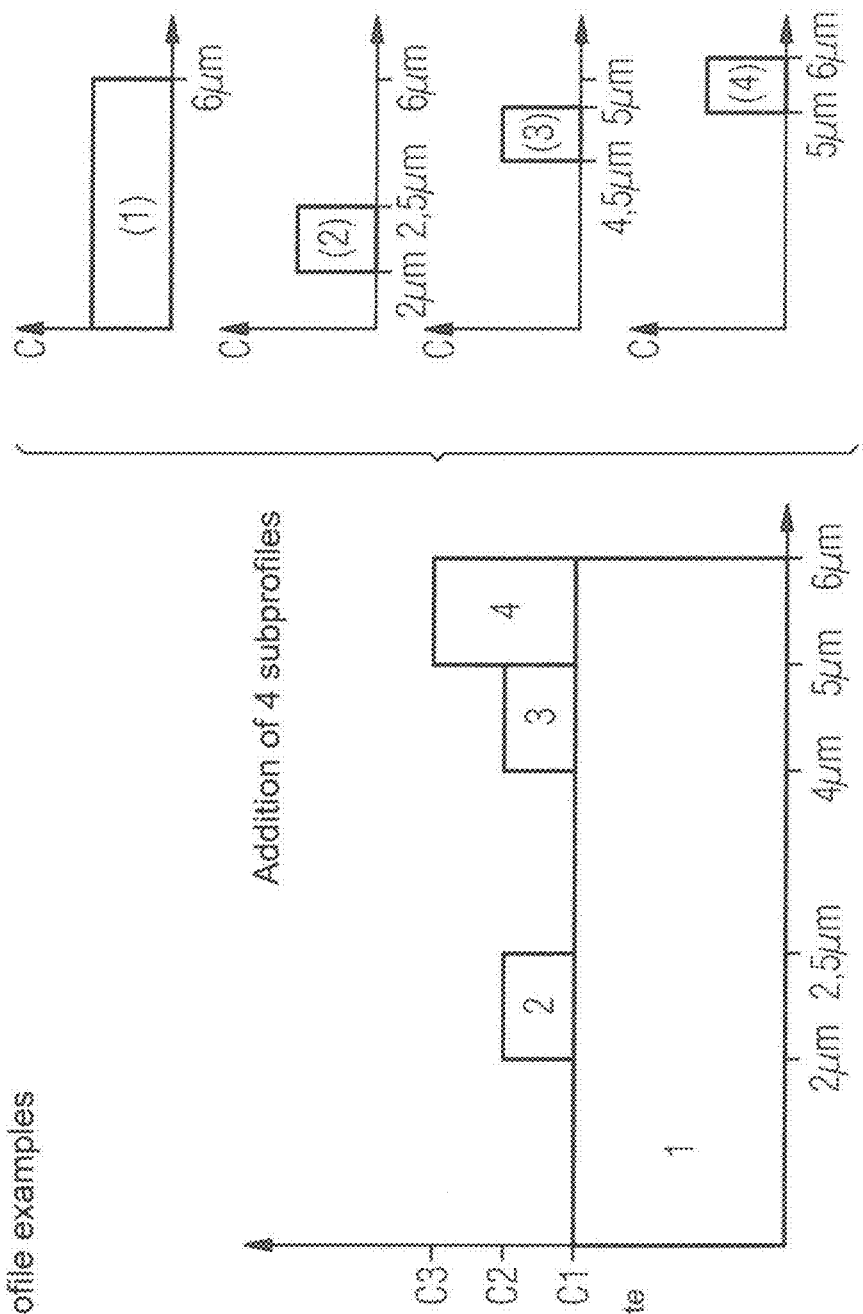

FIG. 13 shows a summation profile obtained when all of the filter elements described in FIG. 12 are mounted together as a complete filter with appropriate weighting and are exposed uniformly to an ion beam of appropriate primary energy.

Figure 14:
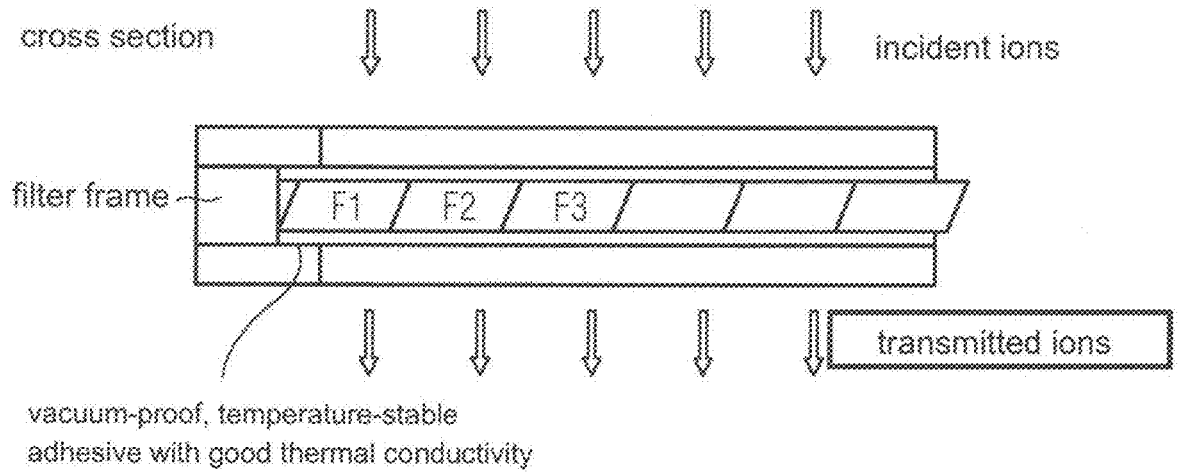

FIG. 14 shows an exemplary arrangement of individual filter elements in a multifilter. The individual elements F1, F2, F3, etc., shown here are cut with a bevel and are mounted directly on each other.

Figure 15:
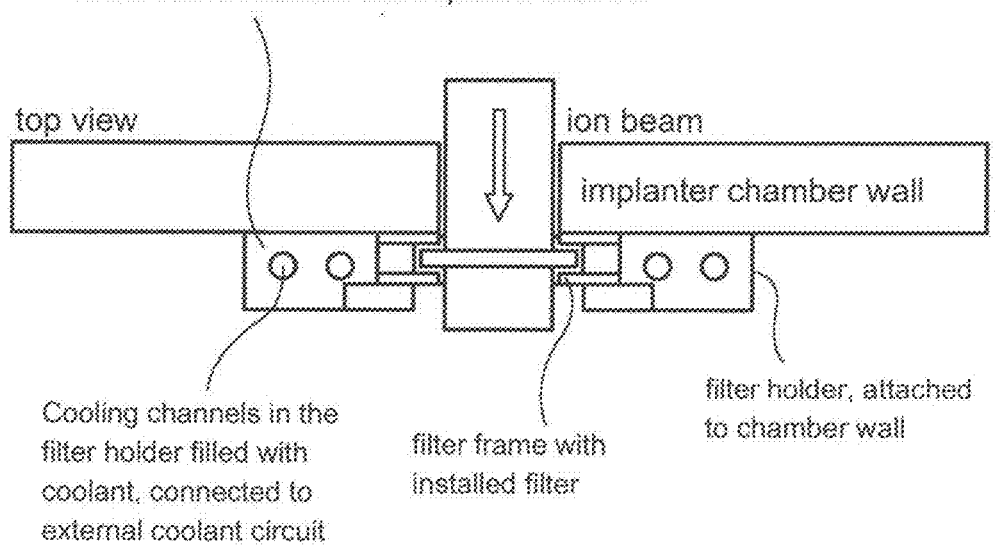

FIG. 15 shows a filter arrangement installed in an ion implantation system. Cooling lines, which are supplied with coolant by an external cooling device, are integrated into the filter holder, which holds the filter frame. The cooling lines could also be arranged on the surface of the filter holder (not shown).

FIG. 16 shows an energy filter with a large surface area, which is only partially irradiated per unit time. Thus the non-irradiated areas can cool by radiative cooling. This embodiment can also be configured as a multifilter, as described above. That is, it can be configured as a filter comprising several different filter elements. In the example shown, the frame with the filter oscillates in a direction perpendicular to the direction of the ion beam. The area of the filter covered by the ion beam is smaller than the total surface area of the filter, so that, per unit time, only a portion of the filter is exposed to the beam. This portion changes continuously because of the oscillating movement.

FIG. 17 shows another configuration of an arrangement of energy filters, which rotate around a central axis. Again, the irradiation per unit time is only partial, and the elements not being irradiated can thus cool. This embodiment is also configurable as a multifilter.

FIG. 18 illustrates schematically a "shifting of the peak". By implanting ions into the energy filter with the help of a trapezoidal prism-shaped structure, a rectangular profile can be produced in the substrate. The initial peak is implanted into the energy filter. This implantation profile has the advantageous property that it begins directly at the surface of the substrate, which is extremely important for the application of the energy filter.

Figure 19:
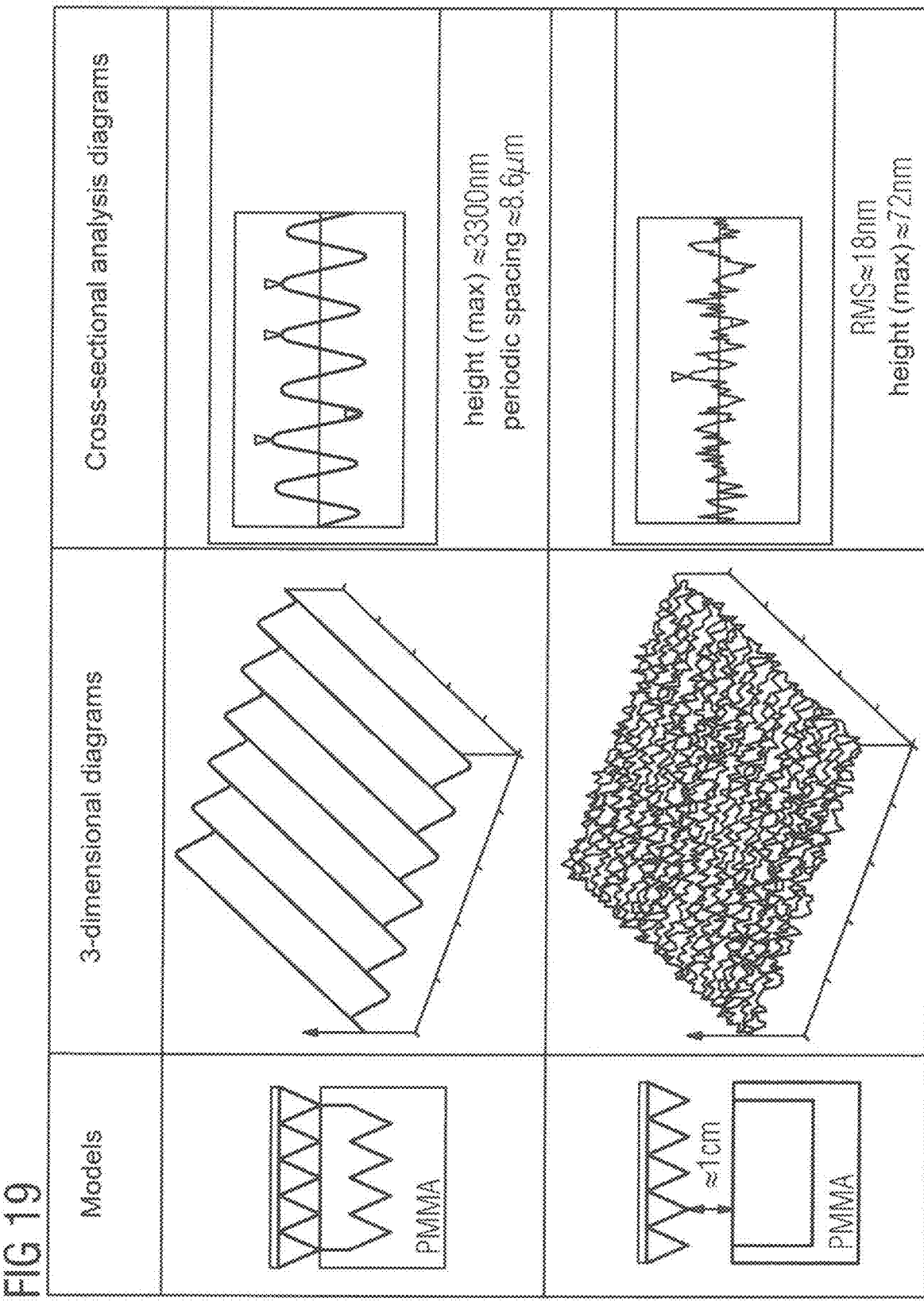

FIG. 19 shows how ions are implanted in a PMMA substrate by means of an energy filter during a static implantation. The ions destroy the molecular structure of the PMMA. A subsequent development process reveals the energy distribution of the ions. Areas of high energy deposition are dissolved away. Areas of lower or no energy deposition by ions are not dissolved by the developer solution.

Figure 20:
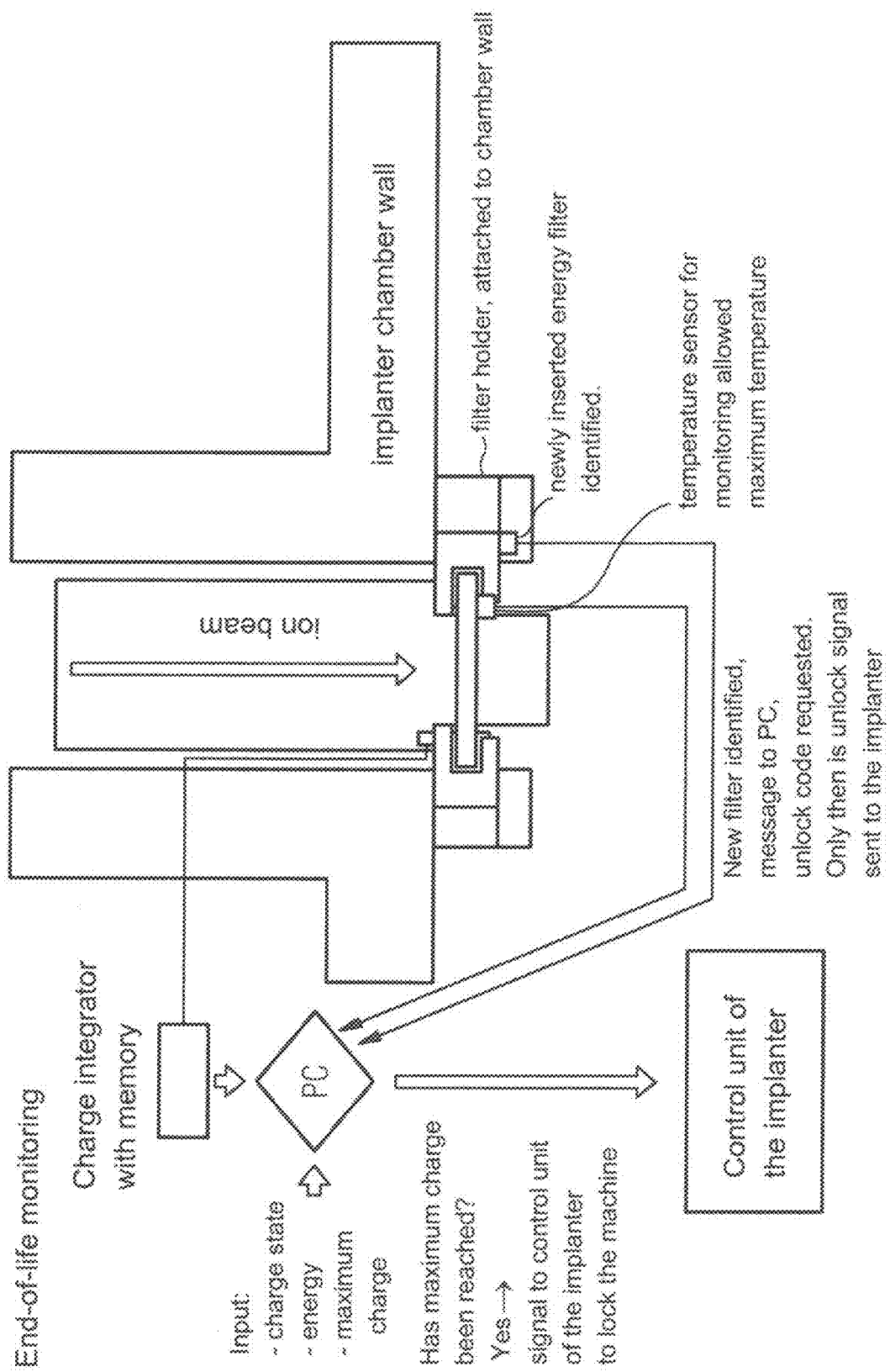

FIG. 20 shows a monitoring system for identifying the filter and for monitoring conformity to the filter specifications (maximum temperature, maximum accumulated ion dose).

Figure 21:
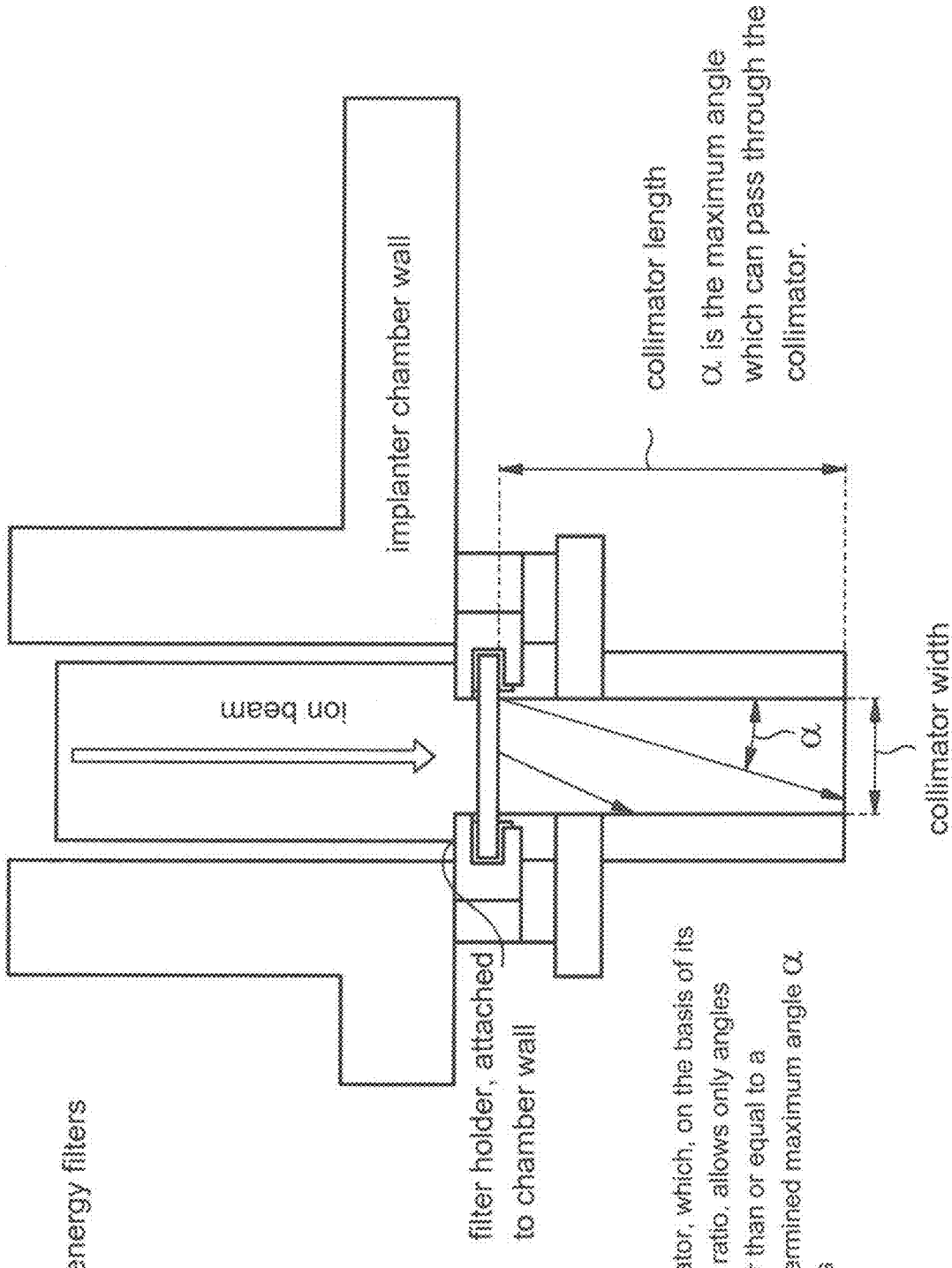

FIG. 21 shows a collimator structure, which is attached to a filter holder. The aspect ratio determines the maximum angle α. If the available distance to the implantation substrate is not large enough, the collimator can consist of several collimator units with smaller openings arranged side by side. This can be arranged in a honeycomb pattern, for example.

Figure 22:
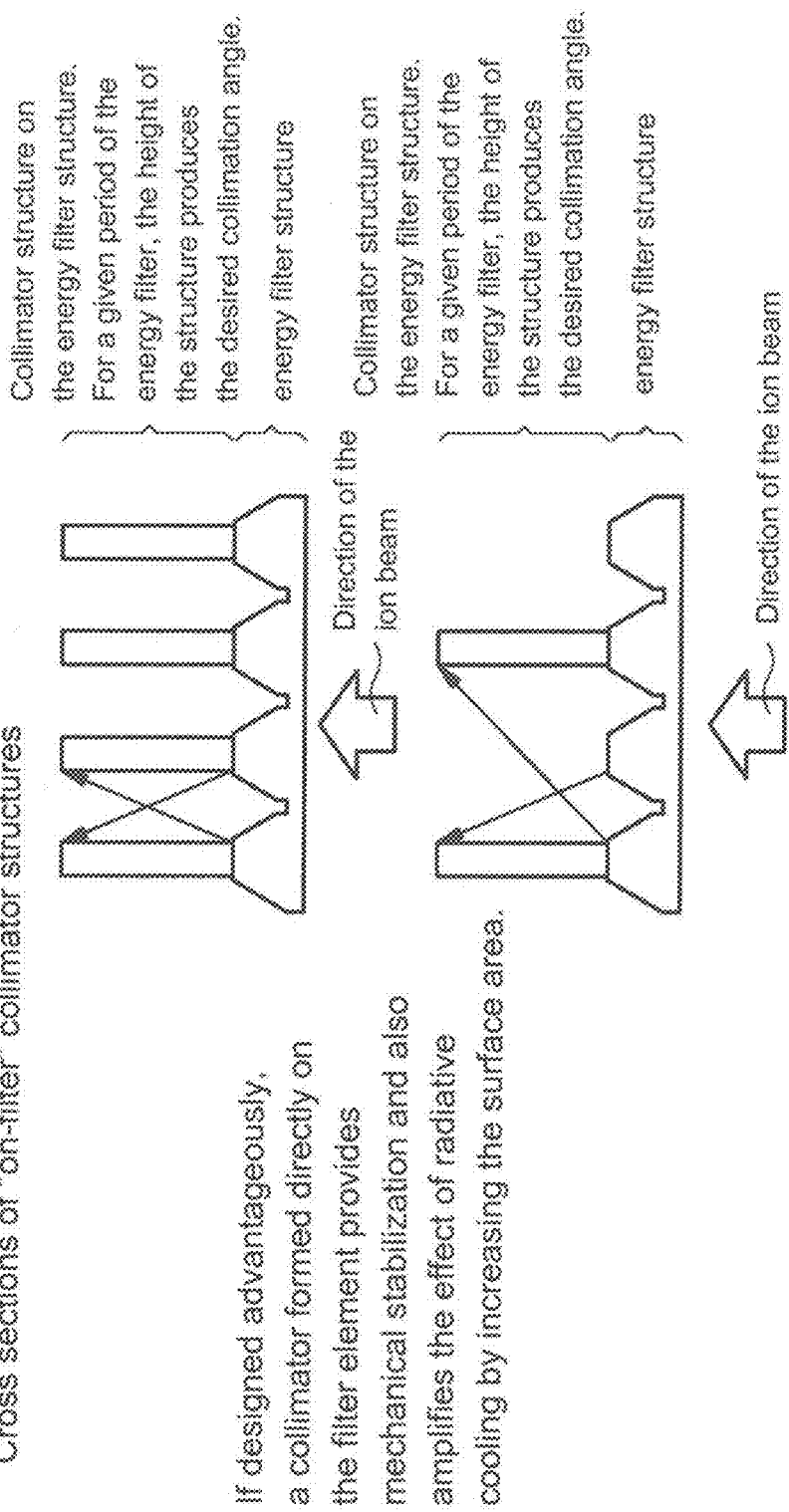

FIG. 22 shows a collimator structure built directly on the filter. The aspect ratio determines the maximum angle α. Here the filter is placed in the ion beam in a back-to-front configuration. If designed appropriately, the collimator has an advantageous mechanically stabilizing effect on the filter and, as a result of the increase in the surface area of the filter chip, improves the radiative cooling.

FIG. 23 shows a collimator structure build directly on the filter. The aspect ratio determines the maximum angle α. In this example, the filter is placed in the ion beam in a front-to-back configuration.

FIG. 24 shows a collimator structure built directly on the filter. The collimator structure can have a lamellar, strip-like, tubular, or honeycomb structure, depending on the layout of the filter and the required maximum angular distribution.

Figure 25:
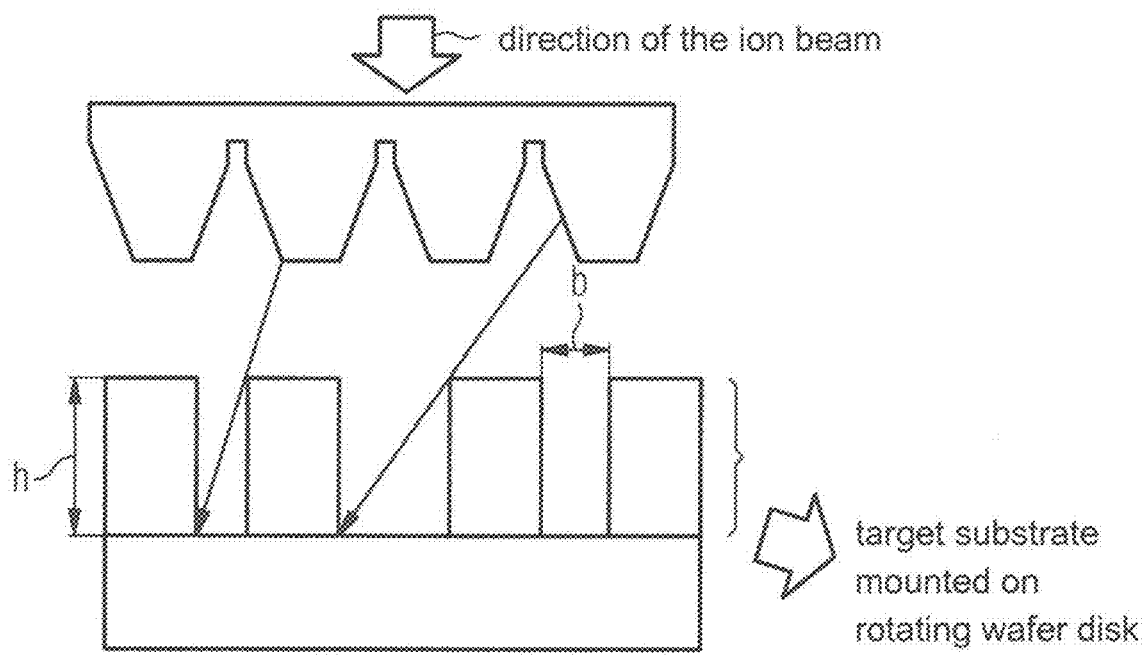

FIG. 25 shows a collimator structure built directly on the target substrate. The collimator structure can have a lamellar, strip-like, tubular, or honeycomb structure, depending on the layout of the substrate structure and the required maximum angular distribution.

Figure 26:
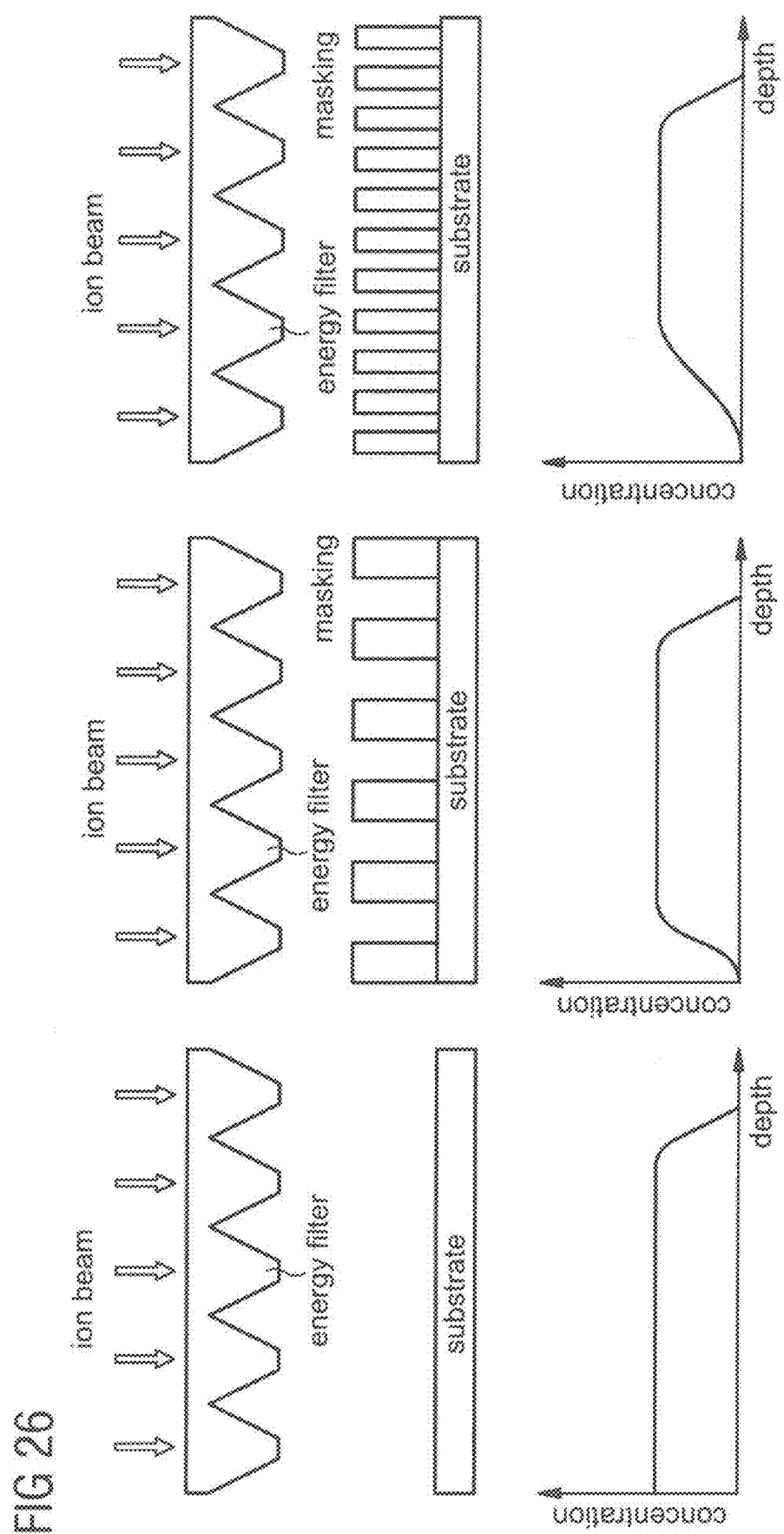

FIG. 26 illustrates doping profiles obtained with the same filter but different collimator structures.

Figure 27:
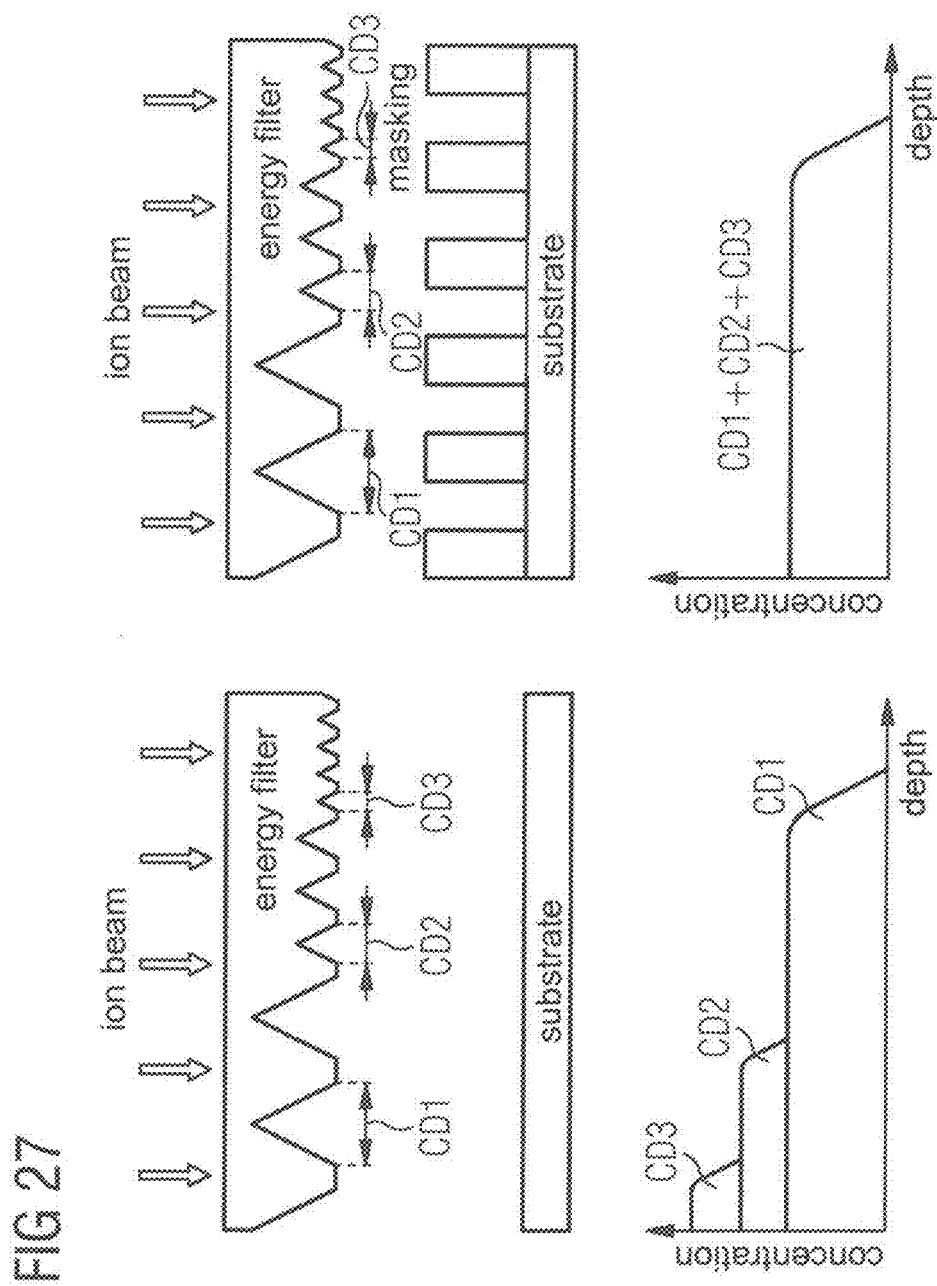

FIG. 27 shows doping profiles obtained by means of a multifilter by implantation with and without a collimator structure.

Figure 28:
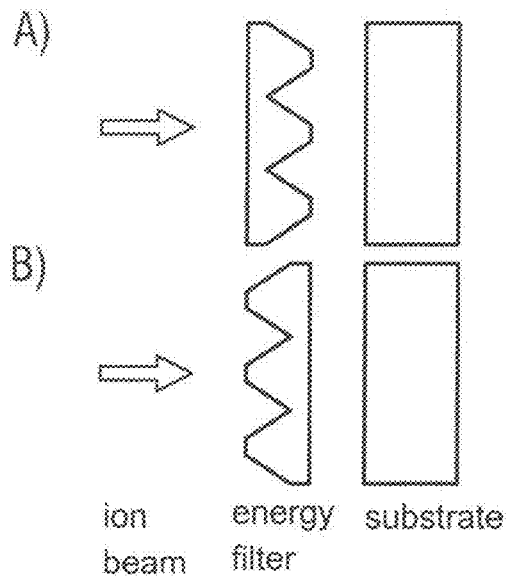

FIG. 28 illustrates schematically a "turning-over" of the filter. (A) The filter is used in the regular arrangement, which means that the microstructures point away from the beam. (B) The filter can be turned over, which means that the microstructures point toward the beam. This has advantageous effects on sputtering effects in the filter.

Figure 29:
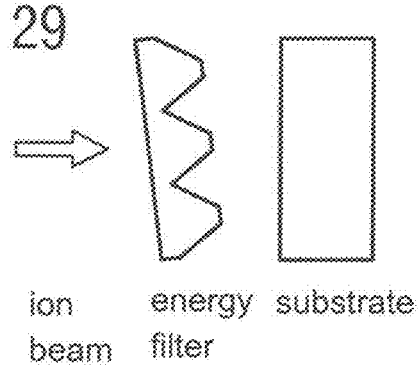

FIG. 29 illustrates schematically a "tilting" of the filter. If the energy filter is fabricated of anisotropic materials, there can be a channeling effect. This can be prevented by tilting the energy filter.

Figure 30:
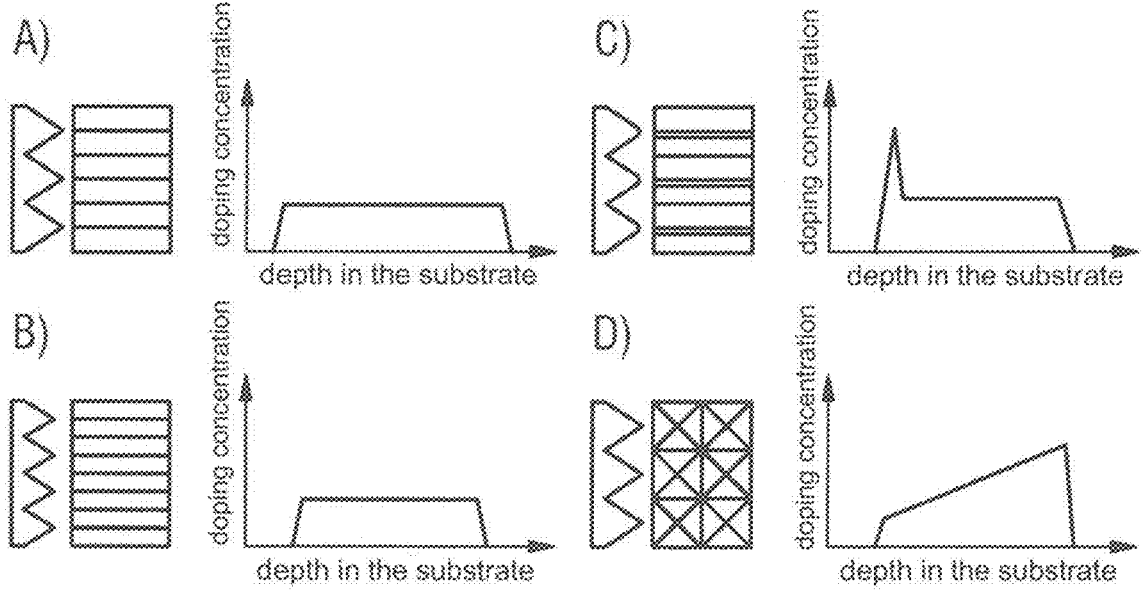

FIG. 30 shows schematically various doping profiles (dopant concentration as a function of depth in the substrate) for energy filter microstructures of various forms (a side view and a top view shown in each case). (A) Triangular prism-shaped structures produce a rectangular doping profile. (B) Smaller triangular prism-shaped structures produce a doping profile with a shallower depth distribution. (C) Trapezoidal prism-shaped structures produce a rectangular doping profile with a peak at the beginning of the profile. (D) Pyramidal structures produce a triangular doping profile, which rises as it extends into the depth of the substrate.

Figure 31:
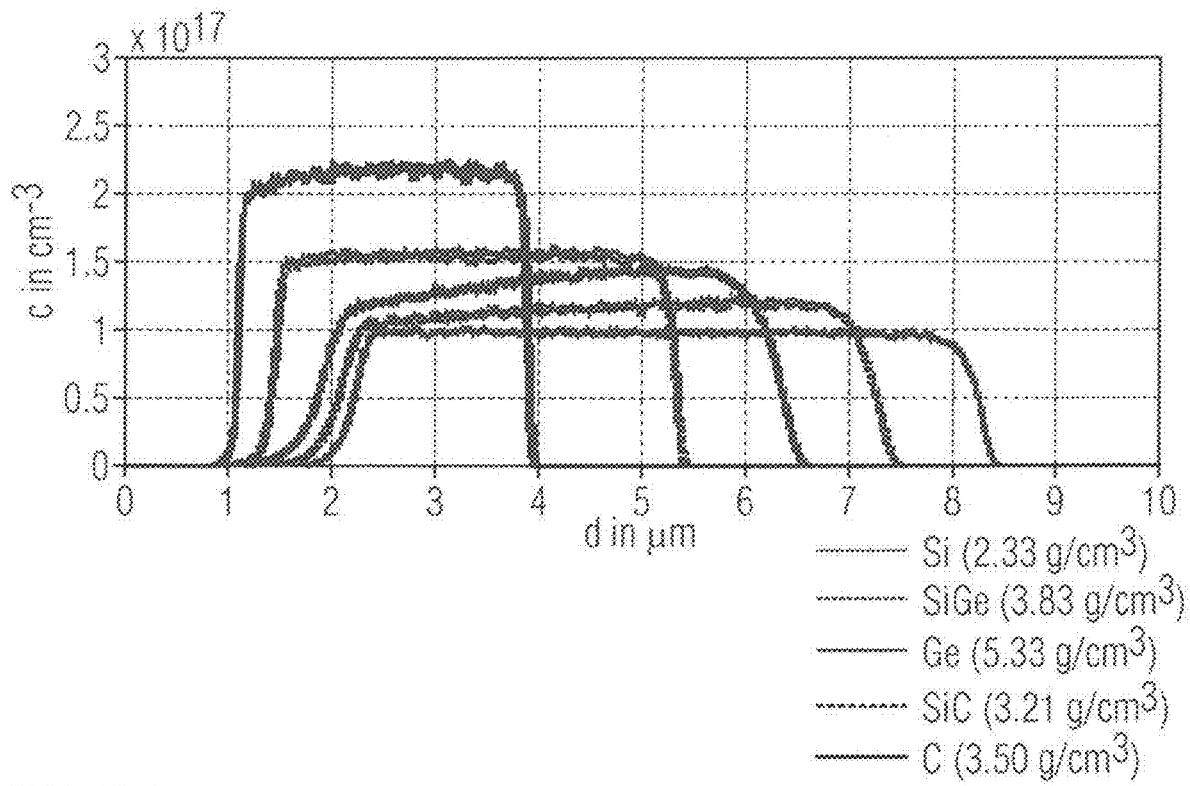

FIG. 31 shows various target profile shapes for the same primary ion and the same primary energy on the basis of different target materials. The filter material is silicon in each case.

Figure 32:
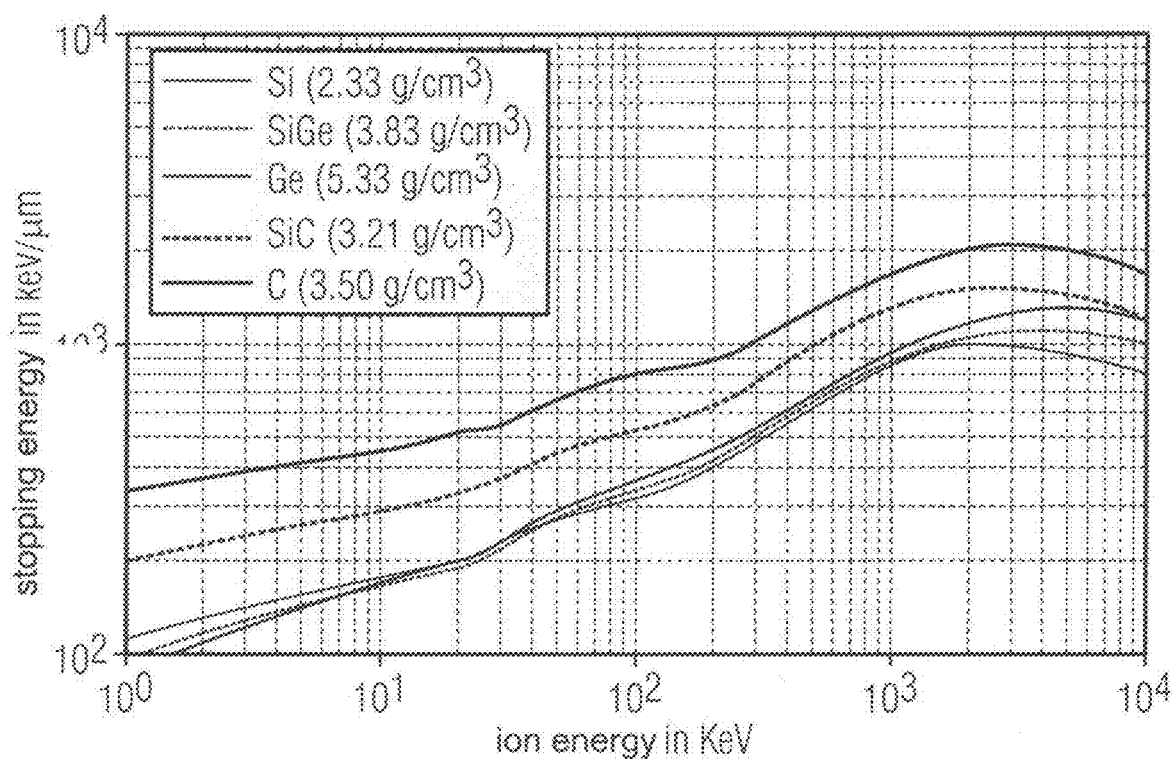

FIG. 32 illustrates the change in stopping power as a function of energy [4] (SRIM simulation).

Figure 33:
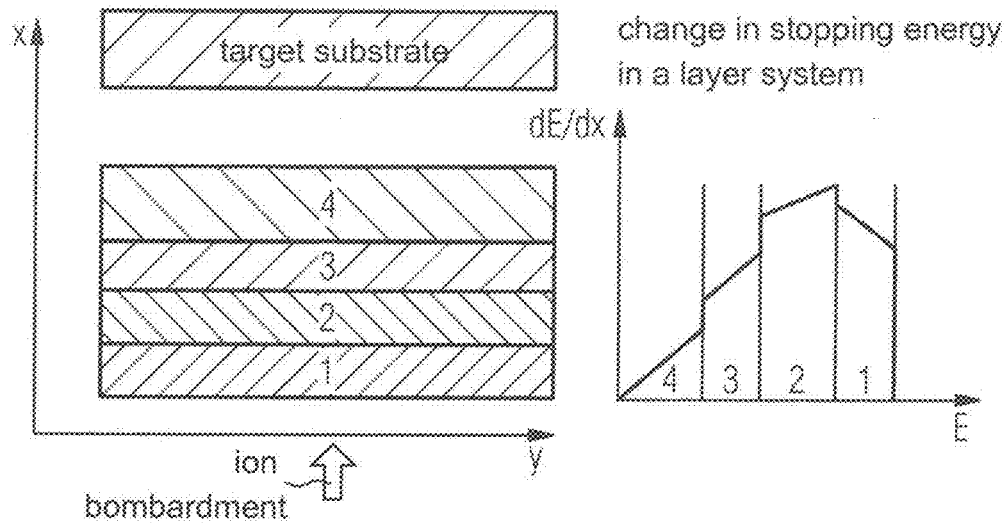

FIG. 33 illustrates the starting material of a simple multilayer filter. Filter materials with suitable stopping power are arranged sequentially on top of each other by means of a suitable deposition method.

Figure 34:
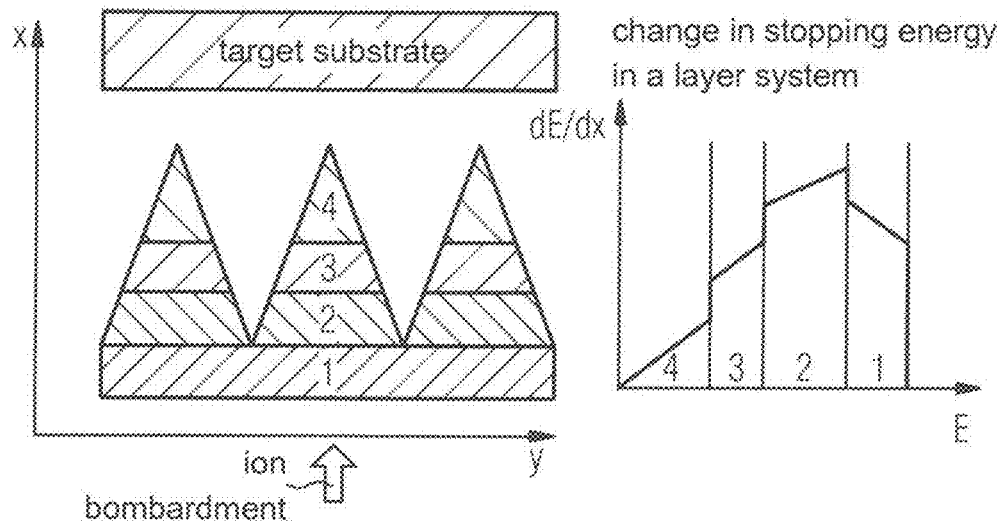

FIG. 34 illustrates how, with a suitable configuration of the layered stack of materials with different stopping powers, complex dopant depth profiles can be realized even with a simple filter geometry (here: strip-like triangles).

Figure 35:
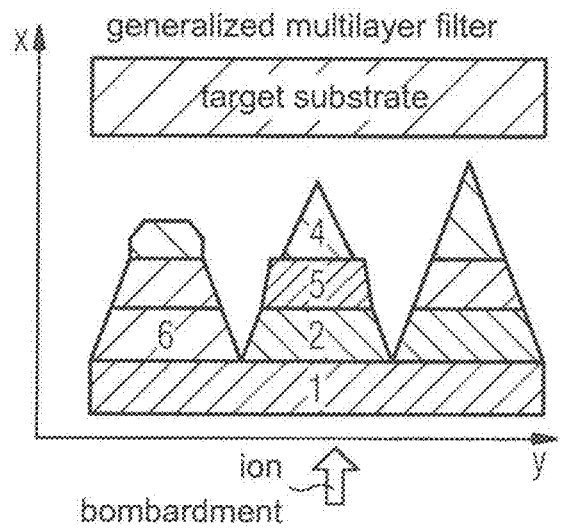

FIG. 35 illustrates the general principle of constructing an energy filter out of materials 1-6, each of the individual filter structures having a different geometry.

Figure 36:
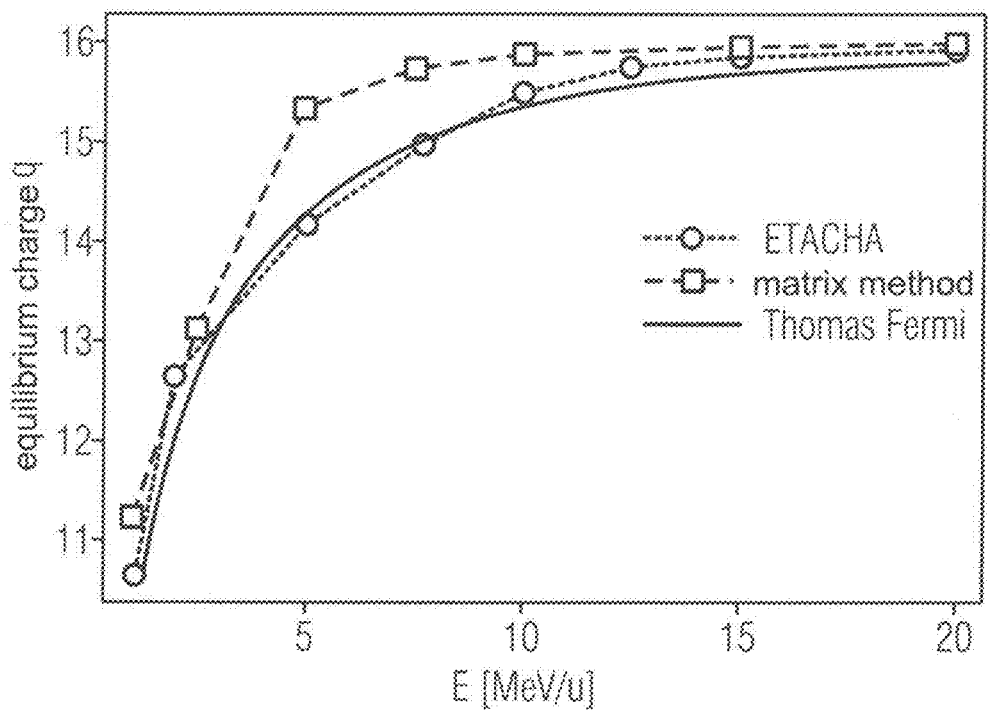

FIG. 36 illustrates the equilibrium charge states of an ion (black line: Thomas-Fermi estimate; blue line: Monte Carlo simulations; red line: experimental results) as a function of the kinetic energy of the ion on passing through a thin membrane. Ion: sulfur; membrane: carbon [27].

Figure 37:
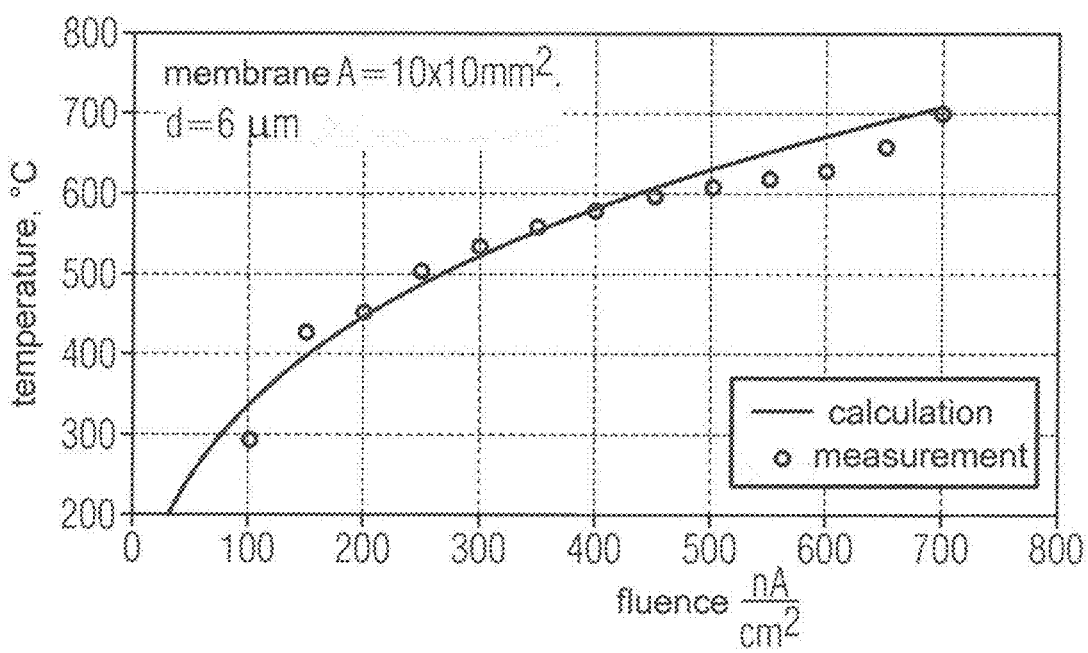

FIG. 37 illustrates the heating of an energy filter by ion bombardment: 6 MeV C ions in an energy filter which is not transparent under these conditions [2].

Figure 38:
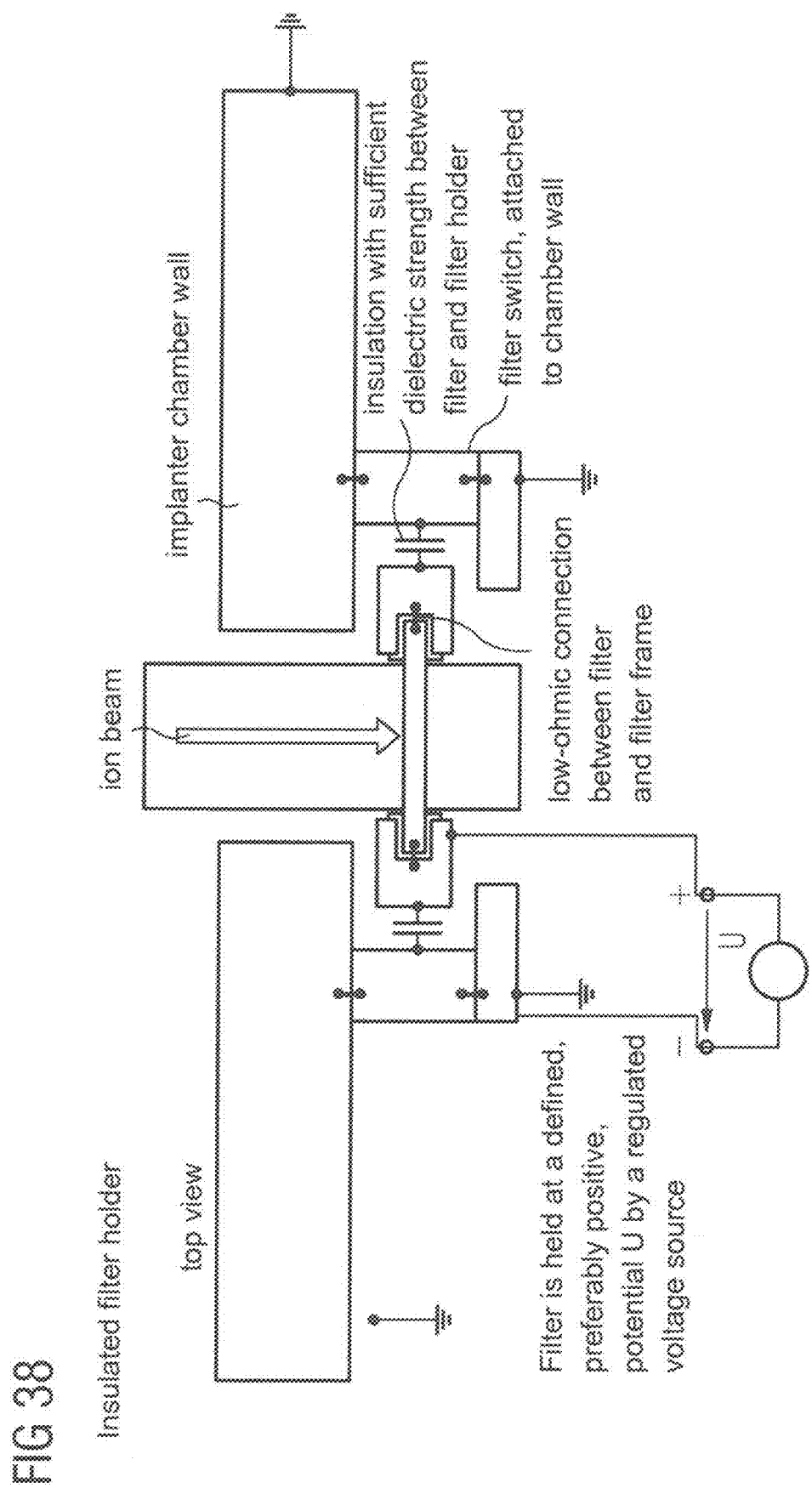

FIG. 38 shows an embodiment of a filter arrangement in which the filter is held in the filter frame at a defined (positive) potential versus the filter holder for the purpose of suppressing secondary electrons.

Figure 39:
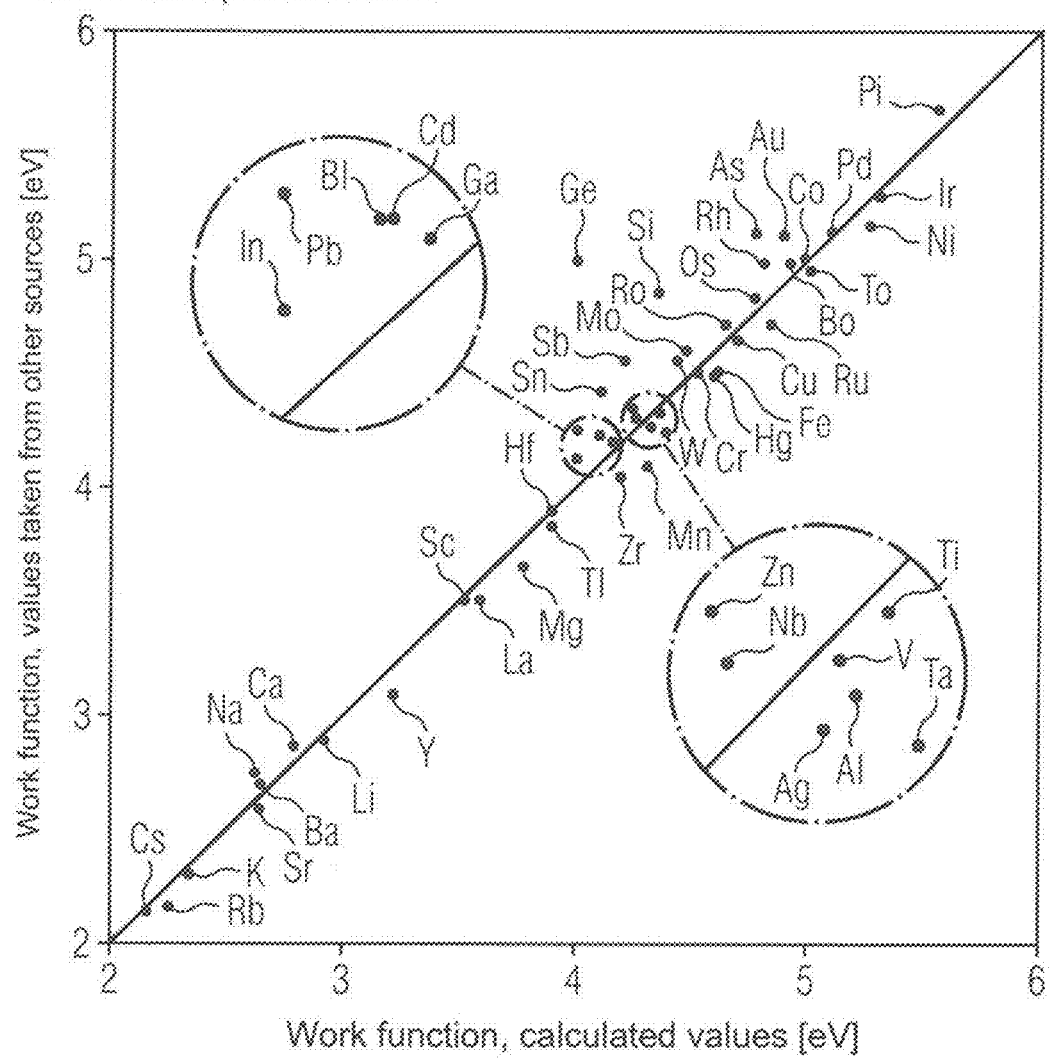

FIG. 39 illustrates the work functions of a number of elements. [25] Materials Science-Poland, Vol. 24, No. 4, 2006.

FIG. 40 shows an arrangement for an energy filter implantation in which the complete irradiation of a static substrate is achieved by means of an ion deflection system before the filter and with the selection of a suitable distance between the filter and the substrate (typically in the range from a few cm to a few m).

FIG. 41 shows an arrangement for an energy filter implantation in which a large filter surface—larger than the surface of substrate—is used to achieve the complete irradiation of the substrate. The diameter of the irradiated filter area is larger than the diameter of the substrate.

FIG. 42 illustrates a filter only parts of which are active, with mechanical scan in one direction.

Figure 43:
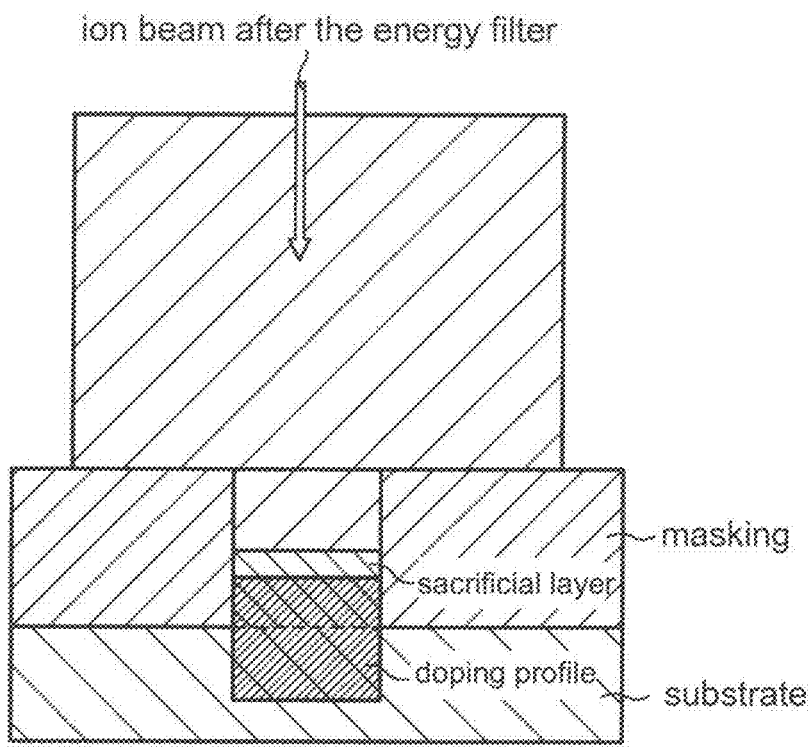

FIG. 43 illustrates a modification of the doping profile in the substrate by means of a sacrificial layer in the case of a masked, energy-filtered implantation. In the example shown here, the beginning of the implantation profile is shifted into the sacrificial layer. This principle can be used analogously for unmasked, energy-filtered ion implantation.

Figure 44:
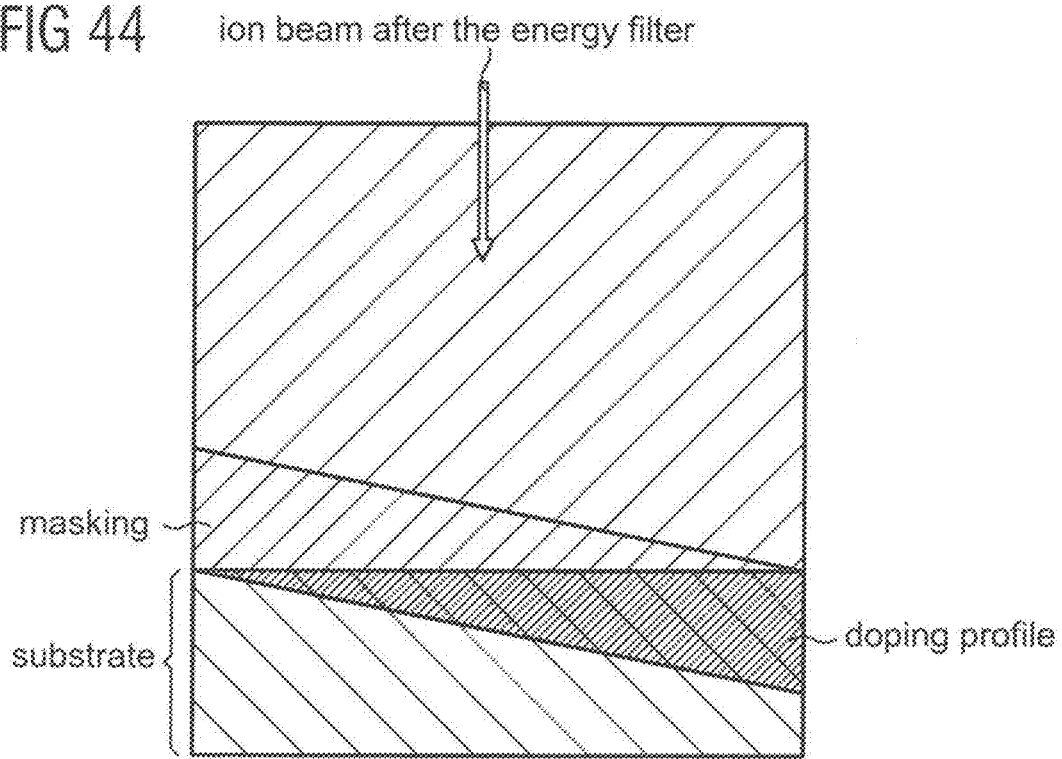

FIG. 44 illustrates a lateral modification of the doping profile in the substrate by means of a sacrificial layer in the case of an unmasked, energy-filtered ion implantation. The lateral depth modification comes about through the lateral differences in the thickness of the sacrificial layer. The principle can be used analogously for masked, energy-filtered implantations.

FIG. 45 illustrates a coupling of vertical movements in the y direction of the filter and the substrate. By the rotation of the wafer wheel, the wafers are guided behind the substrate in the x direction. The ion beam (not shown) is expanded in the x direction, for example, and, as a result of the vertical oscillation of the implantation chamber, it scans the entire surface of the multifilter. The surface consists of active filter regions and inactive holder regions. The arrangement shown in (A) is an unfavorable arrangement. When one considers the irradiated filter surface at y1 and y2, three filters are irradiated at y1, whereas no filter is irradiated at y2. As a result, one obtains a laterally inhomogeneous stripe pattern on the wafer. The arrangement shown in (B) is a possible example of a better arrangement. Two filters are irradiated at y1 and y2. This is true for all y. As a result, a laterally homogeneous doping over the entire surface of the wafer is achieved.

FIG. 46 shows a wafer wheel with an arrangement of wafers to be irradiated and monitoring structures located between the wafers.

Figure 47:
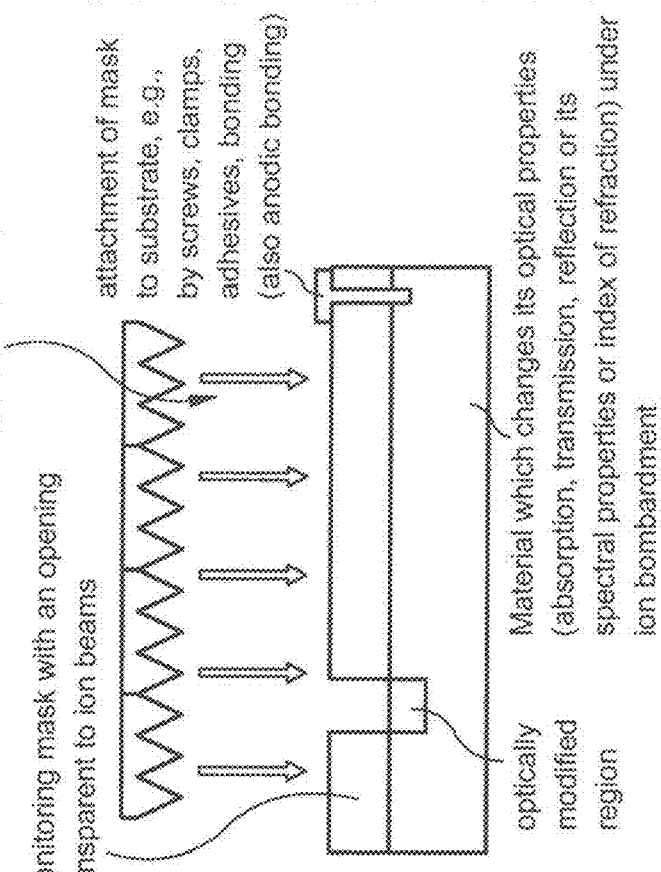

FIG. 47 shows a monitoring mask with an example of an arrangement of various mask structures Ma1-Ma10, which are transparent or partially transparent to ion beams.

Figure 48:
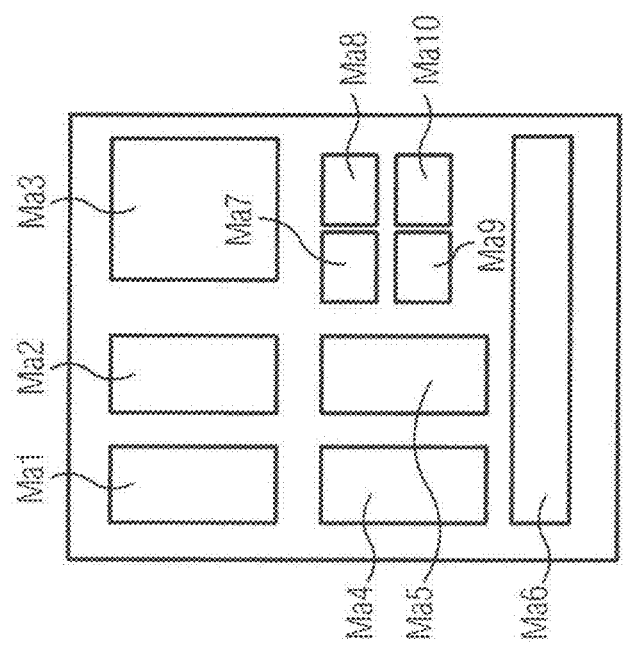

FIG. 48 shows a cross section through a monitoring mask and a monitoring material.

FIG. 49 shows an example of a concentration depth profile produced by means of an energy filter.

FIG. 50 shows an example of a mask structure for monitoring the depth-dependent dose distribution.

FIG. 51 illustrates the monitoring of the implantation process by means of monitoring structures.

Figure 52:
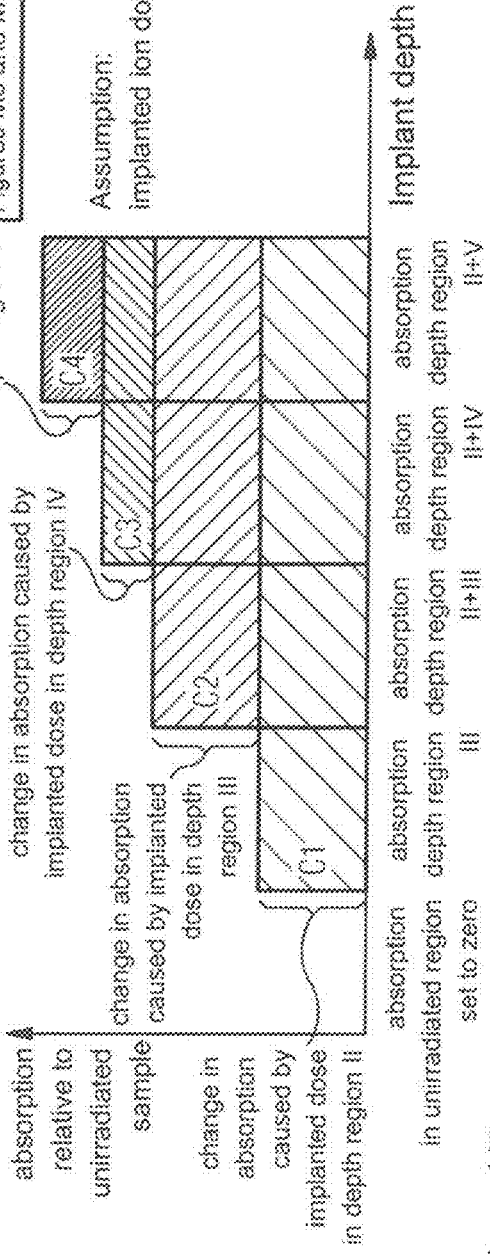

FIG. 52 illustrates the monitoring of the implantation process by means of monitoring structures.

Figure 53:
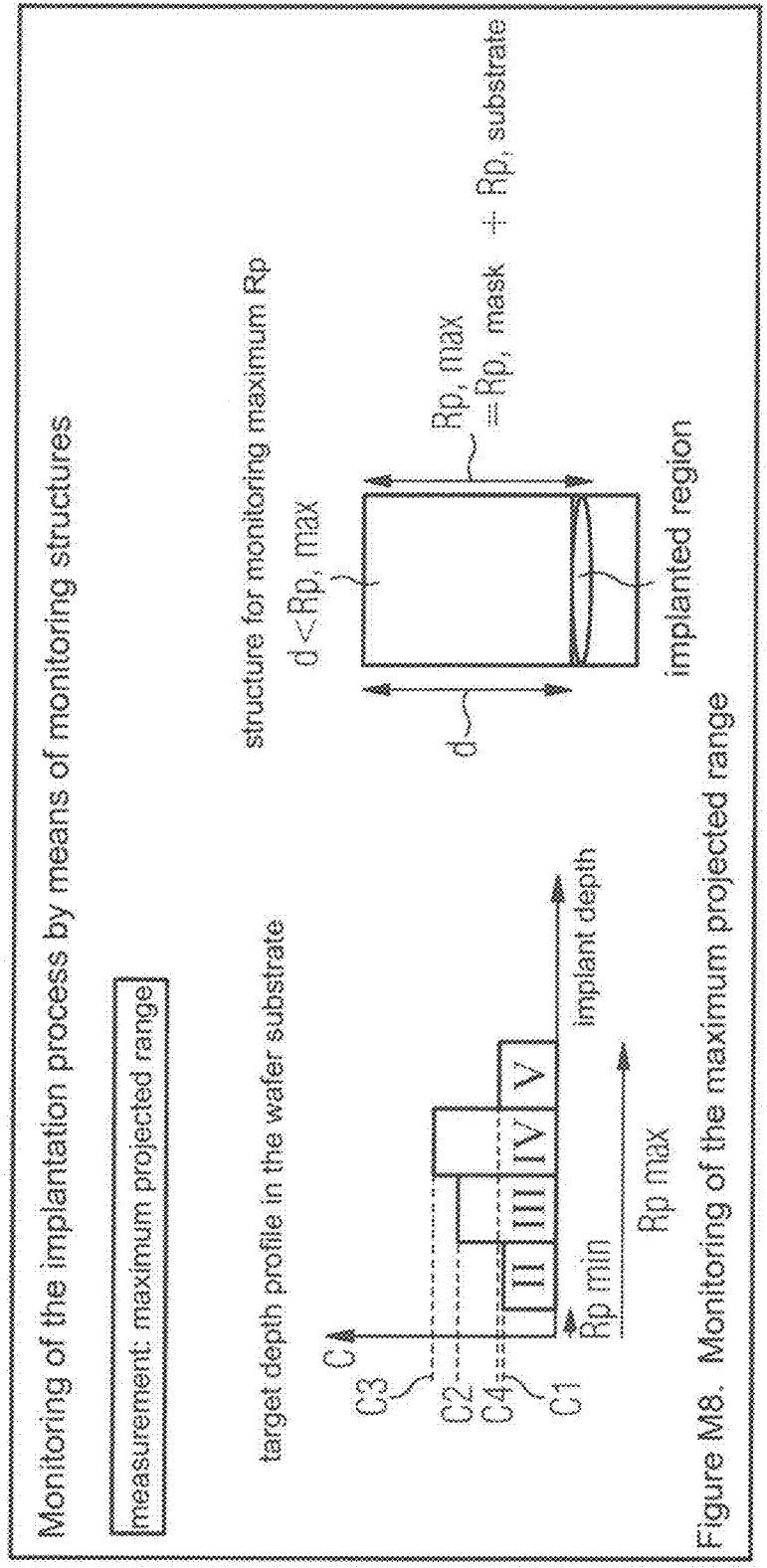

FIG. 53 illustrates the monitoring of the maximum projected range.

FIG. 54 illustrates a mask structure.

Figures 55, 56:
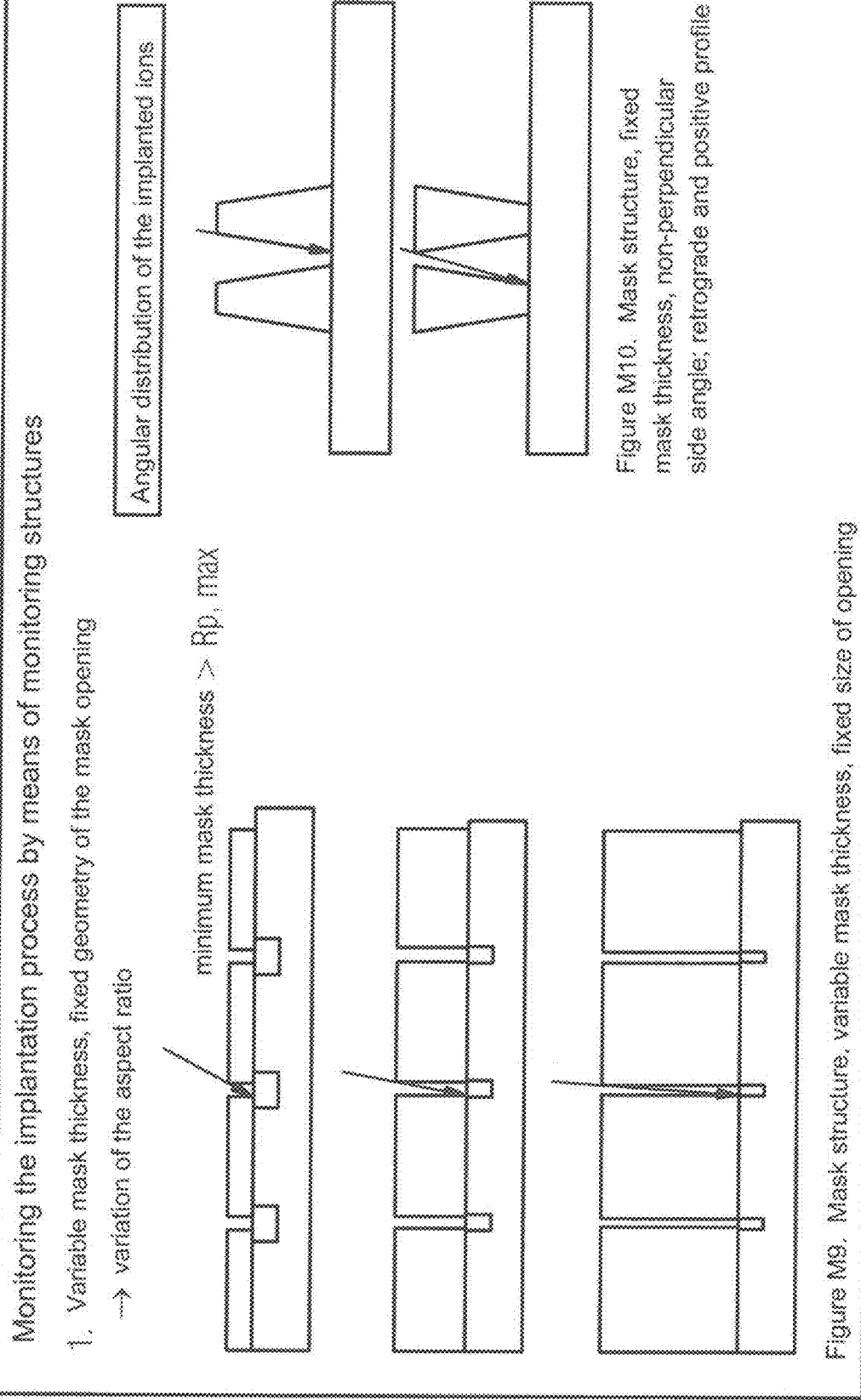

FIG. 55 illustrates another example of a mask structure.

FIG. 56 illustrates another example of a mask structure.

FIG. 57 illustrates a mask structure for monitoring asymmetric angular distributions.

Figure 58:
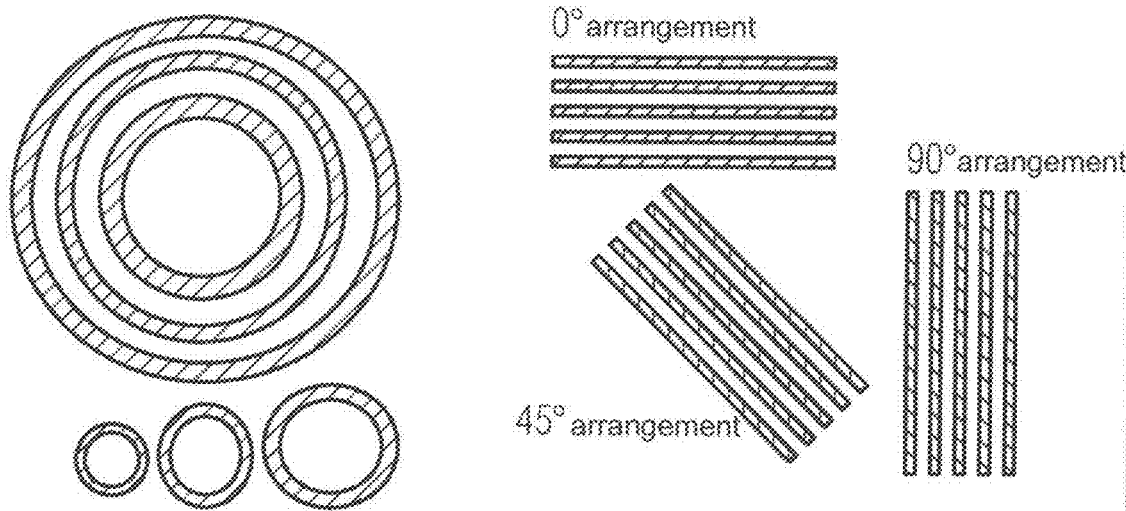

FIG. 58 illustrates various arrangements of mask structures for detecting ion angular distributions in various directions.

Figure 59:
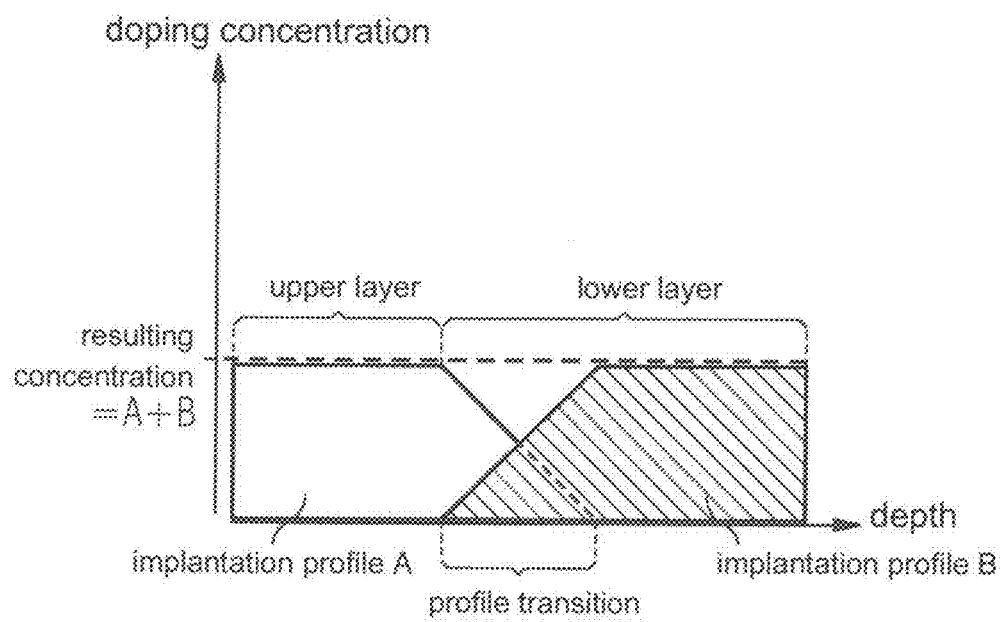

FIG. 59 illustrates a skillful adaptation of the transition between two implantation profiles A and B, so that the resulting overall concentration profile will result in the desired profile, e.g., a homogeneous profile. This can (but does not have to) be advantageous in particular in the case of layer systems consisting of two layers as in the figure shown here.

Proposal for a realization with the following sequence of processes:
 (1) doping the lower layer (implant B),
 (2) growing the upper layer, and
 (3) doping the upper layer.

For the configuration of the high-energy tail of implant A, there remain only limited possibilities. The lower-energy tail of implant B, however, can be influenced in particular by the introduction of a sacrificial layer as described in "15: Modification of the doping profile in the substrate by means of a sacrificial layer".

Proposal for a realization with the following sequence of processes:
 (1) growing the sacrificial layer;
 (2) doping the lower layer (implant B);
 (3) removing the sacrificial layer;
 (4) growing the upper layer;
 (5) doping the upper layer.

DETAILED DESCRIPTION

FIG. 1 shows a method known from [7] for producing a depth profile. In this case, an ion beam is implanted into a substrate by means of a structured energy filter in a system for ion implantation for the purpose of wafer processing. The implantation method and the dopant distribution or defect distribution in the wafer after processing are shown. What is shown in particular is how the energy of a monoenergetic ion beam is modified as it passes through a microstructured energy filter component, depending on the point where it enters. The resulting energy distribution of the ions leads to a modification of the depth profile of the implanted substance in the substrate matrix. Also illustrated in FIG. 1 is this depth profile, which is rectangular in the example shown here.

FIG. 2 shows a system for ion implantation. This system comprises an implantation chamber, in which several wafers can be arranged on a wafer wheel. The wafer wheel rotates during the implantation, so that the individual wafers repeatedly pass by a beam opening in which the energy filter is arranged and through which the ion beam arrives in the implantation chamber and thus strikes the wafers. The wafer wheel, on which the substrates to be subjected to the implantation are mounted, can be seen on the left in FIG. 2. During processing/-implantation, the wheel is tilted 90° and set in rotation. The ions of the ion beam, indicated in green, thus "write" concentric circles on the wheel. To irradiate the surface of the entire wafer, the wheel is moved vertically during processing. An energy filter mounted in the beam opening can be seen on the right in FIG. 2.

FIG. 3 shows by way of example several layouts or 3-dimensional structures of filters to illustrate the principle of how a large number of different dopant depth profiles can be produced by an appropriate choice of filter. The individual filter profiles shown in FIG. 3 can be combined with each other to obtain additional filter profiles and thus additional dopant depth profiles. Cross sections of the energy filters are shown in each case (on the far left in the figures) as well as top views of the energy filters and curves showing the change in the achieved dopant concentration versus depth (as a function of depth) in the wafer. The "depth" of the wafer is the direction perpendicular to the surface of the wafer into which the ions are implanted. As shown in FIG. 3, (a) triangular prism-shaped structures bring about a rectangular dopant profile; (b) smaller triangular prism-shaped structures produce a rectangular dopant profile extending to a lesser depth than in case (a) (the depth of the profile can therefore be adjusted by selecting the size of the structures); (c) trapezoidal prism-shaped structures produce a rectangular doping profile with a peak at the start of the profile; and (d) pyramidal structures produce a triangular doping profile which increases in height with increasing depth in the substrate.

For many reasons, the energy filters (implantation filters) or energy filter elements known in the past are not adapted to the achievement of high throughputs, i.e., many wafers per hour. It is desirable in particular to have high wafer throughputs per hour, ease of handling, ease of production, and the realization of any desired profile shapes. Static or movably mounted filters which are produced monolithically, i.e., from a solid block of material, and which are mounted individually in the ion beam are known from the literature [2], [3], [4], [5], [6], [7], [8], [9], [10]. In contrast to silicon, the shape of doped regions in SiC wafers cannot generally be changed by the outward diffusion of dopant profiles [2], [4], [5], [6]. The reason for this lies in the very small diffusion constants—even at high temperatures—of the common dopants such as Al, B, N, and P. These diffusion constants are many orders of magnitude below the comparison values for silicon, for example. For this reason, it has not been possible until now to realize doped regions economically, especially those with high aspect ratios, i.e., a small ratio of base surface area to depth.

Dopant depth profiles in semiconductor wafers can be produced by in-situ doping during epitactic deposition or by (masked) monoenergetic ion implantation. In the case of in-situ doping, high levels of imprecision can occur. Even in the case of homogeneous dopant profiles, the nature of the process means that significant deviations from the ideal doping are to be expected on the wafer, i.e., from the middle to the edge. For gradient depth profiles, this imprecision also extends to the vertical direction of the doped region, because now the local dopant concentration depends on a large number of process parameters such as, for example, temperature, local dopant gas concentration, topology, thickness of the Prandtl boundary layer, growth rate, etc. The use of monoenergetic ion beams means that many separate implantations must be carried out to obtain dopant profiles with acceptable vertical waviness. This approach can be scaled only to a certain extent, and it very quickly becomes economically unfeasible.

Examples of the invention relate to the configuration of an energy filter element for ion implantation systems which makes it possible to meet the requirements on the use of an energy filter element in the industrial production of semiconductor components, especially components based on SiC semiconductor material. With respect to the use of energy filter elements, production conditions are defined by the following aspects, for example:

1. Technical Ease of Filter Replacement

In a productive environment, i.e., in a factory, production is carried out even on ion implanters by industrial workers ("operators"), who in most cases are not trained engineers.

The energy filter is an extremely fragile microstructured membrane, which is difficult to handle without destroying it. So that this filter technology can be used economically, it should be guaranteed that, after a short period of instruction, even non-professionals (i.e., non-engineers) are able to replace the filter as if it were a tool which has become worn or to exchange it for another one in the implantation system.

2. Any Desired Vertical Profile Shapes

Novel semiconductor components such as superjunction components or optimized diode structures require a nonuniform doping curve. The simple energy filters described in [1-6], however, produce only constant profiles. Complicated filter structures such as those described in Rub [8] are technically very elaborate and difficult to realize according to the state of the art for production methods. The goal is to realize complicated vertical profile shapes by the use of uncomplicated, i.e., easy-to-produce, filter structures.

3. High-Throughput—Cooling Systems in Combination with Filter Movement

Production conditions mean, for example, that typically more than 20-30 wafers with a 6″ diameter at a fluence per wafer of approximately $2 \times 10^{13}$ cm$^{-2}$ should be produced per hour on ion implanters (typical terminal voltage on tandem accelerators>1 MV to 6 MV). So that the required number of wafers can be produced in this situation, ion currents of more than 1 pµA up to several 10 pµA must be used; or powers of more than several watts, e.g., 6 W/cm$^2$ must be deposited on the filter (typical surface area 1-2 cm$^2$). This causes the filter to heat up. The problem is to cool the filter by appropriate measures.

4. Simple, Low-Cost Production of the Filter Structures for Obtaining Homogeneous, Uniform Depth Profiles Filter structures can be produced by anisotropic, wet-chemical etching. In the simplest form, the filter structures consist of suitably dimensioned, long triangular lamellae (e.g., 6 µm high, spaced 8.4 µm apart, length of a few millimeters), which are arranged periodically on the thinnest possible membrane. The production of triangular lamellae with sharp points is cost-intensive, because the wet-chemical anisotropic etching must be adjusted precisely. Sharp points, i.e., non-trapezoidal lamellae, are costly, because etching rates and etching times must be precisely coordinated with each other to obtain the pointed lamellae. In practice, this leads to a great deal of process control work during etching; and, as a result of the nonuniform processing to be expected during etching (etching rates of wet-chemical processes are never perfectly reproducible and are never homogeneous over larger areas) on a chip with many hundreds of lamellae, it leads to loss of yield, i.e., imperfectly structured filter elements. The goal is to realize a simple and low-cost method for energy filter production.

5. High Lateral Homogeneity of the Produced Dopant or Defect Region

The energy filters for ion implantation described in the previously cited documents [2], [3], [4], [5], [6], [7], [8], [9], [10] have an internal 3-dimensional structure, which leads to differences in the distances traveled by the ions as they pass through the filter. These differences in travel distance—depending on the stopping power of the filter material—produce a modification of the kinetic energy of the transmitted ions. A monoenergetic ion beam is therefore converted into a beam consisting of ions with different kinetic energies. The energy distribution is determined by the geometry and materials of the filter; i.e., the filter structure is transferred into the substrate by ion lithography.

6. Monitoring the "End of Life" of the Energy Filter

Because of the nuclear interaction of the ion beams with the filter material and because of the thermal load, a typical service life of the filter results specifically for each ion implantation process with an energy filter. For an energy filter of silicon with a support layer thickness of approximately 2 µm, regular prong structures on the order of 8 µm, and an implantation process at 12 MeV nitrogen with currents of around 0.1 pµA, the maximum production quantity is approximately 100 wafers (6").

For the sake of the machine operator and for the security of the filter manufacturer, the total number of wafers processed with a specific filter should be monitored.

7. Limitation of the Angular Distribution of the Transmitted Ions

For the production of masked dopant regions, i.e., regions with limited lateral dimensions, especially in cases of high aspect ratios, the angular spectrum of the transmitted ions must be limited to avoid the implantation of ions under the masking layer.

8. Minimizing Filter Wear caused by Sputtering Effects

9. Avoidance of Channeling Effects (Lattice Guidance Effects) through the Arrangement of the Filter Relative to the Ion Beam 10. Realization of Complex Dopant Depth Profiles by Means of Simple Filter Geometry 11. Electron Suppression during Use of the Filter It is known that, during the transmission of ions through a solid body, the electrical charge of the ions assumes an equilibrium state. Electrons of the primary beam can be given off to the solid or accepted from it. I.e., the transmitted ions, depending on the properties of the filter material and the primary energy, have, after passage through the filter, on average a higher or lower charge state [26]. This can lead to a positive or negative charging of the filter. At the same time, secondary electrons of high kinetic energy can be produced by ion bombardment of the front or the back side of the filter.

At high current densities such as those required in industrial production, the energy filter will heat up (see FIG. 6.5.24). Because of the thermionic electron emission (Richardson-Dushman law), thermal electrons are produced as a function of the temperature and the work function of the filter material.

The distance (in the high vacuum) of the ion accelerator between the filter and the substrate is typically only a few centimeters or less. That is, the diffusion of thermal electrons (from thermionic emission) and the action of fast electrons (from the ion bombardment) falsify the measurement of the ion current at the substrate by means of, for example, a Faraday cup installed there.

12. Alternative Production Methods by Injection Molding, Casting, or Sintering

In publications [2]-[15], the methods of microtechnology are proposed for the production of the energy filter. It is described in particular that, for the production of the filters, lithographic methods be used in combination with wet-chemical or dry-chemical etching. For filter production, anisotropic wet-chemical etching methods by means of alkaline etchants (e.g., KOH or TMAH) in silicon are preferred.

In the case of filters produced by the last-mentioned method, the functional filter layer is produced from monocrystalline silicon. It must therefore always be assumed that, when one is bombarding with high-energy ions, channeling effects will in principle influence the effective energy loss in the filter layer in a difficult-to-control manner.

13. Arrangement for Irradiating a Static Substrate

An irradiation arrangement is to be used which makes it possible to irradiate a static substance under energy filtration with high lateral homogeneity over the entire surface of the substrate. Reason: End stations of irradiation systems frequently do not have the full mechanical ability to scan the entire wafer (wafer wheel) with a punctiform or nearly punctiform beam spot. On the contrary, many systems have an electrostatically expanded beam (=stripe in the x direction), which, for example, scans the wafer electrostatically (y direction). In some cases, partially mechanical scanners are used. I.e., the beam is expanded in the x direction, and the wafer is (slowly) moved mechanically in the y direction.

14. Arrangement for Taking Advantage of a Large Filter Surface

An irradiation arrangement must be used which makes it possible to irradiate a static or movable substrate under energy filtration with high lateral homogeneity over the entire surface of the substrate and to do so over a large filter surface. This makes it possible to lessen thermal effects and degradation effects in the filter.

15. Modification of the Doping Profile in the Substrate by Means of a Sacrificial Layer The energy filter is a tool for manipulating the doping profile in the substrate. For certain requirements, it desirable for the doping profile which can be produced in the substrate to be manipulated AFTER the energy filter. i.e., at a location downstream from the energy filter. In particular, it is desirable to "push" the near-surface beginning of the doping profile away from the substrate. This can be advantageous especially when the beginning of the dopant profile in the substrate cannot be adjusted correctly by the filter, for various reasons (especially a loss of ions through scattering). Such a doping profile manipulation after the energy filter can be achieved by implantation into a sacrificial layer on the substrate.

16. Lateral Modification of the Doping Profile in the Substrate by Means of a Sacrificial Layer For certain applications it is desirable for the doping profile in the substrate to show lateral variations. In particular, changes in the implantation depth of a homogeneous doping profile could be used advantageously for edge terminations in semiconductor components. Such lateral adjustment of the doping profile can be achieved by providing, on the substrate, a sacrificial layer with lateral thickness variations.

17. Adaptation of a Profile Transition between Several Implantation Profiles

For certain applications, it is desirable to join two or more profiles to each other along a "seam" at a certain depth, because otherwise there will be insulation between the layers. This problem occurs in a layer system especially when the lower end of an upper doping profile or the upper end of the doping profile underneath comprises a slowly tapering concentration "tail".

18. Special Arrangement of the Multifilter Concept for Coupled Oscillating Movements If the multifilter is attached to the part of a movable substrate chamber which can move linearly back and forth in front of the beam (e.g., in the case of a rotating wafer disk, with a vertical scan direction), the multifilter can be easily moved relative to the beam simply by moving the substrate chamber. By means of a magnetic or static scanning device which scans in one direction in front of the filter, use can be made of a very large multifilter surface, which is equal, for example, to the product of the vertical oscillation distance times the horizontal scan distance. The movements of the wafer and of the filter are coupled in this arrangement, which can lead to problems with respect to the lateral homogeneity of the doping. Through the rotation of the wafer wheel, the ion beam "writes" lines on the wafer. As a consequence of the above-mentioned arrangement, the position of a horizontal irradiated line on the wafer, for example, is coupled to a certain vertical position on the multifilter. A gap between individual filter elements would, for example, result in an inhomogeneously doped line on the wafer. An arrangement of the filter components in the multifilter must therefore be selected so that the lateral homogeneity is ensured in spite of the coupling of the linear movements of filter and substrate.

Examples of energy filters, of implantation devices, or of parts of implantation devices which meet the previously mentioned production conditions are explained in the following. It should be mentioned that the measures and concepts explained below can be combined with each other in any way desired, but each of them can also be applied individually, in itself.

Point 1: Technical Ease of Filter Replacement

It is proposed that a frame, which makes it easy to handle the implantation filter, be installed on the filter in question, which is referred to in the following as the "filter chip". As shown in FIGS. 4-6, this frame can be configured in such a way that it can be used on the ion implantation system in a previously installed frame holder of the proper size. The frame protects the energy filter, allows ease of handling, and takes care of electrical and thermal dissipation and/or electrical insulation (see FIG. 36). The frame can be provided with the filter chip by the manufacturer of the filter elements in a dust-free environment and delivered in dust-free packaging to the ion implantation system.

FIGS. 4 and 5 show an example of the geometric and mechanical configuration of a filter frame. The filter held by it can have any desired surface structure, which is selected in accordance with the desired doping profile to be obtained with it. The filter holder and/or the filter frame can be provided with a coating which prevents material from being abraded from the filter frame and filter holder.

The filter frame and filter holder can be made out of metal, preferably high-grade steel or the like. During the implantation process, sputtering effects in the local environment of the energy filter caused by scattered ions must be expected. That is, it must be expected that material at and near the surface of the frame and filter will be carried away. Metal contaminations on the substrate wafer could be the undesirable consequence. The coating prevents such contamination, wherein the coating consists of a non-contaminating material. What materials are non-contaminating depends on the properties of the target substrate being used. Examples of suitable materials comprise silicon and silicon carbide.

FIG. 4 shows a cross section through a filter frame for holding an energy filter chip. The energy filter chip, which is also shown in FIG. 4, can be attached to the frame in various ways, such as by the use of an adhesive or by a mechanical spring. FIG. 5 shows a top view of a filter frame for holding an energy filter element, which is also shown in FIG. 5. The filter frame comprises a locking element, by means of which the frame can be opened and closed to allow replacement of the filter. FIG. 6 illustrates an example of the installation of a frame for holding an energy filter element in the beam path of an ion implanter. What is shown in the upper part of FIG. 6 is a cross section through the chamber wall and the filter holder arranged therein. In the example, the filter holder is arranged on the inside surface of the chamber wall, i.e., the side which is facing the wafer (not shown) during the implantation process. The ion beam which, during the implantation process, passes through the opening in the chamber wall and through the filter arranged in front of the opening, is also indicated schematically in FIG. 6. The frame with the filter chip inserted into the filter holder covers the opening in the chamber wall through which the ion beam passes during the implantation process. This is shown in the lower part of FIG. 6, which shows a front view of the chamber wall with the filter holder attached to it.

The frame can consist of the same material as the filter. In this case, the frame can be produced monolithically together with filter and can thus be called a "monolithic frame". As explained above, the frame can also be made of a material different from that of the filter, such as a metal. In this case, the filter can be inserted into the frame. According to another example, the frame comprises a monolithic frame and at least one additional frame of a material different from that of the filter, which is attached to the monolithic frame. This additional frame is, for example, a metal frame.

The frame can completely surround the filter, as explained and shown above, and as shown on the right in FIG. 7. According to additional examples, the frame does not form the boundary on all (four) sides (edges) of the filter but rather forms the boundary on only three, two (opposite), or only one of the edges of the filter. The term "frame" is therefore to be understood in connection with this description as a solid frame, which completely surrounds the filter on all sides (edge), and also as a partial frame, which extends only around some of the sides of the filter. Examples of such partial frames are also shown in FIG. 7. FIG. 7 therefore shows various partial frames (on the left in the figure) and a complete frame (on the far right in the figure). Each of these frames can consist of the same material (e.g., monolithic) as the energy filter or of a different material.

The energy filter or any other scattering element can be mounted in the beam path of the implanter in various ways by its frame, which can be realized according to one of the above-explained examples. The above-explained insertion of the frame into a filter holder is only one of several possibilities. Additional possibilities are explained below.

According to one example, illustrated in FIG. 8, the frame can be mounted on the chamber wall by means of at least one bar. In this case, the at least one bar serves as the filter holder. What are shown in FIG. 8 are examples of mountings by means of only one bar, by means of two bars, and by means of three bars. It is obvious that more than three bars can also be provided.

According to another example, shown in FIG. 9, the frame can also be attached to the chamber wall by suspension brackets or suspension elements. These suspension elements are flexible, for example, and can be installed between the frame and chamber wall in such a way that the frame is held firmly in position. The suspension elements act in this example as the filter holder. FIG. 9 shows examples of attachments with only one suspension element, with two suspension elements, and with three suspension elements. Of course, more than three suspension elements can also be provided.

According to another example, shown in FIG. 10, the frame with the filter is held by magnets in a floating (contactless) manner. For this purpose, the magnets are attached to a front side and a back side of the frame and to the chamber wall in such a way that, in each case, a magnet on the chamber wall or on a holder attached to the chamber wall is opposite a magnet on the frame, wherein the facing poles of opposing magnets are of opposite polarity. As a result of the magnetic forces, the frame floats between the magnets attached to the chamber wall and the magnets attached to the holder. The magnets on the frame of the filter can, for example, be realized by thermal vapor deposition or any other layer-forming method.

Point 2. Any desired Vertical Profile Shapes

In principle, the geometric configuration of an energy filter for ion implantation systems can make it possible to realize any desired doping profile in a semiconductor material. For complex profiles, this means that it is necessary to produce geometrically very demanding 3-dimensional etched structures of different sizes and possibly of different heights such as pyramids, pits with a defined wall slope, inverse pyramids, etc., on the same filter chip.

It is proposed that rectangular profile shapes such as those which can be produced by simple triangular structures (multifilter) be used to approximate any desired profile. Under certain conditions, it is also possible to use non-triangular structures (e.g., pyramids) as basic elements for the approximation.

That is, it is proposed that a desired doping profile be broken down into box profiles, for example, and that a triangular filter structure be produced for each box profile. Then the individual filter chips are mounted in, for example, the frame shown in FIG. 6.5.1 in such a way that the area weighting corresponds to the dopant concentration appropriate to the box profile element in question. See FIG. 6.5.4.

The breakdown of a dopant depth profile is not limited to the triangular structures shown here. On the contrary, it can comprise additional structures, which in the most general case contain ramps or even convexly or concavely rising flanks. The flanks do not necessarily have to rise monotonically, but they can also contain valleys and depressions. Binary structures with flank angles of 90° are also conceivable.

In one example, the filter elements are cut with a bevel and arranged directly next to each other. The beveled cut has the advantage that there is no need for an adhesive bond between the filters to block off ions at the filter edge. In addition, it is possible in this way to make optimal use of the irradiated surface. For the same total filter dimensions and a given ion current, this has the effect of increasing wafer throughput.

FIG. 11 illustrates an example of a simple realization of a multifilter. In the example, three differently shaped filter elements are combined in a frame of the filter holder to form a complete energy filter. At the top left in FIG. 11 is a cross section through the filter holder with the three filter elements, and at the bottom left in FIG. 11 is a top view of the filter holder with the three filter elements. On the right in FIG. 11 is a filter profile which can be obtained with the combined filter. When this filter is used as an implantation filter, the ion beam passes over all of the individual filter elements uniformly, so that the dopant depth profile shown on the right in FIG. 11 is produced. This profile contains three depth profiles, numbered 1, 2, 3. Each of these depth profiles results from one of the three subfilters shown on the left, namely, from the subfilter identified by the same number.

FIG. 12 illustrates by way of example the way in which three different filter elements, which can be combined into a multifilter, function. The figure shows cross sections through each of the individual filter elements, examples of dimensions for these filter elements, and doping profiles such as those which can be obtained by means of the individual filter elements. In FIG. 12, only the dimensions are given for a fourth filter element (not shown) by way of example. The weighting, i.e., the resulting concentration or the doping profile, can be adjusted by varying the dimensions of the surface areas of the individual filter elements. For this example, it is assumed that the filter and the substrate have the same energy-dependent stopping power, although this does not necessarily have to be the case. FIG. 13 shows an example of a doping profile which can be obtained when the four filter elements explained on the basis of FIG. 12 are combined into a multifilter and used for implantation. This summation profile results from the addition of the filter elements weighted over the surface in question. It is assumed for the diagram that the filter elements described on the basis of FIG. 12 are assembled with appropriate weighting to form a complete filter and are uniformly exposed to an ion beam of appropriate primary energy, so that the summation profile shown is obtained.

In the example explained on the basis of FIG. 11, the individual filter elements of the multifilter are separated from each other by webs of the frame. According to another example, shown in FIG. 14, the individual filter elements can also be directly adjacent to each other. FIG. 14 shows a cross section through a multifilter comprising several adjacent filter elements F1, F2, F3. The multifilter is inserted into a filter frame. The individual filter elements F1, F2, F3 are cut with a bevel in this example and arranged directly next to each other.

Point 3. High-throughput—Cooling Systems in Combination with Filter Movement

A high wafer throughput for given target dopings can be realized only by means of high ion currents. Because between about 20% to about 99% of the primary energy of the ion beam is deposited in the filter membrane, i.e., the part of the implantation filter through which the beam passes, the use of a cooling method is proposed as a way of preventing an excessive rise in the temperature of the filter even at high ion currents.

Cooling of this type can be done by means of, for example, one or more of the following measures a. to c. explained below.

a. Coolant Flow in the Filter Holder

By this means, the heated filter chip is cooled by the dissipation of heat. FIG. 15 shows an example of a cooled filter holder of this type. What is shown in particular is a cross section through a filter holder, which is attached to a chamber wall of an implanter. In this example, coolant lines are integrated into the filter holder, which accepts the filter frame. Liquid coolant is supplied to these coolant lines by an external cooling device (not shown). Alternatively or in addition, the coolant lines can also be arranged on the surface of the filter holder (not shown).

b. Movement of the Filter or Ion Beam

It is proposed that, when a rotating wafer wheel loaded with 10-15 wafers, for example, is used, the filter or the filter holder be configured in such a way that it rotates or oscillates with a linear movement. Alternatively, the ion beam can be moved electrostatically over the filter while the filter remains stationary.

In these variants, the filter is irradiated only partially by the ion beam per unit time. As a result, the part of the filter not being irradiated at a particular moment can cool by radiative cooling. Thus it is possible to realize higher average current densities for a given filter under continuous use conditions. Examples of how this can be realized are shown in FIGS. 16 and 17.

FIG. 16 illustrates an energy filter with a relative large surface area, which is only partially irradiated per unit time. Thus the unirradiated regions can cool by radiative cooling. This embodiment is also configurable as a multifilter as described above, i.e. as a filter which comprises several different filter elements. In the example shown, the frame with the filter oscillates in a direction perpendicular to the direction of the ion beam, which is indicated schematically. The area of the filter covered by the ion beam is smaller than the total area of the filter, so that, per unit time, only a portion of the filter is irradiated. This part changes continuously as a result of the oscillating movement.

FIG. 17 shows an example of a filter arrangement with several filter elements, which are supported by a rotating filter holder. Each of the individual filter elements can be structured in the same way, but they can also have different structures in order to obtain a multifilter. As shown in FIG. 17, the individual filter elements traverse a circular path around the rotational axis (central axis) of the holder as the holder rotates. In this example as well, only partial irradiation occurs per unit time; i.e., not all of the filter elements are irradiated simultaneously, so that the unirradiated filter elements can cool.

Point 4. Simplified Filter Design

The production of filter elements with prong structures of an exact height and with perfect sharp points is demanding in terms of processing technology and correspondingly expensive.

For simple doping curves (e.g., homogeneous doping), which start from the surface of the substrate and require only a simple prong structure, a simplified design and, in association with that, a simplified production process are to be proposed here.

It is proposed that the microstructured membrane (e.g., prong structure) of the filter be configured with a plateau on the prongs instead of sharp points, and that the thickness of the support layer of the membrane be dimensioned in such a way that the low-energy dopant peak being formed is pushed into the support layer of the filter and thus is not implanted in the substrate. An example of a filter of this type is shown in FIG. 18. A cross section (on the left in the figure), a top view (middle), and an example of a doping profile obtainable by the use of the illustrated filter are shown. As illustrated, a rectangular profile can be produced in the substrate by implantation of ions into the energy filter through the use of a trapezoidal prism-shaped structure. The peak at the beginning is implanted in the energy filter; i.e., there is no peak of the dopant profile present within the substrate. This implantation profile has the advantageous property that it begins directly at the surface of the substrate, which can be of crucial importance for the application of the energy filter.

As can be seen from the cross section of the filter in FIG. 18, this filter structure comprises plateaus instead of sharp points. The individual structural elements are therefore trapezoidal in cross section. This greatly simplifies the process technology required to realize the filter. It is known that triangular structures can be produced in silicon by means of, for example, wet-chemical etching with KOH or TMAH. For this purpose, it is necessary for the tips of the triangles to be masked lithographically. If perfect tips are to be produced, this leads to the problem that the etching can penetrate underneath the lacquer or hard mask structure. Without the idea proposed here, this problem can be solved only by perfect (and thus complicated, cost-intensive) processing. The idea proposed here thus simplifies the production of the filter structures quite significantly. The same is true analogously for modern plasma-supported etching methods such as RIBE (Reactive Ion Beam Etching) or CAIBE (Chemically Assisted Ion Beam Etching).

Point 5. High Lateral Homogeneity of the Produced Doped or Defect Region

The aspect of lateral homogeneity can be significant in static implantation situations. When a rotating wafer disk (wafer wheel) is used with, for example, eleven wafers and a stationary ion beam, the homogeneity is determined by the rotational and translational movement of the wafer disk relative to the ion beam.

Filter-substrate distance: The angular distribution of the transmitted ions is energy-dependent. If the filter and the energy of the ions are coordinated with each other in such a way that, inter alia, very low-energy ions (nuclear stopping regime) leave the filter, then there is a wide angular distribution, because large-angle scattering events occur. If the filter and the energy of the ions are coordinated in such a way that only high-energy ions (only in the electronic regime, $dE/dx_{electron} > dE/dx_{nuclear}$) leave the filter, the angular distribution is very narrow.

A minimum distance is characterized in that the structure of the filter is not transferred to the substrate. I.e., for example, for a given distribution of the scattering angles of the transmitted ions, these ions pass over a lateral distance at least comparable to the period of the lattice constant of the ion filter.

A maximum distance is determined by the loss of scattered ions which can still be tolerated by the application for a given distribution of the scattering angles, especially at the edge of the semiconductor wafer.

FIG. 19 shows the result of an experiment in which ions were implanted through an energy filter during a static implantation into a PMMA (polymethyl acrylate) substrate. The ions destroy the molecular structure of the PMMA, so that a subsequent development process reveals the energy distribution of the ions by dissolving regions of high energy deposition. Regions of lower energy deposition or without any energy deposition by ions are not dissolved by the developer solution.

The idea proposed here is to produce high lateral doping homogeneity by choosing the correct the filter-substrate distance both for dynamic and static implantation arrangements.

Point 6. Monitoring the "End of Life" of the Energy Filter

Because of nuclear interaction and the pronounced temperature changes (heating of the filter typically to several 100° C.), energy filters degrade as a function of the accumulated implanted ion dose.

Once a critical ion dose is reached, the chemical composition, density, and geometry of the filter are changed in such a way that the effects on the target profile to be realized can no longer be ignored. The critical ion dose depends on the filter material being used, the implanted ion species, the energy, the geometry, and the allowed range of variation (=specification) of the target profile.

For each filter implantation process with a given energy, ion species, profile, etc., a specification which contains a maximum temperature during the implantation and a maximum allowed accumulated ion dose can therefore be defined. According to one example, it is provided that the use of the energy filter is monitored in such a way that the filter cannot be used outside the specified tolerances, even when it is not being monitored by an engineer. For this purpose it is proposed that each filter be detected on the basis of an electronically readable signature as soon as the filter is inserted into the filter holder on the implanter, and that this signature be read by means of, for example, a control computer. The signature is for this purpose stored in an electronically readable memory arranged on the filter. A database stores, for example, the signatures of the filters which can be used on a certain implanter and their properties, such as the process to which the filter is adapted (ion species, energy), and what accumulated dose and what maximum temperature are allowed to be reached. By reading out the signature and comparing it with the information in the database, the control computer can thus determine whether the filter is appropriate for a planned implantation process.

FIG. 20 shows a monitoring system for identifying filters and for monitoring compliance with the filter specification (maximum temperature, maximum accumulated ion dose). Once the filter has been identified by the built-in sensors (charge integrator and temperature sensor), the accumulated dose and the temperature of the filter, for example, are measured continuously. The implantation process is terminated when one of the specified parameters is reached or exceeded, i.e., when the filter, for example, has become too hot or when the maximum allowable dose has been implanted through the filter. That is, when a certain value no longer meets the specification, a signal is transmitted to the control computer, which terminates the implantation process.

Point 7. Limitation of the Angular Distribution of the Transmitted Ions

For applications which require blank regions on the target substrate, masking material can be applied to the target substrate.

To avoid a lateral "blurring" of the structures by a filter-induced, overly broad ion distribution, it is proposed that the ion beam transmitted through the filter be collimated. The collimation can be accomplished by strip-like, tubular, lattice-like, or hexagonally shaped structures with high aspect ratios, which are arranged in the transmitted beam after the energy filter. The aspect ratio of these structures defines the allowed maximum angle.

Various examples are illustrated in FIGS. 21-25. FIG. 21 shows a cross section through an implanter chamber wall in the area of the beam opening, a filter holder with an inserted filter fastened to the chamber wall, and a collimator, which, in this example, is attached to the side of the filter holder facing away from the chamber wall. The aspect ratio of the collimator, which is determined by the length and the width of the collimator, determines the maximum angle $\alpha$, relative to the lengthwise direction of the collimator, at which the ion beam can be sent into the collimator and still pass through the collimator. Segments of the ion beam which are beamed in at relatively large angles strike the wall of the collimator and therefore do not pass through it. If the distance available between the filter and substrate into which the ions are to be implanted is not sufficient for a desired aspect ratio, the collimator can also consist of several collimator units with smaller openings arranged next to each other. They can be arranged in, for example, a honeycomb pattern.

Alternatively, the collimator structure can also be arranged directly on the filter element. An element of this type can be produced as a monolith or by means of microbonding methods. Two examples of a collimator structure arranged directly on the filter are shown in FIG. 22. A collimator structure of this type arranged directly on the filter can mechanically stabilize the filter and also have a cooling effect, because the collimator structure can act as a cooling body with a surface area larger than the surface area of the filter. The maximum angle $\alpha$ is defined here, too, by the aspect ratio of the individual collimator structures arranged on the filter, each of which comprises a length and a width. The collimator structure can be attached to the filter by the use of an adhesive, for example, by bonding, or by some similar method.

In the example shown in FIG. 22, the collimator structure is arranged on the structured side of the filter, that is, where the filter has elevations and depressions. The structures are trapezoidal in this example. FIG. 23 shows a modification of the arrangement of FIG. 22. In this example, the collimator surface is arranged on the unstructured side of the filter. In both cases, the collimator structure is arranged downstream from the filter with respect to the direction of the ion beam (symbolized in FIGS. 21 and 22 by the arrow), and therefore in such a way that the ion beam passes through the collimator structure only after passing through the filter.

FIG. 24 shows top views of collimator structures according to various examples. In the examples shown, this collimator structure is arranged on a filter which has a lamellar structure when viewed from above. The individual "filter lamellae" can be, for example, triangular or trapezoidal in cross section, as already explained above. A lamellar structure of the filter, however, is only one example. Any other type of filter structure as previously explained can also be used. On the left and in the middle, FIG. 24 shows an example in which the collimator structure is configured in strip-like fashion; i.e., it comprises several parallel strips, each of which extends over the entire width of the filter. Each pair of adjacent strips forms a collimator, wherein the width of this collimator is determined by the distance between the adjacent strips. The length of the collimator is determined by the height of the individual strips. The "height" of the strips is their dimension in a direction perpendicular to the plane of the drawing. The strips of the collimator structure can be perpendicular to the lamellae of the filter, as shown on the left in FIG. 24, or they can be parallel to the lamellae, as shown in the middle. On the right in FIG. 24 is an example in which the collimator structure appears as a lattice in a top view, as a result of which a plurality of collimators is formed, the geometry of which is determined by the geometry of the lattice. In the example shown, the individual collimators are rectangular, in particular square, in a top view, so that the collimators are in the form of rectangular tubes. This is only an example, however; the lattice can also be realized in such a way that the individual collimators are circular, elliptical, or hexagonal (honeycomb-like) in a top view or have any other desired polygonal geometry.

Collimation by a Hard Mask on the Target Substrate

For masked implantations, it is possible, as an alternative or in addition to a collimator on the filter, to apply masking to the target wafer to act as a collimator structure. A condition for this masking can be that the stopping power of the masking must correspond at least to the average range of the transmitted ion beam in the target substrate material. So that the required limitation on the angular distribution can also be achieved by means of the masking, the aspect ratio of the masking can be adapted accordingly. FIG. 25 shows an example of a collimator structure of this type, which is arranged directly on the target substrate. This collimator structure can have any one of the previously explained geometries; it can therefore be, for example, lamellar, strip-like, tubular, or honeycomb-like—depending on the layout of the substrate structure and the required maximum angular distribution. The aspect ratio of this collimator structure is the ratio of the height (h in FIG. 25) to the width (b in FIG. 25) of the blank areas of the mask on the substrate forming the collimator structure.

It has been found that the collimator structure influences not only the scattering in the lateral direction but also the depth profile. This is shown in FIG. 26, which illustrates the doping profiles for three different implantation methods, each of which was conducted with the same filter but with different collimator structures. In the example, each filter has a lamellar structure with a trapezoidal cross section. This is only an example, however. On the left in the figure, an implantation method is shown in which implantation is carried out without a collimator structure. The implantation profile thus obtained begins at the surface of the substrate.

In the middle and on the right in FIG. 26, implantation methods are illustrated in which implantations are carried out with collimator structures, wherein the aspect ratio of the collimator structure in the case of the example on the right is higher than in the case of the example in the middle. As can be seen, the doping profiles obtained by these implantation methods do not begin at the surface of the substrate but rather a certain distance away from it, wherein, the higher the aspect ratio, the farther the doping profiles are from the surface and the flatter their ascent. The explanation for this is that the dopant profile in the near-surface area of the substrate is caused by ions which are more strongly stopped in the filter and thus have a lower energy. Such ions with low energy are scattered more strongly by the filter than ions with higher energy, so that these ions of lower energy have a wider angular distribution than higher-energy ions. Thus the number of low-energy ions which can pass through the collimator structure is smaller than the number of higher-energy ions, wherein the greater the aspect ratio of the collimator structure, the more pronounced the effect, i.e., the smaller the allowable maximum angle at which the ions can still pass through the collimator structure.

So that, in spite of the collimator structure, a nearly homogeneous doping profile can be produced starting from the surface, the filter can be designed so that low-energy ions are "preferred". That is, more low-energy ions than higher-energy ions pass through the filter. An example of this type of filter is shown in FIG. 27. In this example, the filter has different filter regions, each of which has a maximum and a minimum thickness. The maximum thickness is the same in all three regions, but the minimum thickness differs. This is achieved in the example in that the filter has, in each of the individual regions, a trapezoidal structure arranged on a base, wherein the bases have different heights or thicknesses, and thus the trapezoidal structures are of different heights. In a first section, the base is the thinnest, and the trapezoidal structure is the highest, as a result of which the distance CD1 between adjacent structures is the greatest in this section. In a third section, the base has the greatest thickness, and the trapezoidal structure is the lowest, as a result of which the distance CD3 between adjacent structures is the smallest in this section. In a second section, the thickness of the base is between the thickness of the first section and the thickness of the third section. Correspondingly, the height of the trapezoidal structure in this section is between the height of the first section and the height of the third section, and the distance CD2 between adjacent structures is, in this section, between the distance CD1 in the first section and the distance CD3 in the third section. The individual sections can be of the same size in terms of their surface area, but they can also differ in size. It is also obvious that more than three sections with different minimum filter thicknesses can be provided.

FIG. 27 shows on the left an implantation profile obtained by implantation with the filter just described when implantation is carried out without a collimator structure. This implantation profile begins at the surface, but the doping concentration decreases in a stepwise manner with increasing depth. In this figure, CD1 designates a region of the doping profile which is attributable to the first section of the filter; CD2 designates a region of the doping profile attributable to the second section of the filter; and CD3 designates a region of the doping profile attributable to the third section of the filter. It can be seen on the basis of the doping profile that, the greater the minimum thickness of the base of the associated section, the less deeply the ions passing through the filter region in question penetrate into the substrate, i.e., the lower their energy. The doping profile also shows that more low-energy ions pass through this filter than high-energy ions. Because, as explained above, the low-energy ions are scattered more strongly than the high-energy ions and thus fewer low-energy ions pass through a collimator structure than higher-energy ions do, a nearly homogeneous doping profile beginning at the surface can be obtained by the use of such a filter in combination with a collimator structure. This is shown on the right in FIG. 27, where an implantation method using the explained filter and a collimator structure is shown. The collimator structure in this example is located on the substrate, but it could also be arranged on the filter.

Point 8. Less Filter Wear Caused by Sputtering Effects

Implantation arrangement of the filter relative to the substrate: in one case the prongs face the substrate, in the other case the prongs face away from the substrate(→sputtering, scattering on impact). During the previously explained implantation methods and those to be explained below, the filter can be used in each case in such a way that the microstructures of the filter are facing the substrate, i.e., are pointing away from the ion beam, as shown in FIG. 28(*a*). Alternatively, the filter can also be rotated, so that the microstructures of the filter are facing away from the substrate, i.e., are facing toward the ion beam, as shown in FIG. 28(*b*). The latter can have an advantageous influence on sputtering effects.

Point 9. Avoidance of Channeling Through the Arrangement of the Filter Relative to the Ion Beam Tilting of the Filter and/or of the Substrate Insofar as the filter and/or the substrate consists of crystalline material, undesirable channeling effects can occur. That is, ions can achieve increased range along certain crystal directions. The magnitude of the effect and the acceptance angle are functions of temperature and energy. The implantation angle and the crystallographic surface orientation of the starting material used for the filter and the substrate play a crucial role. In general, the channeling effect cannot be reproduced with certainty across a wafer, because the above-mentioned parameters can differ from wafer to wafer and from one implantation system to another.

Channeling should therefore be avoided. Tilting the filter and the substrate can prevent channeling. Channeling in the filter or in the substrate can have quite different effects on the depth profile of the implanted dopant, especially when the filter and the substrate consist of different materials.

FIG. 29 shows schematically a filter which is tilted in such a way with respect to the substrate during the implantation process that a base surface of the filter forms an angle with a surface of the substrate which is greater than zero. This angle is, for example, greater than 3°, greater than 5°, or greater than 10° and less than 30°. Especially when the energy filter is fabricated of anisotropic materials, it is possible in this way to prevent or reduce a channeling effect.

Point 10. Realization of Complex Dopant Depth Profiles with a Simple Filter Geometry As explained above, more complex dopant depth profiles can be realized by adapting the geometric design of the filter element. For the sake of simplicity in the following explanations, scattering effects of all types are ignored.

For the case in which the stopping power for ions (dE/dx) is the same in both the filter and the substrate material, situations such as those shown in FIG. 30 by way of example can occur. FIG. 30 shows a schematic diagram of various doping profiles (dopant concentration as a function of depth in the substrate) for energy filters of different designs, each of which is shown in a side and a top view. As illustrated, (a) triangular prism-shaped structures produce a rectangular doping profile; (b) smaller triangular prism-shaped structures produce a less depth-distributed doping profile than the larger triangular prism-shaped structures shown in (a); (c) trapezoidal structures produce a rectangular doping profile with a peak at the start of the profile; and (d) pyramidal structures produce a triangular doping profile which increases in height with increasing depth in the substrate.

When, for example, silicon is used as the substrate material to be doped with boron, for example, and when the energy filter is made of a different material, changes in the dopant depth profile in the substrate are obtained depending on the density and the change in dE/dx of the filter as a function of the actual kinetic ion energy. A perfectly homogeneous, i.e., constant, change in the depthwise doping is achieved only when identical materials are used for both the filter and the substrate. This is illustrated in FIG. 31, in which doping profiles in various substrate materials (target materials) are shown, obtained by identical implantation processes, i.e., implantation processes with the same primary ion and the same primary energy. The filter material was silicon in each case. The doping profiles differ as a result of the different substrate materials.

FIG. 32 illustrates the change in the stopping power as a function of energy [4] (SRIM simulation) for the various substrate materials on which the diagram in FIG. 31 is based.

It is now proposed that, for a given surface geometry, the energy-dependent change in the stopping power be adapted by means of, for example, the design of the filter as a multilayer system.

It is proposed that the change of the stopping power as a function of ion energy (i.e., as a function of the vertical position in a filter prong for a given ion species and primary energy) be modeled in such a way that, overall (i.e., from the entry of the ion into the filter until the end position in the irradiated substrate), the total loss of kinetic energy is obtained, depending on the entry position on the filter (more precisely, on the actual route of the ion through the filter and substrate). The energy loss in the filter is therefore no longer determined only by the irradiated length of the filter material but rather by the location-dependent change in the stopping power.

Thus, with appropriate modeling and a fixed geometry, for example, it is possible to produce doping curves which either rise or fall in the depthwise direction. The stopping power therefore becomes a function of the lateral position. Examples of such filters are shown in FIGS. 33-35. The lateral position in each of these figures is designated "y".

FIG. 33 illustrates a multilayer starting material for a multilayer filter. In this example, the starting material comprises four different layers, designated 1-4. The use of four layers, however, is only an example. Fewer than four or more than four layers could be used. The individual layers can differ not only with respect to the material used but also their thickness. It is also possible for two layers to comprise the same material and be separated by two or more layers of a different material. The individual layers can be deposited or produced sequentially, one on top of another, by suitable deposition methods.

With a suitable configuration of the layered stack of materials with different stopping powers, complex dopant depth profiles can be realized even with a simple filter geometry. FIG. 34 shows a cross section through a filter which was realized on the basis of the starting material produced in FIG. 33 and which, in the example shown, comprises a base and triangular structures arranged on the base. These triangular structures can be in the form of strips, i.e., they can extend in a direction perpendicular to the plane of the drawing, or they can be part of pyramidal structures.

As shown in FIG. 35, the filter can also be realized in such a way that several structures are arranged next to each other in the lateral direction (y direction), these structures comprising different geometries and/or different layered stacks, i.e., layered stacks with a different construction with respect to the sequence of individual layers and/or of the material of the individual layers. For example, six different materials are used in the filter shown, these layers being designated 1-6.

Silicon, silicon compounds, or metals, for example, are suitable as materials for the individual layers, although the choice is not limited to such materials. Silicon compounds include, for example, silicon carbide (SiC), silicon dioxide ($SiO_2$), and silicon nitride (SiN). Suitable metals include, for example, copper, gold, platinum, nickel, and aluminum. According to one example, at least one layer of a silicon compound is grown on a silicon layer, and a metal layer is deposited from the vapor phase on the at least one layer of the silicon compound. A metal layer can also be vapor-deposited directly onto a silicon layer. The possibility also exists of producing various metal layers on top of each other by vapor deposition so as to obtain a filter with different layers.

Point 11. Electron Suppression

It is known that, during the transmission of ions through a solid, electrons of the primary beam remain in the solid or are taken up by the ion. I.e., depending on the properties of the filter material and the primary energy, the transmitted ions have, after passage through the filter, on average a higher or lower charge state [26]. Electrons are given up to the filter or accepted.

FIG. 36 shows the equilibrium charge states of an ion (black line: Thomas-Fermi estimate, blue line: Monte-Carlo simulations; red line: experimental results) as a function of the kinetic energy of the ion on irradiation of a thin membrane. Ion: sulfur. Membrane: carbon [27].

As a result of ion bombardment, it is possible for secondary electrons with high kinetic energy to be produced on both the front and back sides of the filter simultaneously. At high current densities such as those required in industrial production, the energy filter will heat up. As a result of thermionic electron emission (Richardson-Dushman law), thermal electrons are produced as a function of the temperature and work function of the filter material. This is shown in FIG. 37, which illustrates the heating of an energy filter by ion bombardment. The curve shown is based on an experiment in which a filter was irradiated with carbon (C) ions with a high energy of 6 MeV. The filter in this case was a non-transparent energy filter [2].

The distance (in a high vacuum) of the ion accelerator between the filter and the substrate is typically only a few centimeters or less. Thus the measurement of the ion current at the substrate by means of, for example, a Faraday cup attached there is falsified by the diffusion of thermal electrons (from thermionic emission) and through the action of fast electrons (from ion bombardment).

As previously described, there are, from the viewpoint of the filter, both processes which yield electrons (stripping of the primary ions) and processes which emit electrons. Thus the potential of a mounted, electrically insulated filter is not well defined. On the contrary, it varies as a function of the ion current, the vacuum conditions, temperature, etc., during the implantation process. A net-negative charging will promote the emission of electrons, whereas a net-positive charging has the tendency to suppress the emission of electrons. Various ways in which such charging can be prevented are explained below.

(a) Energy Filter Element at a Defined (Positive) Potential

It is proposed that the energy filter be designed and mounted in such a way that the filter is always at a defined potential during the ion bombardment. FIG. 38 shows a cross section through a filter arrangement in which this is ensured. With this filter arrangement, the filter in the filter frame is held at a defined (positive) potential versus the filter holder for the purpose of suppressing secondary electrons. The filter frame is connected to a voltage source and is electrically insulated from the filter holder and the chamber wall of the implanter.

The electrical potential of the filter holder can be regulated. This can be done in such a way, for example, that, independently of the charge balance which results from the implantation process, a constant potential versus the potential of the substrates to be implanted or versus ground potential is maintained during the implantation. For this purpose, a controlled feed of positive or negative charge by means of a current source can be provided.

The potential to be maintained can be selected in particular in such a way that, for example, the emission of electrons from the filter is completely suppressed and thus only the (positive) charge of the transmitted ion current is measured in the Faraday cup next to or on the substrate. Typical values for such a (positive) potential are in the range between a few 10 V and a few 1,000 V.

For the case that the energy filter, because of its material composition, is very high-ohmic, it is proposed that the filter be provided with a thin, highly conductive layer with a thickness ranging from a few nanometers to a few tens of nanometers on one or both sides. The stopping power of this layer must be incorporated into the overall balance of the stopping power when the filter is being designed. Care must be taken to ensure that the applied layer (even when applied to the side facing away from the substrate) cannot in principle cause any damaging contamination of the substrate material to be implanted. For the processing of SiC substrates, the layer can consist of carbon, for example.

(b) Energy Filter is Coated with a Material with a High Work Function

To reduce strong thermionic emission, it is proposed that the energy filter be coated on one or both sides with a material with a high electron work function, so that, at a given temperature, the least possible thermionic emission is caused. The work functions of a few elements are shown in FIG. 39, Materials Science Poland, Vol. 24, No. 4, 2006. In particular, materials with a work function of greater than 3.5 eV, greater than 4 eV, or greater than 4.5 eV are suitable.

The stopping power of this layer should be included in the overall balance of the stopping power calculated when the filter is designed. Care must be taken to ensure that the applied layer (also when applied to the side facing away from the substrate) will not in principle cause any harmful contamination of the substrate material to be implanted.

Point 12. Alternative Production Methods using Injection-Molding, Casting, or Sintering Implantation filters can be produced by the methods of microtechnology such as lithography in combination with wet-chemical or dry-chemical etching. In particular, anisotropic wet-chemical etching by means of alkaline etchants (e.g., KOH or TMAH) is used for filter production out of silicon. In filters of this type, the functional filter layer is made of monocrystalline silicon. During bombardment with high-energy ions, channeling effects can thus influence the effective energy loss in the filter layer in a difficult-to-control manner. Examples of how such effects can be avoided are explained below.

(a) In one example, it is provided that, for production by a typical microtechnology process, wet-chemical anisotropic etching, which requires monocrystalline material, is replaced by dry-chemical etching, which means that polycrystalline or amorphous starting material is used for the filter membrane. Because of its material structure, the resulting filter shows improved properties with respect to channeling.

(b) In another example, it is provided that the filter is not produced by a typical sequence of microtechnical processes but rather by imprinting, injection-molding, casting, or sintering. The core idea is to implement the above-mentioned processes in such a way that a mold or mold insert determines the final shape of the energy filter membrane. The selected filter material is now processed in the familiar manner for the method in question. That is, it is given the required geometry in a soft state (for imprinting), a liquid state (for injection-molding and casting), or in a granular state (sintering) by the predetermined casting mold, mold insert, die, etc.

One of the advantages of the use of the above-mentioned methods is that monocrystalline filter membranes are typically not obtained, and thus channeling is suppressed. Another advantage is that the range of available filter membrane materials is very large. For example, the use of filter membranes of sintered SiC for the production of homogeneous doping profiles in SiC substrates is especially advantageous.

Another advantage is that, through the use of the above-cited molding methods, the cost of the production of a large number of filter elements can be reduced considerably in comparison to the cost of production by microtechnology.

Point 13. Irradiation of a Static Substrate

The homogeneous, energy-filtered irradiation of a static substrate can be achieved by "wobbling" (=controlled deflection) of the ion beam before the filter, arranging the filter between the wobbling unit (=ion beam deflection system) and the static substrate; and choosing the correct deflection angle and distance d between the filter and the substrate (usually a few cm to m), as shown in FIG. 40 by way of example. FIG. 40 illustrates an arrangement for an implantation into a substrate through an energy filter. This arrangement comprises a deflecting setup for the ion beam, which is arranged before the filter. The deflection of the ion beam which can be achieved by this deflecting setup is coordinated with the distance between the filter and the substrate (typically in the range from a few cm to several m) in such a way that the substrate can be completely irradiated, i.e., its entire surface can be irradiated, for the purpose of implantation.

Point 14. Arrangement for Exploiting a Large Filter Surface Area (a) Arrangement in which the Entire Filter Surface is Active FIG. 41 shows an arrangement for an energy filter implantation (i.e., implantation by means of an energy filter), in which the beam area has been enlarged by suitable measures, and the irradiated filter surface area is larger than the substrate surface area, as a result of which it is possible to irradiate the substrate completely, and use can be made of a large filter surface. The diameter of the irradiated filter region is larger than the diameter of the substrate. The substrate can be static or movable. As a result of this arrangement, it becomes possible to use a large filter surface (=reduction of the degradation effects and thermal effects in the filter), and it is ensured that the entire surface of the substrate can be irradiated. The use of an arrangement of this type is especially advantageous in cases where the required filter structures are "large". For the doping of high-blocking Si-IGBTs or Si power diodes with protons, penetration depths of >100 µm are required. For this application, therefore, filter structures with "prong heights" of >100 µm must be provided. Such filter structures can be produced very easily with sufficient mechanical stability, even for large substrates (e.g., 6" or 8").

In the arrangement described here, a certain minimum distance should be maintained between substrate and filter which ensures that there is sufficient lateral homogenization of the implanted ions as a result of scattering effects.

(b) Arrangement in which Part of the Filter Surface is Inactive

The same arrangement as that described in section 14(a) is used first: an arrangement for an energy filter implantation in which the beam area has been enlarged by suitable measures and the irradiated filter surface is larger than the substrate surface. Nevertheless, the entire filter surface is not active here. On the contrary, only a certain portion of the filter surface is active. This means that the filter consists of an arrangement of a number of filter elements in the form of, for example, strips. These filter elements can be produced monolithically from a substrate, for example, by appropriate production processes. The other (non-active) part of the filter surface is used to stabilize the filter membranes. This part causes the ion beam to cast a shadow. In this arrangement, therefore, either the substrate or the filter must be moved in order to compensate for the shadowing effect. As a result of this arrangement, it becomes possible to make use of a large filter surface (=reduction of the degradation effects and thermal effects in the filter), and it is ensured that the entire surface of the substrate can be irradiated. FIG. 42 illustrates a filter with inactive parts and with mechanical scan in one direction.

Point 15. Modification of the Doping Profile in the Substrate by Means of a Sacrificial Layer In addition, a sacrificial layer, the thickness and stopping power of which are selected appropriately, can be applied to the substrate, so that the implantation profile is shifted in the depthwise direction in the substrate in the desired manner. A sacrificial layer of this type can be used for masked ion implantation (compare FIG. 43) and also for unmasked ion implantations. In particular, this method makes it possible to "push" an undesirable beginning part of a doping profile away from the substrate and into the sacrificial layer, i.e., to implant the beginning part of the profile in the sacrificial layer.

FIG. 43 illustrates a modification of the doping profile in the substrate obtained by means of a sacrificial layer in the case of a masked, energy-filtered implantation. In the example shown here, the beginning part of the implantation profile is pushed into the sacrificial layer. This principle can be exploited analogously for an unmasked, energy-filtered ion implantation, i.e., for an implantation in which no masking layer is present, in contrast to FIG. 43.

Point 16. Lateral Modification of the Doping Profile in the Substrate by Means of a Sacrificial Layer By applying a sacrificial layer, the stopping power of which and the change in its thickness over the wafer surface are appropriately selected, to the substrate, the implantation profile can be shifted as desired in the depthwise direction into the substrate as a function of the lateral position on the wafer. A sacrificial layer of this type can be used for masked ion implantation and also for unmasked ion implantations (compare FIG. 44). In particular, the change in the implantation depth of a homogeneous doping profile can be used advantageously for edge terminations in semiconductor components.

FIG. 44 shows a lateral modification of the doping profile in the substrate by means of a sacrificial layer in the case of an unmasked, energy-filtered ion implantation. A lateral modification of the implantation depth is achieved here by variation of the thickness of the sacrificial layer in the lateral direction. The principle can be used analogously for masked, energy-filtered implantations.

Point 17. Adaptation of a Profile Transition Between Several Implantation Profiles Two or more doping profiles can be skillfully overlapped, so that a desired overall doping profile is obtained, especially in the area of the overlap. This technique is advantageous especially for the growing and doping of multiple layers. A representative example consists of the growing of several SiC-epi layers and their energy-filtered doping. Good contact between the layers must be ensured.

Point 18. Special Arrangement of the Multifilter Concept with Coupled Oscillating Movements A skillful arrangement can be used so that, in spite of coupled oscillating movements of filter and substrate, i.e., no relative vertical movement between filter and substrate, the lateral homogeneity of the distribution of the ions can nevertheless be achieved. An arrangement of this type is shown in FIG. 45. The wafers are guided by the rotation of the wafer wheel in the x direction behind the substrate. The ion beam (not shown) is, for example, expanded in the x direction and scans the entire multifilter surface by the vertical oscillating movement of the implantation chamber. The filter surface consists of active filter regions and inactive holder regions. Arrangement (A) is an unfavorable arrangement. When one considers the irradiated filter surface for y1 and y2, three filters are irradiated at y1, and no filter at all is irradiated at y2. As a result, one obtains a laterally inhomogeneous stripe pattern on the wafer. Arrangement (B) shows a possible example of a better arrangement. Two filters are irradiated both for y1 and for y2. This is true for all y. As a result, a laterally homogeneous doping over the wafer surface is achieved.

As shown in FIG. 45, the vertical movements in the y direction of filter and substrate are coupled. The wafers are guided along behind the filter in the x direction by the rotation of the wafer wheel. The ion beam (not shown) is, for example, expanded in the x direction and scans the entire multifilter surface by the vertical oscillating movement of the implantation chamber. The filter surface consists of active filter regions and inactive holder regions. Arrangement (A) is a rather unfavorable arrangement. When one considers the irradiated filter surface for y1 and y2, three filters are irradiated at y1, and no filter at all is irradiated at y2. As a result, one obtains a laterally inhomogeneous stripe pattern on the wafer. Arrangement (B) shows a possible example of a better arrangement. Two filters are irradiated both for y1 and for y2. This is true for all y. As a result, a laterally homogeneous doping over the wafer surface is achieved.

Point 19. Monitoring

Another aspect is intended to solve the problem of monitoring important parameters of the ion implantation as modified by the energy filter. Such parameters are, for example, the minimum or maximum "projected range", the depth concentration distribution determined by the filter geometry, and the (energy-dependent) angular distribution. The monitoring of other parameters such as the implanted ion species, etc., could also be useful. Monitoring should be possible in particular on the wafer in which the ions are implanted or (simultaneously) on (several) structures which are near the wafers. According to one aspect, the monitoring should be conducted without the need for any further processing of the monitoring structures or of the wafers.

Monitoring can be conducted by measuring optical parameters such as spectral absorption, spectral transmission, spectral reflection, changes in the index of refraction, global absorption (wavelength range dependent on the measuring device), and global transmission as well as reflection (wavelength range dependent on the measuring device).

According to one aspect, it is provided that, for the monitoring of the above-mentioned implantation parameters, arrangements of masks and substrate materials be used which (1) are arranged at an appropriate location on the surface to be implanted, e.g., the wafer wheel, and which (2) change their optical properties, for example, as a result of the ion implantation in an "as-implanted" manner, i.e., without the need for further post-processing, in such a way that, for example, the change is proportional to the implanted ion dose for a given ion species. Such materials cited under (2) are, for example, PMMA (Plexiglas), PMMA, SiC, $LiNbO_3$, $KTiOPO_4$, etc.

In cases where the material which is optically sensitive to ion radiation is simultaneously the material of the target substrate, the target substrate (e.g., an SiC wafer) can be used directly for the optical monitoring.

In addition to changes in the optical properties, it is known that materials such as PMMA change their solubility in certain acids and solvents after irradiation by ions. Thus the depth (or the etching rate or the resulting etch geometry, etc.) of a structure modified after ion irradiation can be considered a measure of the implanted ion dose.

Monitoring of other changes in physical parameters by ion irradiation is conceivable. Such changes can include, for example, mechanical properties of the monitor material, electrical properties of the monitor material, or even the nuclear-physical activation of the monitor material by high-energy ion irradiation.

According to one aspect, the detection should proceed on the basis of changes in the optical properties. An implementation of this type is to be described in the following. For the frequently occurring case that monitoring does not take place on the target substrates to be implanted, the implementation of separate monitoring structures is proposed. A monitoring structure consists of an arrangement of a suitable substrate material with one or more mask structures. Examples are shown in FIGS. 47 and 48.

The monitoring structure or structures (monitoring chips) are, as shown in FIG. 46, arranged at a suitable location, such as on the wafer wheel. The read-out of the monitoring chips is done after the implantation without further post-processing, for example. In certain cases, the mask must be removed from the monitoring substrate for the read-out measurement. According to one aspect, the mask is reusable.

Mask material and substrate material of the monitoring chip can also consist of different materials. A criterion for the selection of the mask material is, for example, its compatibility with the material of the target substrates (to exclude contamination caused by sputtering effects). Another criterion is a stopping power for high-energy ions such that mask structures with high aspect ratios can be produced.

It is also possible that the mask material and the substrate material of the monitoring chip could be produced out of the same material. Mask and substrate can also be produced monolithically. In this case, it is usually impossible to reuse either the mask or the substrate.

Performance and evaluation of the masked structure after ion implantation:

1. performance of the energy filter-modified ion implantation;
2. removal of the mask—possible but not absolutely necessary, because the read-out measurement can also be done by reflection from the rear surface of the substrate;
3. optical measurement:
    a. absorption spectrum, wavelength-resolved
    b. transmission spectrum, wavelength-resolved
    c. reflectivity, wavelength-resolved
    d. simple global absorption, i.e., not wavelength-resolved
    e. simple global transmission, i.e., not wavelength-resolved
    f. measurement of the change in the index of refraction
    g. change in polarization
4. comparison with calibration curve or comparison standard and thus determination of whether the implant process has taken place as expected.

Through the use of the explained monitoring structures, the following implant parameters can be tested:

A. Depth-Dependent Dose

This is therefore a test for the degradation of the filter and a test to determine if the implant dose was correctly set on the machine side.

B. Maximum/Minimum Projected Range

This is therefore a test of the correct implant energy, a test for degradation of the filter and for the correctness of the filter structures produced.

C. Angular Distribution of the Implanted Ions

This is therefore a test for the degradation of the filter, a test of the correct formation of the filter, and a test for the correct geometric arrangement in the implantation chamber.

A. Monitoring the Depth Distribution of the Implanted Ions

Point A. Depth-Dependent Dose

FIGS. 49-52 show by way of example the monitoring of the depth distribution of the implanted ion dose set by the energy filter. In this example, the following simplifying assumptions apply:

The change in the optical properties is produced only by the locally implanted ion dose and the eigen-defects thus caused.

Ions which, for example, cross through only depth region III with ion concentration C1 (FIG. 51) (so that they arrive in concentration region C2) lead to no further change in the optical properties.

It is conceivable that precisely such a change in the optical properties might be observed in PMMA, for example, as a result of electronic stopping.

This is not a problem for the possibility of evaluation in principle, but in the example of FIGS. 51 and 52, it will be excluded for the sake of simplicity.

The mask structures shown or described in FIG. 50 are staggered with respect to thickness and number, depending on the desired depth resolution, i.e., configured as a "slanted plane" or continuous ramp. For the greatest thickness, the following therefore applies by way of example: "thickness of the mask">$R_{p,max}$.

The lateral dimensions of the individual structures can range from square micrometers to square millimeters to square centimeters, depending on the requirements of the read-out apparatus.

Point B. Monitoring the Maximum Projected Range

FIG. 53 shows a structure which is adapted to the monitoring of the maximum projected range.

Analogous structures, using evaluation procedures like those described under A, can also be used to measure or monitor the minimum projected range.

Point C. Monitoring the Angular Distribution of the Implanted Ions

It is known that the energy filter for ion implantation produces an energy-dependent spectrum of ion angles after passage through the filter.

In principle, it is true that, for monoenergetic ions arriving perpendicularly to the surface of the filter, the resulting lower-energy ions after the filter are scattered more strongly than the high-energy ones.

The resulting angular distribution is therefore a function of the filter geometry, the change in the geometry during the service life of the filter, the occurrence of channeling effects, the ion species being used, the primary energy, the resulting maximum and minimum energy of the transmitted ions, and the geometric arrangement in the implantation chamber. It is possible to keep track of all these parameters by monitoring the angular distribution.

For the monitoring of individual parameters, different mask structures, which can be arranged in a monitoring chip, are proposed, as illustrated and described in FIGS. 55-58.

It must be kept in mind that, for the evaluation of the angular distribution, it is often only the aspect ratio of the mask structure which is critical.

Thus the sizes of the openings in masking structures for thin masks only slightly thicker than the maximum projected range in the mask material can lie in the micrometer or submicrometer range.

Such monitoring structures are preferably arranged as arrays consisting of many individual structures, so that a global optical evaluation (i.e., over a surface of several mm² or cm²) can be conducted.

In contrast, for the same aspect ratios and, for example, mask thicknesses in the millimeter range, the opening sizes can lie in the millimeter or centimeter range. In these cases, it is also possible without extraordinary technical effort to evaluate individual structures which are not arranged in an array.

Proposed mask structures:

1. fixed mask thickness, mask openings of various geometries→variation of the aspect ratio;

2. variable mask thickness, fixed geometry of the mask opening→variation of the aspect ratio;

3. combinations of 1 and 2;

4. through the arrangement of several arrays (or of individual structures) each consisting of 1, 2, or 3 angles different from each other, the directional dependence of the angular distribution can be monitored.

Circular arrangements are also conceivable.

As shown in FIG. 58, in addition to the concentric circular rings, individual circles and circular rings of various dimensions are also especially advantageous for the monitoring of the angular distribution of the ions transmitted by the energy filter.

The core of the last aspects explained above consists in that the (essentially) dose-dependent modification of the (preferred) optical parameters of a material is to be used for the "as-implanted" monitoring of the energy filter implantation process As a result, by means of an optical measurement (for example), the resulting implantation obtained can be monitored as completely as possible with respect to its most important parameters without the need to conduct any complicated post-processing (e.g., annealing and application of metallic contacts).

It therefore becomes possible to detect faulty implantations cheaply and quickly and possibly to sort out the affected wafers.

FIG. 59 illustrates a skillful adaptation of a profile transition between two implantation profiles A and B, so that the resulting overall concentration profile can, for example, produce the homogeneous profile desired. This can (but does not necessarily have to) be advantageous in particular for layer systems of two layers as shown in this figure. Proposal for a realization with the following sequence of processes:

(1) doping the lower layer (implant B);

(2) growing the upper layer;

(3) doping the upper layer. There are only limited possibilities for configuring the high-energy tail of implant A, but the low-energy tail of implant B can be influenced in particular by the introduction of a sacrificial layer as described in "Point 15: Modification of the doping profile in the substrate by means of a sacrificial layer".

Proposal for a realization with the following sequence of processes:

(1) growing a sacrificial layer;

(2) doping the lower layer (implant B);

(3) removing the sacrificial layer;

(4) growing the upper layer;

(5) doping the upper layer.

The concepts explained above make it possible to develop production-worthy implantation methods for the semiconductor industry, i.e., an economic application of implantation methods in an industrial production process. In addition to the homogeneous dopings to be realized by simple triangular filter structures, the concepts explained here make it possible in particular to realize complex vertical doping concentration curves in a highly flexible manner (multifilter concept) with a low angular distribution of the implanted ions. In particular, all types of doping concentration curves can be approximated by the use of triangular filter structures in conjunction with collimator structures. Another important aspect pertains to the suppression of artifacts, which falsify the ion current measurement on the substrate.

In conclusion, it should be pointed out once again that the measures explained above under Points 1-19 can be applied by themselves alone or in any desired combinations with each other. For example, the explained "end-of-life" detection can be applied to a filter mounted in a frame, but it can also be applied to filters mounted in some other way.

The above-explained wafer, furthermore, can be a semiconductor wafer, but it can also consist of some other material to be implanted such as PMMA. —REFERENCES

[0] Energy filter for ion implantation systems. M. Rüb, Research Report of the University of Applied Sciences (Ernst-Abbe-Hochschule) Jena, 2013/2014.

[2] Constantin Csato, Florian Krippendorf, Shavkat Akhmadaliev, Johannes von Borany, Weiqi Han, Thomas Siefke, Andre Zowalla, Michael Rüb: Energy filter for tailoring depth profiles in semiconductor doping applications. *Nucl. Instr. Meth.*, B, 2015, http://.doi/org/10.1016/j.nimb.2015.07.102.

[4] Investigation of dopant profiles, losses and heating using an energy filter for ion implantation. Krippendorf, Csato, Rüb, DPG Spring Conference, Dresden, March 2014.

[5] Energy filter for ion implantation. F. Krippendorf, C. Csato, T. Bischof, S. Bupta, W. Han, M. Nobst, University of Applied Sciences Jena; C. Ronning, Friedrich Schiller University Jena; R. Rupp, Infineon Technologies AG, Neubiberg; A. Schewior, University of Applied Sciences Jena; W. Wesch, Friedrich Schiller University Jena; W. Morgenroth, Institute for Photonic Technologies e.V., Jena; M. Rüb, University of Applied Sciences Jena. Microsystem Technology Congress, Aachen, October 2014, "Energy filter for ion implantation systems. Idea—preliminary experiments—Application, C.

[6] C. Csato, T., Bischof, S., Gupta, W. Han, F. Krippendorf, W. Morgenroth, M. Nobst, C. Ronning, R. Rupp, A. Schewior, W. Wesch, M. Rüb, Jun. 12, 2013, Workshop "Ion Beams—Research and Application", 2013, Leibnitz Institute for Surface Modification, Leipzig; M. Rüb, B. Sc., T. Bischof, M. Sc., C. Csato, B. Sc., S. Gupta, B. Sc., W. Han, M. Sc., F. Krippendorf, B. Sc., A. Schewior, B. Sc., C. Mose, Energy filter for ion implantation systems, research report of University of Applied Sciences Jena, 2011/2012.

[7] EP 8 030 037 A1.

[8] Rüb: Energy filter for high-energy ion implantation, IP.com Disclosure No.: IPCOM000018006D, original publication date: Dec. 1, 2001. Included in the prior art database: Jul. 23, 2003 and Siemens AG, 2001, Siemens Technical Report, December 2001, 9 pages.

[9] DE 10 2011 075 350 A1.

[10] J. Meijer, B. Burchard, High-energy ion projection for deep ion implantation as a low-cost, high-throughput alternative for subsequent epitaxy processes. *J. Vac. Sci. Technol.*, B22(1).

[11] U. Weber, G. Kraft: Design and construction of a ripple filter for smoothed depth dose distribution in conformal particle therapy. *Phys. Med. Biol.*, 44(1999), 2765-2775.

[12] Y. Takada et al.: A miniature ripple filter for filtering a ripple found in distal part of a proton SOBP, *Nuclear Instruments and Methods in Physics Research* A 524 (2004) 366-373.

[16] DE 19 652 463 C2.

[18] U.S. Pat. No. 7,385,209 B2.

[19] US 2002-0050573 A1.

[19-1] Energy filter for ion implantation systems. M. Rüb, research report of the University of Applied Sciences Jena, 2013/2014.

[19-2] DE 102 39 312 B4

[25] Materials Science-Poland, Vol. 24, No. 4, 2006.

[26] M. Nastasi et al.: *Ion-Solid Interactions. Fundamentals and Applications*. Cambridge University Press, 1996.

[27] O. Osman: Irradiation effects of swift heavy ions in matter. Dissertation, Essen, 2011.

The invention claimed is:

1. An implantation device comprising:
a filter frame, and
a filter held by the filter frame, the filter being configured to be irradiated by an ion beam passing through the filter,
wherein the filter has a base and structures protruding from the base, wherein the structures are layered structures with at least two different material layers, which are arranged on top of each other in an irradiation direction.

2. The implantation device of claim 1, wherein the filter comprises at least two differently structured filter elements arranged next to each other, wherein the filter elements are arranged in the filter frame a certain distance apart from each other and are separated from each other by webs of the filter frame.

3. The implantation device of claim 1, further comprising:
a collimator structure, which is arranged on the filter or is arranged in the transmitted beam after the filter.

4. The implantation device of claim 3, wherein the collimator structure comprises at least one tube having a length and a width, wherein the ratio of the width to the length is less than 1, less than 2, less than 5, or less than 10.

5. The implantation device of claim 1, further comprising:
an electronically readable memory with information relating to the filter stored in the memory.

6. The implantation device of claim 5, wherein the information comprises at least one of the following:
a signature,
a maximum allowable temperature of the filter, and
a maximum allowable irradiation dose.

7. An implantation system, comprising:
a wall with an opening;
a filter holder, which is arranged on the wall in an area of the opening and has a receiving portion;
a filter frame received in the receiving portion of the filter holder; and
a filter held by the filter frame, the filter being configured to be irradiated by an ion beam passing through the filter,
wherein the filter has a base and structures protruding from the base, the structures are layered structures with at least two different material layers, which are arranged on top of each other in an irradiation direction.

8. The implantation system of claim 7, wherein the filter holder comprises a cooling device integrated into the filter holder or arranged on the filter holder.

9. The implantation system of claim 8, wherein the cooling device comprises at least one coolant line.

10. The implantation system of claim 7, further comprising:
an ion beam deflection system arranged before the opening.

11. The implantation system of claim 7, wherein the filter holder is configured to hold the filter frame in a contactless manner, wherein the filter holder comprises at least one magnet to hold the filter frame.

12. A method of doping a wafer, comprising:
implanting ions into the wafer by irradiating the wafer with an ion beam using an implantation device, the implantation device comprising:
a filter frame, and
a filter held by the filter frame, wherein the filter is irradiated by the ion beam passing through the filter, wherein the filter has a base and structures protruding from the base, wherein the structures are layered structures with at least two different material layers, which are arranged on top of each other in an irradiation direction.

13. The method of claim 12, wherein the filter comprises at least one flat surface, and wherein the filter is oriented with respect to the ion beam in such a way that a direction of the ion beam is tilted with respect to the flat surface.

14. The method of claim 12, wherein a surface area of the filter is larger than a surface area of the wafer.

15. The method of claim 12, further comprising:
arranging a monitoring structure near the wafer and carrying out implantation into the monitoring structure.

16. The method of claim 12, further comprising:
arranging the filter in such a way that microstructures of the filter face away from the wafer and towards the ion beam.

* * * * *